(12) United States Patent
Omura et al.

(10) Patent No.: US 7,772,641 B2
(45) Date of Patent: Aug. 10, 2010

(54) POWER SEMICONDUCTOR DEVICE WITH A PLURALITY OF GATE ELECTRODES

(75) Inventors: Ichiro Omura, Kanagawa-ken (JP);
Yoko Sakiyama, Kanagawa-ken (JP);
Hideki Nozaki, Kanagawa-ken (JP);
Atsushi Murakoshi, Kanagawa-ken (JP); Masanobu Tsuchitani, Kanagawa-ken (JP); Koichi Sugiyama, Kanagawa-ken (JP); Tsuneo Ogura, Kanagawa-ken (JP); Masakazu Yamaguchi, Kanagawa-ken (JP); Tatsuo Naijo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 531 days.

(21) Appl. No.: 11/682,670

(22) Filed: Mar. 6, 2007

(65) Prior Publication Data
US 2007/0210350 A1 Sep. 13, 2007

(30) Foreign Application Priority Data

Mar. 7, 2006 (JP) ............................. 2006-061720
May 22, 2006 (JP) ............................. 2006-142184

(51) Int. Cl.
*H01L 29/80* (2006.01)
(52) U.S. Cl. ........................ 257/330; 257/331; 257/334; 257/332; 257/E29.197; 257/E29.201; 438/270
(58) Field of Classification Search ................. 257/287, 257/341, 401, 578, E21.38, E21.382, E27.055, 257/E27.056, E29.027, E29.066, E29.197, 257/E29.201, E29.257, 328, 329, 331, 332; 438/338, 342, 133, 138, 157, 176, 192, 197, 438/270
See application file for complete search history.

(56) References Cited

U.S. PATENT DOCUMENTS

| 5,448,083 | A | 9/1995 | Kitagawa et al. |
| 5,751,024 | A | 5/1998 | Takahashi |
| 6,750,511 | B2 | 6/2004 | Kawano et al. |
| 7,541,642 | B2 * | 6/2009 | Kawamura et al. .......... 257/331 |
| 2006/0091457 | A1 | 5/2006 | Kobayashi |

FOREIGN PATENT DOCUMENTS

| JP | 11-274484 | 10/1999 |
| JP | 2000-101076 | 4/2000 |
| JP | 2001-284587 | 10/2001 |
| JP | 2004-31385 | 1/2004 |
| JP | 2004-31386 | 1/2004 |

* cited by examiner

*Primary Examiner*—David Vu
*Assistant Examiner*—Suberr Chi
(74) *Attorney, Agent, or Firm*—Oblon, Spivak, McClelland, Maier & Neustadt, L.L.P.

(57) ABSTRACT

A power semiconductor device includes: a semiconductor layer having a trench extending along a first direction in a stripe configuration; a gate electrode buried in the trench for controlling a current flowing in the semiconductor layer; and a gate plug made of a material having higher electrical conductivity than the gate electrode, the gate plug having the stripe configuration and being connected to the gate electrode along the first direction. The semiconductor layer includes: a first semiconductor layer of a first conductivity type; a second semiconductor layer of a second conductivity type provided partially in an upper face of the first semiconductor layer; a third semiconductor layer of the first conductivity type provided partially on the second semiconductor layer; and a fourth semiconductor layer of the second conductivity type provided on a lower face of the first semiconductor layer.

8 Claims, 74 Drawing Sheets

POWER SEMICONDUCTOR DEVICE WITH A PLURALITY OF GATE ELECTRODES

CROSS-REFERENCE TO RELATED APPLICATIONS

This application is based upon and claims the benefit of priorities from the prior Japanese Patent Application No. 2006-061720, filed on Mar. 7, 2006, and the prior Japanese Patent Application No. 2006-142184, filed on May 22, 2006; the entire contents of which are incorporated herein by reference.

BACKGROUND OF THE INVENTION

1. Field of the Invention

This invention relates to a power semiconductor device, a method for manufacturing the same, and a method for driving the same, and more particularly to a power semiconductor device having a plurality of gate electrodes on a semiconductor substrate, a method for manufacturing the same, and a method for driving the same.

2. Background Art

The IGBT (Insulated Gate Bipolar Transistor) is widely used as a semiconductor switch in inverter circuits for industrial and automobile motors, power supplies for high-capacity servers, and UPSs (Uninterruptible Power Supplies). The IGBT is mainly used in applications working with a relatively large current from several hundred kilowatts to several megawatts. Planar gate IGBTs are conventionally used, but recently, vertical IGBTs based on trench gates are coming into use (see, e.g., JP 11-274484A).

There is a demand for larger current capacity in such IGBTs used for semiconductor switches, leaving room for improvement in this connection.

SUMMARY OF THE INVENTION

According to an aspect of the invention, there is provided a power semiconductor device including: a semiconductor layer having a trench extending along a first direction in a stripe configuration; a gate electrode buried in the trench for controlling a current flowing in the semiconductor layer; and a gate plug made of a material having higher electrical conductivity than the gate electrode, the gate plug having the stripe configuration and being connected to the gate electrode along the first direction, the semiconductor layer including: a first semiconductor layer of a first conductivity type; a second semiconductor layer of a second conductivity type provided partially in an upper face of the first semiconductor layer; a third semiconductor layer of the first conductivity type provided partially on the second semiconductor layer; and a fourth semiconductor layer of the second conductivity type provided on a lower face of the first semiconductor layer.

According to another aspect of the invention, there is provided a method for manufacturing a power semiconductor device including: forming a second semiconductor layer of a second conductivity type partially in an upper portion of a semiconductor layer of a first conductivity type, forming a third semiconductor layer of the first conductivity type partially on the second semiconductor layer, and forming a fourth semiconductor layer of the second conductivity type in a lower portion of the semiconductor layer; forming a first trench groove in an upper face of the semiconductor layer, the first trench groove extending along a first direction in a stripe configuration; forming a gate electrode inside the first trench groove, the gate electrode being operative for controlling a current flowing in the semiconductor layer; forming a second trench groove in an upper face of the gate electrode, the second trench groove extending along the first direction in the stripe configuration, and forming a third trench groove in a region of the upper face of the semiconductor layer between the gate electrodes, the third trench groove extending along the first direction in the stripe configuration; forming a reaction layer by depositing a conductive material on an inner face of the second and third trench groove by CVD technique, the conductive material being reactive with a material forming the semiconductor layer and a material forming the gate electrode, and by allowing the conductive material to react with the material forming the semiconductor layer and the material forming the gate electrode; and depositing a material having higher electrical conductivity than the gate electrode on the reaction layer by the CVD technique.

According to another aspect of the invention, there is provided a power semiconductor device including: a semiconductor substrate; a plurality of contact lines connected to at least one of a plurality of gate electrodes that control a current flowing in the semiconductor substrate, the contact lines extending in an upper face of the semiconductor substrate in a first direction; a plurality of control lines provided on the semiconductor substrate and extending in a second direction crossing the first direction; and a first connection member configured to connect each of the plurality of control lines to at least one of the plurality of contact lines, the plurality of gate electrodes being divided into a plurality of groups for each of the control lines connected thereto through the contact line and the first connection member.

According to another aspect of the invention, there is provided a method for driving a power semiconductor device with a plurality of gate electrodes provided in a semiconductor substrate, the method including: when the device is driven at frequencies less than a predetermined frequency, inputting an identical gate driving signal to all the gate electrodes; and when the device is driven at frequencies not less than the predetermined frequency, inputting the gate driving signal to part of the gate electrodes and placing the remaining gate electrodes at a potential that renders the semiconductor substrate nonconducting.

According to another aspect of the invention, there is provided a method for driving a power semiconductor device with a plurality of gate electrodes provided in a semiconductor substrate, the method including: detecting temperature of the semiconductor substrate for each of a plurality of regions defined in the semiconductor substrate, and when a temperature exceeding a predetermined temperature is detected in one of the regions, placing the gate electrode located in the one region at a potential that renders the one region nonconducting.

BRIEF DESCRIPTION OF THE DRAWINGS

FIG. 14A shows an IGBT according to this example, and FIG. 14B shows an IGBT according to a comparative example.

FIG. 34A shows a sample with the deposited amount of titanium being 1 nanometer. FIG. 34B shows a sample with the deposited amount of titanium being 10 nanometers. FIG. 34C shows a sample with the deposited amount of titanium being 50 nanometers.

DETAILED DESCRIPTION OF THE INVENTION

Embodiments of the invention will now be described with reference to the drawings.

First, a first embodiment of the invention is described.

Figure 1:
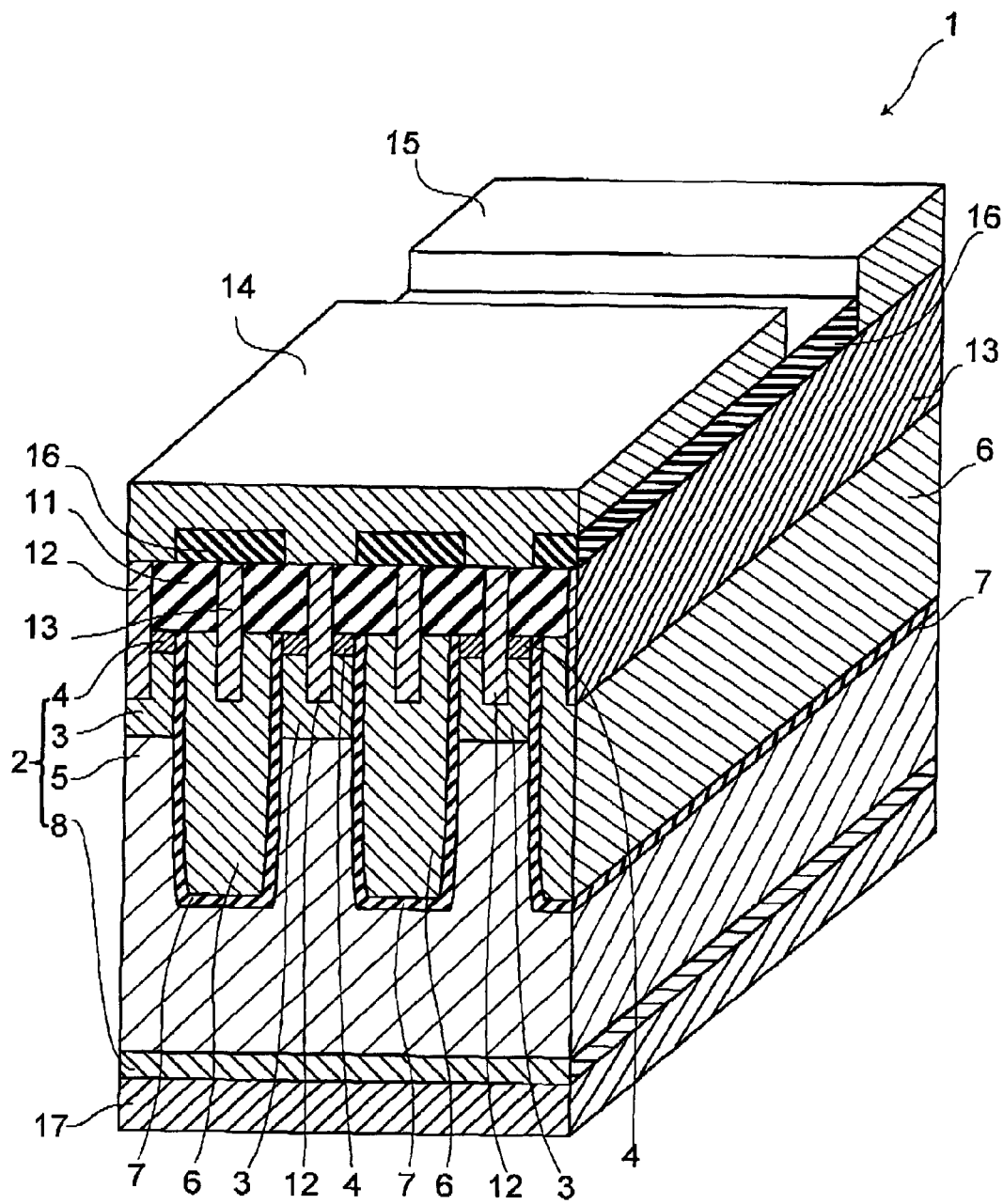
FIG. 1 is a perspective view illustrating a semiconductor apparatus according to a first embodiment of the invention.

FIG. 1 is a perspective view illustrating a semiconductor apparatus according to this embodiment.

The semiconductor apparatus 1 according to this embodiment is illustratively a vertical power semiconductor device, e.g., IGBT.

The semiconductor apparatus 1 according to this embodiment includes a semiconductor layer 2. A P-type layer 3 is formed partially in the upper portion of the semiconductor layer 2. An N-type layer 4 is formed partially on the P-type layer 3. A P-type layer 8 is formed in the lower portion of the semiconductor layer 2. Furthermore, the portion of the semiconductor layer 2 other than the P-type layer 3, N-type layer 4, and P-type layer 8 is an N-type layer 5. The semiconductor layer 2 may have a diffusion layer in addition to the P-type layer 3, N-type layer 4, N-type layer 5, and P-type layer 8.

The semiconductor layer 2 also includes a plurality of striped gate electrodes 6 spaced in parallel to each other. The upper face of the gate electrode 6 is exposed in the upper face of the semiconductor layer 2. Between the gate electrode 6 and the semiconductor layer 2 is provided a gate insulating film 7 for insulation therebetween. Furthermore, an interlayer insulating film 11 is provided on the semiconductor layer 2. In FIG. 1, the upper face of the gate electrode 6 is coplanar with the upper face of the semiconductor layer 2. However, the upper face of the gate electrode 6 may be slightly lower than the upper face of the semiconductor layer 2. This decreases the capacitance between the gate electrodes 6. Thus the current for driving the gate electrode can be reduced, and the driving speed can be increased.

Emitter plugs 12 and gate plugs 13 are provided so as to penetrate the interlayer insulating film 11. The emitter plug 12 and the gate plug 13 are made of materials having higher electrical conductivity than the material forming the gate electrode 6. The emitter plugs 12 and the gate plugs 13 extend in the extending direction of the gate electrode 6, and are disposed alternately and equidistantly in parallel to each other. The lower portion of the emitter plug 12 is buried in the portion of the semiconductor layer 2 between the gate electrodes 6, penetrates the N-type layer 4, and reaches the P-type layer 3. Thus the emitter plug 12 is connected to the P-type layer 3 of the semiconductor layer 2 along its longitudinal direction. On the other hand, the lower portion of the gate plug 13 is burled in the gate electrode 6. Thus the gate plug 13 is connected to the gate electrode 6 along its longitudinal direction. The lower ends of the emitter plug 12 and the gate plug 13 are located at the same height. The upper portions of both the plugs are buried in the interlayer insulating film 11, and their upper ends are located at the same height as the upper face of the interlayer insulating film 11. If the emitter plug 12 and the gate plug 13 are made of the same material, both the plugs can be fabricated in the same process, and hence the fabrication cost can be reduced.

The emitter plug 12 and the gate plug 13 may be illustratively composed of at least two layers. More specifically, the emitter plug 12 may include a core member (not shown) constituting the core of the emitter plug 12, and a reaction layer (not shown) formed between the core member and the semiconductor layer 2. A barrier layer (not shown) may be provided between the core member and the reaction layer. The reaction layer is a reaction product of the material forming the semiconductor layer 2, and contains this material. On the other hand, the gate plug 13 may include a core member (not shown) constituting the core of the gate plug 13, and a reaction layer (not shown) formed between the core member and the gate electrode 6. A barrier layer (not shown) may be provided between the core member and the reaction layer. The reaction layer is a reaction product of the material forming the gate electrode 6, and contains this material.

As viewed in the extending direction of the emitter plug 12 and the gate plug 13, the region of the side face of the emitter plug 12 in contact with the N-type layer 4 has a length of 0.5 times or more the width of the emitter plug 12, and the thickness of the reaction layer is more than 2.5 nanometers and not more than 0.25 times the width of the emitter plug 12.

An emitter pad 14 and a gate pad 15 are provided generally coplanar with each other on the insulating film 11. The gate pad 15 is provided only in part of the edge region of the semiconductor apparatus 1. The emitter pad 14 is provided in the edge region in which the gate pad 15 is not provided, and in the central region of the semiconductor apparatus 1. The emitter pad 14 and the gate pad 15 are spaced and insulated from each other. On the interlayer insulating film 11, an insulating film 16 is provided between the gate plug 13 and the emitter pad 14, and an insulating film (not shown) is provided also between the emitter plug 12 and the gate pad 15. Thus the emitter plug 12 is connected to the emitter pad 14, and the gate plug 13 is connected to the gate pad 15 at one end in its longitudinal direction. On the other hand, a collector electrode 17 is provided below the semiconductor layer 2 and connected to the P-type layer 8.

Next, the effect of this embodiment is described.

Recently, for enhancing the characteristics of power semiconductor devices, the devices are increasingly downscaled, and the resistance of the gate electrode is increased in association therewith. This elicits delay and voltage reduction in gate signals, and simultaneous and uniform switching within a chip is becoming difficult. However, according to this embodiment, the gate plug 13 is buried inside the gate electrode 6 and connected thereto in the longitudinal direction of the gate electrode 6. Hence the gate electrode has a low resistance in the longitudinal direction. Therefore, even if the length of the gate electrode 6 is increased and only its end is connected to the gate pad 15, the delay and voltage reduction in signals are small. Thus power semiconductor devices can be downscaled with ensuring simultaneous and uniform switching.

Furthermore, according to this embodiment, because the resistance of the gate electrode is decreased, the gate pad 15 can be provided only on the edge of the semiconductor apparatus 1, and the emitter pad 14 can be provided in the other region. This allows more electrons to be injected into the semiconductor layer 2, and hence a larger current can be passed therethrough. For example, assume a semiconductor apparatus with its upper face having an area of 0.5 square centimeters ($cm^2$) or more and the emitter pad 14 being not divided. If the gate plug 13 is not provided, the gate current flows only through the gate electrode 6 illustratively made of polysilicon. Hence the gate resistance is difficult to reduce to $2\Omega$ or less. In contrast, the gate plug 13 provided as in this embodiment allows the gate resistance to be reduced to $0.5\Omega$ or less. Thus, according to this embodiment, the resistance of gate interconnect in the chip can be reduced. Hence the within-chip delay due to the CR time constant of the gate capacitance and the gate resistance is small, and uniform switching can be achieved within a chip. Consequently, breakdown and vibration in the semiconductor apparatus can be prevented.

Furthermore, conventionally, the emitter pad of a power semiconductor apparatus such as IGBT is connected to the outside through a bonding wire. However, recently, for the purpose of increasing current density and improving packaging in power semiconductor apparatuses, surface bonding of the emitter pad to a plate electrode such as a beam lead or a metal strap using solder is desired. Then a large current can be passed through the semiconductor apparatus, and parasite inductance can be reduced. Furthermore, the plate electrode can provide a uniform temperature on the chip surface. By direct or indirect thermal coupling of the plate electrode to a heat sink, cooling from the chip upper face can also be achieved in addition to the conventional cooling from the chip lower face. This reduces the possibility of thermal breakdown even when a large current is passed through the chip. Moreover, because the chip can be used at low temperatures, temperature-dependent parameters such as carrier mobility can be controlled to desirable values. For example, as the temperature decreases, carrier mobility increases, and hence the resistance decreases. Thus power loss can be reduced by using the chip at low temperatures.

According to this embodiment, the emitter pad 14 can be formed as a single large continuous film. Thus the emitter pad 14 can be connected to an external plate electrode planarly without using any discontinuous portion. This can facilitate uniform heat distribution and temperature reduction in semiconductor apparatuses.

Furthermore, according to this embodiment, the emitter plug 12 is buried inside the P-type layer 3. Hence holes introduced into the semiconductor layer 2 can be absorbed by the emitter plug 12 before flowing into the N-type layer 4. This can completely prevent the holes from flowing into the N-type layer 4 to cause latch-up. More specifically, in the semiconductor apparatus 1, the distance from the gate insulating film 7 to the emitter plug 12 is shorter than the length of the N-channel (the depth of the portion of the N-type layer 5 between the gate electrodes 6). Hence the distance traveled by holes in the N-channel extracted from the emitter plug 12 is shorter than the distance traveled by electrons from the N-type layer 4 serving as an N-source to the N-type layer 5 serving as an N-base. Consequently, latch-up can be prevented. Considering the electron and hole mobility, the distance from the gate insulating film 7 to the emitter plug 12 is preferably about half the length of the N-channel. If latch-up occurs, the hole current concentrates on the line of contact of the surface of the gate insulating film 7 with the interface between the P-type layer 3 and the N-type layer 5. In this case, the distance from this contact line to the emitter plug 12 shorter than the distance from this contact line to the N-type layer 4 is more effective for preventing latch-up.

Furthermore, in this embodiment, the emitter pad 14 is generally coplanar with the gate pad 15. Hence high manufacturing stability is achieved. Thus, according to this embodiment, it is possible to obtain a semiconductor apparatus allowing a large current flow and having high manufacturing stability.

Next, examples for realizing the semiconductor apparatus according to this embodiment are described.

First, a first example of the first embodiment is described. The semiconductor apparatus according to this example is a vertical IGBT.

Figure 2:
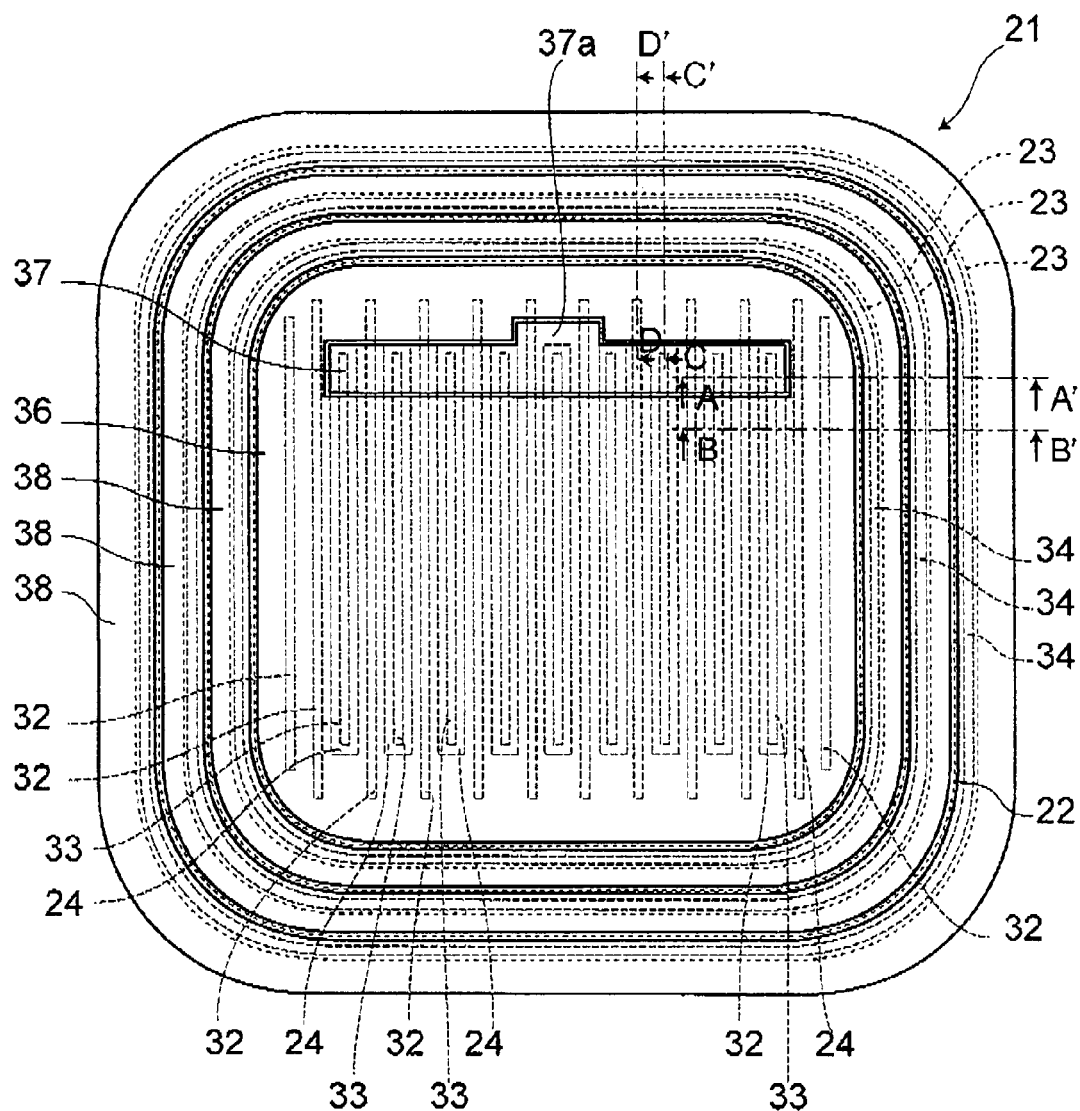
FIG. 2 is a plan view illustrating an IGBT according to a first example of the first embodiment.

FIG. 2 is a plan view illustrating an IGBT according to this example, and FIGS. 3 to 6 are cross-sectional views taken along line A-A', line B-B', line C-C', and line D-D' shown in FIG. 2, respectively.

Note that in FIG. 2, the gate insulating film, the cap film, and the interlayer insulating film described below are not shown for clarity.

As shown in FIG. 2, the IGBT 21 according to this example includes an N-type silicon layer 22. The silicon layer 22 is a square layer measuring e.g. 10 millimeters on a side, and is illustratively fabricated by neutron doping. In the peripheral region of the upper face of the silicon layer 22, one or more annular P-type layers 23 are concentrically formed along the outer edge of the silicon layer 22 and serve as guard rings surrounding the central region of the silicon layer 22. In FIG. 2, only three guard rings (P-type layers 23) are shown. However, the number of guard rings is not limited to three. For example, one guard ring is provided per a withstand voltage of about 100 V of the IGBT 21. In an IGBT having a withstand voltage of e.g. 1200 V, the number of guard rings is about ten. The peripheral region including guard rings on each side in the IGBT 21 has a width of e.g. about 0.5 millimeters.

As shown in FIGS. 2 to 6, a plurality of striped gate electrodes 24 are buried in the central region of the silicon layer 22. The gate electrodes 24 are illustratively made of polysilicon and spaced in parallel to each other. The upper face of the gate electrode 24 is exposed to the upper face of the silicon layer 22. The side face and the bottom face of the gate electrode 24 are covered with a gate insulating film 25. Thus the gate electrode 24 is insulated from the silicon layer 22 by the gate insulating film 25. Only one gate electrode 24 is arranged in its longitudinal direction and has a length of e.g. 0.5 millimeters or more and a depth of e.g. 6 microns. The center-to-center distance of the gate electrodes 24 is e.g. 4 microns or less. The number of gate electrodes 24 is e.g. 8000. The gate electrodes 24 are arranged along the width direction thereof.

Figure 3:
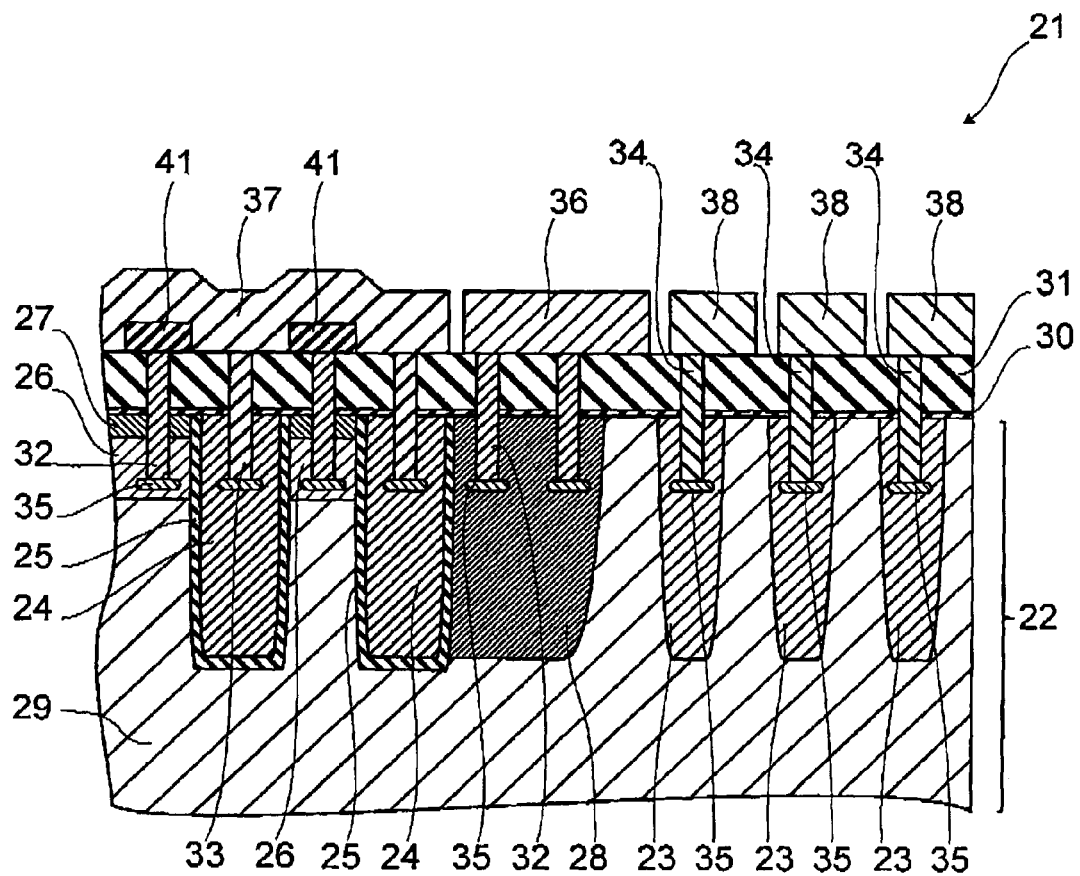
FIGS. 3 to 6 are cross-sectional views taken along line A-A', line B-B', line C-C', and line D-D' shown in FIG. 2, respectively.
Figure 4:
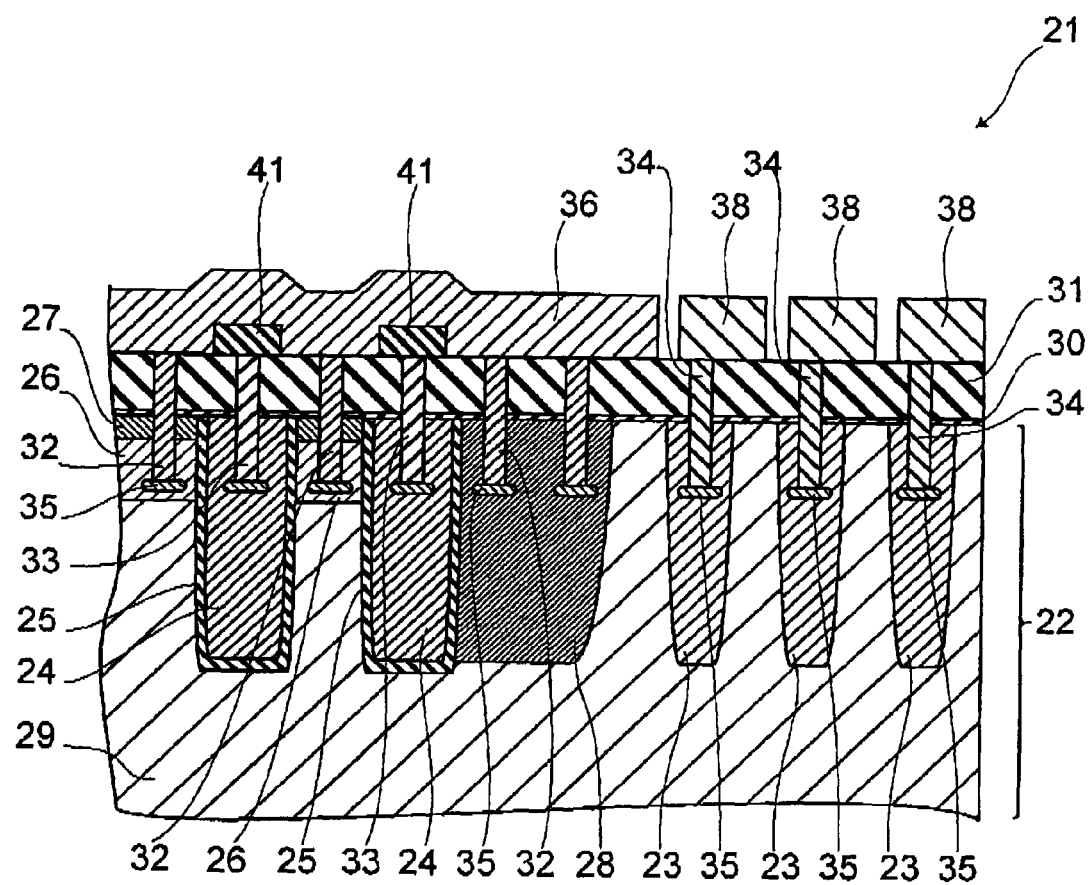
Figure 5:
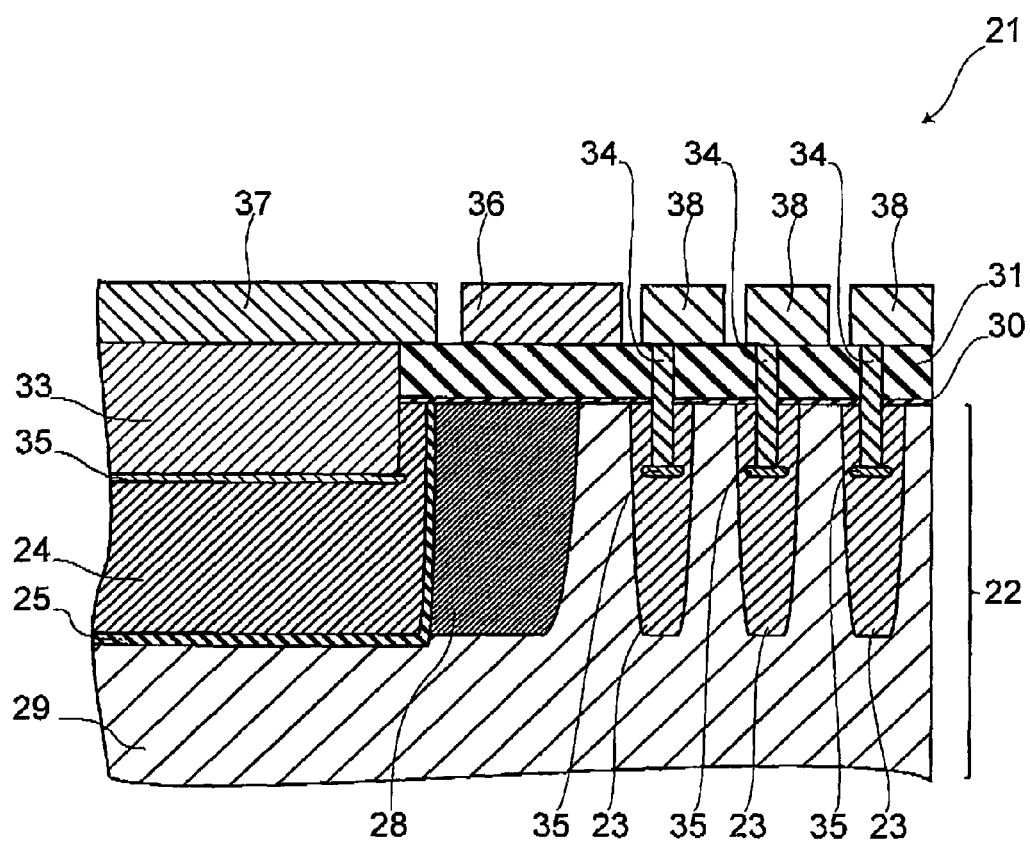
Figure 6:
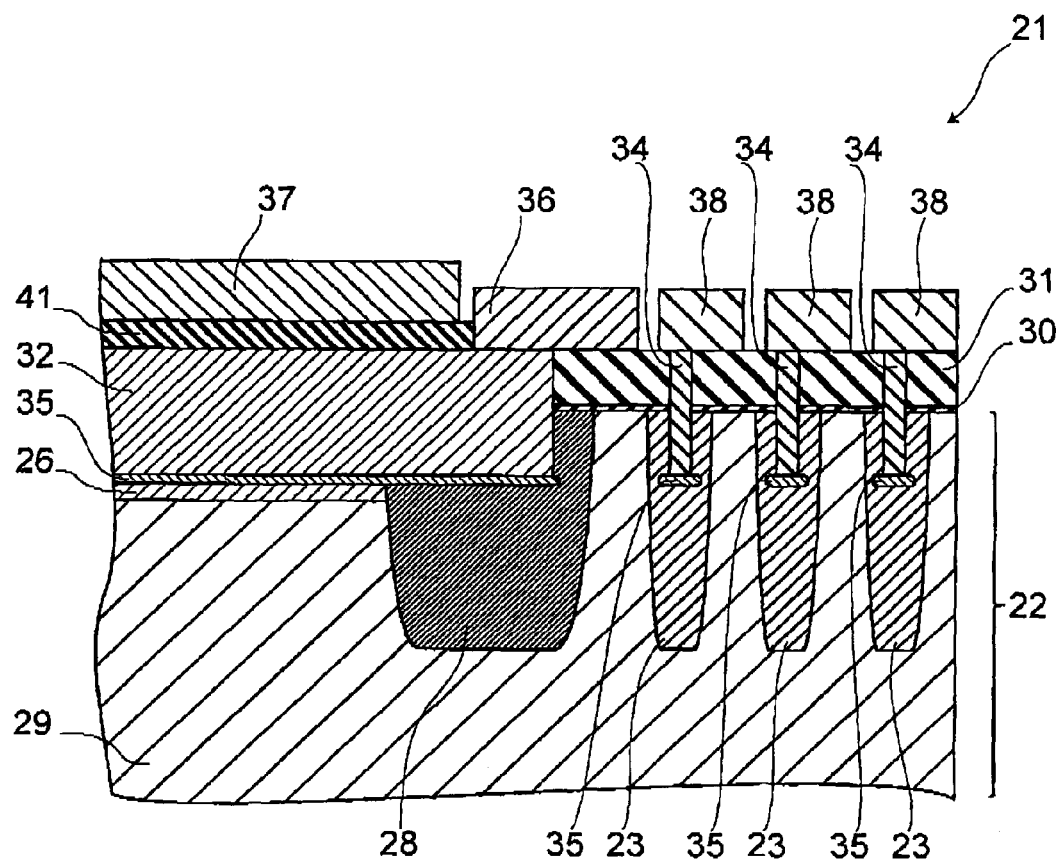

As shown in FIGS. 3 and 4, a P-type layer 26 is formed as a base layer in the overlayer portion of the silicon layer 22 between the gate electrodes 24. An N-type layer 27 is formed as an emitter layer partially on the P-type layer 26. The N-type layer 27 may be placed intermittently along the extending direction of the gate electrode 24. Thus, along the extending direction of the gate electrode 24, the P-type layer 26 and the N-type layer 27 are alternately exposed to the region of the upper face of the silicon layer 22 between the gate electrodes 24. Such structure allows short-circuit withstand capability to be improved. Short-circuit withstand capability can be further improved if the N-type layer 27 has an exposed area ratio of 50% or less in the region of the upper face of the silicon layer 22 where the P-type layer 26 and the N-type layer 27 are exposed. Furthermore, a P-type layer 28 is annularly formed around the outer periphery of the region where the gate electrodes 24 are formed.

On the other hand, a P-type layer (not shown) is formed as a collector layer in the lower face of the silicon layer 22. A collector electrode (not shown) is provided on the lower face of this P-type layer. The portion of the silicon layer 22 where the P-type layer is not formed is an N-type layer 29. That is, in the silicon layer 22, the P-type layers 23, 26, and 28 are provided partially in the upper face of the N-type layer 29, and the N-type layer 27 is provided partially on the P-type layer 26. The P-type layer 26 has a shallower formation depth than the gate electrode 24. The P-type layers 23 and 28 have a formation depth nearly comparable with that of the gate electrode 24. Preferably, the formation depth of the P-type layer 28 is slightly deeper than the depth of the gate electrode 24. However, as illustrated in FIGS. 3 to 6, the P-type layer 28 may have a slightly shallower formation depth than the gate electrode 24.

As shown in FIGS. 3 to 6, a cap film 30 illustratively made of aluminum nitride (AlN) is provided on the entire surface of the silicon layer 22. On cap film 30, an interlayer insulating film 31 illustratively made of BPSG (Boro-Phospho Silicate Glass) or TEOS (Tetra-Ethyl-Ortho-Silicate, $Si(OC_2H_5)_4$) is provided. The interlayer insulating film 31 has a thickness of e.g. 1.4 to 1.5 microns. Then the gate-source leak current can be reduced, and the gate withstand voltage can be improved.

Striped emitter plugs 32 and striped gate plugs 33 are provided alternately and equidistantly in the interlayer insulating film 31, the cap film 30, and the silicon layer 22. However, in the P-type layer 28, two emitter plugs 32 are provided without the intermediary of a gate plug therebetween. In each of the regions corresponding to three P-type layers 23 serving as guard rings, one annular contact plug 34 is provided. However, two or more contact plugs 34 may be provided for each P-type layer 23, and the contact plug 34 may be shaped like a stripe. The emitter plug 32, the gate plug 33, and the contact plug 34 are illustratively made of tungsten (W). The width thereof is nearly equal to each other and e.g. 0.2 to 0.5 microns. The height thereof is e.g. 2 microns.

As shown in FIGS. 3 to 6, the upper portions of the emitter plug 32, the gate plug 33, and the contact plug 34 all penetrate the insulating film 31 and the cap film 30, and have upper faces exposed in the upper face of the insulating film 31. As shown in FIGS. 3 and 4, the lower portion of the emitter plug 32 is buried in the silicon layer 22, penetrates the N-type layer 27, and reaches the interior of the P-type layer 26. That is, the lower end of the emitter plug 32 is located between the interface of the N-type layer 27 and the P-type layer 26 and the interface of the P-type layer 26 and the N-type layer 29. Thus the emitter plug 32 is connected to the P-type layer 26 along its longitudinal direction. The lower portion of the gate plug 33 is buried in the gate electrode 24, and thus connected to the gate electrode 24 along its longitudinal direction. Furthermore, the lower portion of the contact plug 34 is buried in the P-type layer 23, and thus connected to the P-type layer 23 along its longitudinal direction.

In this example, the gate plug 33 and the gate electrode 24 have a nearly equal length, and the emitter plug 32 has a longer length than the gate plug 33. Thus both ends of the emitter plug 32 are connected also to the P-type layer 28 located on both sides of the gate electrode 24 in the longitudinal direction. Thus the hole extraction resistance around the silicon layer 22 can be reduced. Furthermore, a P$^+$-type layer 35 is formed directly below the emitter plug 32, the gate plug 33, and the contact plug 34.

An emitter pad 36, a gate pad 37, and a field plate 38 illustratively made of aluminum (Al) are provided on the interlayer insulating film 31. That is, the emitter pad 36, the gate pad 37, and the field plate 38 are provided generally coplanar with each other. The gate pad 37 is formed above one end of the gate plug 33 and shaped like a band, which has a longitudinal direction orthogonal to the extending direction of the gate plug 33. At the center of the longitudinal direction, a projection 37a for connection to an external interconnect (not shown) is formed. The projection 37a extends in the direction along which the gate plug 33 extends toward the outer edge of the silicon layer 22. On the internal region of the silicon layer 22, the emitter pad 36 is spaced from the gate pad 37 and formed so as to surround the gate pad 37. That is, the emitter pad 36 is formed as a generally square continuous film having rounded corners in which only the region of the gate pad 37 is punched out. Furthermore, the field plate 38 is formed annularly in the region including the directly overlying region of each contact plug 34. That is, the field plate 38 is provided concentrically so as to surround the gate pad 37.

On the interlayer insulating film 31 is provided an insulating film 41 patterned so as to insulate the emitter plug 32 from the gate pad 37 and insulate the gate plug 33 from the emitter pad 36. The insulating film 41 is illustratively made of TEOS. Thus the emitter plug 32 is connected only to the emitter pad 36, and the gate plug 33 is connected only to the gate pad 37. More specifically, conventionally, one end of the gate electrode is extracted outside the trench for connection to the gate plug. In contrast, in this example, the gate electrode is not so extracted, but the gate electrode 24 is connected to the gate pad 37 through the gate plug 33. Thus the step breakage induced by the extracted gate electrode made of polysilicon, and problems in the overlying structure caused by the step due to the thickness of the extracted portion can be prevented. Furthermore, the contact plug 34 is connected to the field plate 38. The emitter pad 36 is shaped so as to include therein a rectangle occupying 50% or more of the area of the emitter pad 36. The emitter pad 36 has an area of e.g. 0.5 square centimeters (cm$^2$) or more.

For each gate electrode 24 and the gate insulating film 25 on both sides thereof in the upper face of the silicon layer 22 (hereinafter referred to as "trench opening"), let Wt denote the total width thereof (hereinafter referred to as "trench opening width"). For the portion between the trench openings in the upper face of the silicon layer 22 (hereinafter referred to as "mesa"), let Wm denote the width thereof (hereinafter referred to as "mesa width"). Then the trench opening width Wt and the mesa width Wm satisfy the relation given by the following formula (1):

$$(2 \times Wt) > Wm > (0.5 \times Wt) \qquad (1)$$

Next, a method for manufacturing an IGBT 21 according to this example is described.

FIGS. 7 to 13 are cross-sectional views illustrating a method for manufacturing an IGBT according to this example. FIGS. 7 to 13 show the same cross section as FIG. 3.

Figure 7:
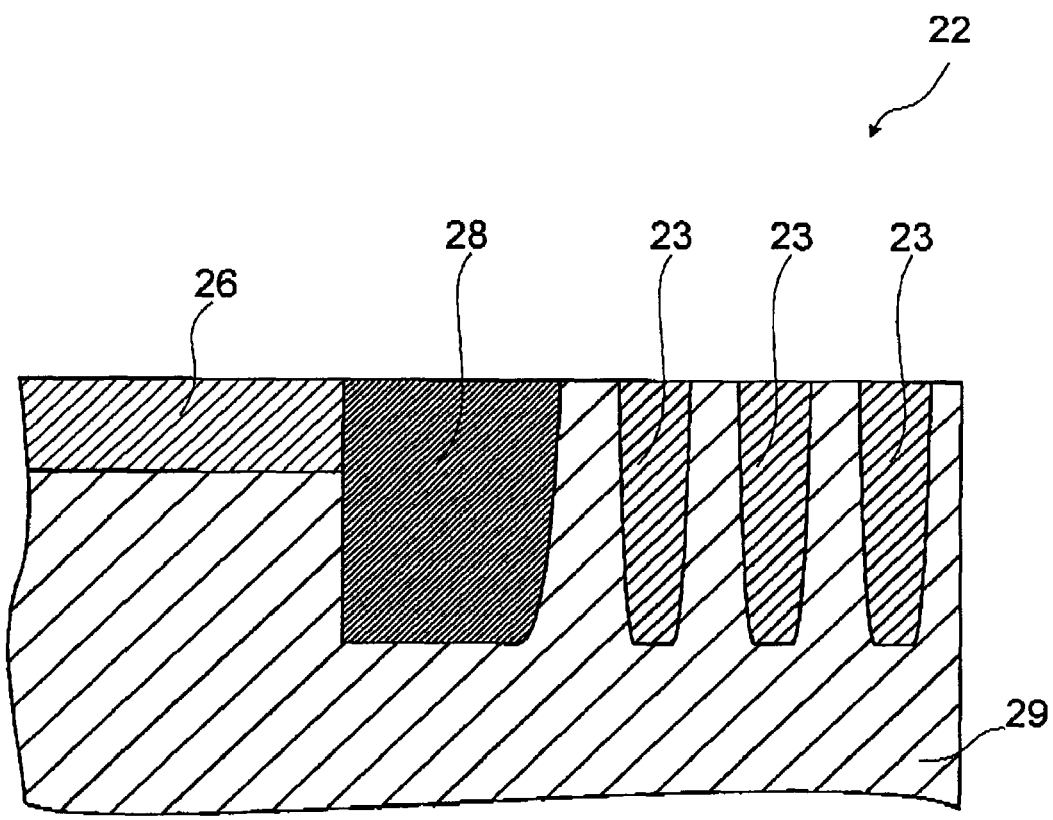
FIGS. 7 to 13 are cross-sectional views illustrating a method for manufacturing an IGBT according to this example.

First, as shown in FIG. 7, a square plate measuring about 10 millimeters on a side is cut out of a neutron-doped ingot to prepare an N-type silicon layer 22. One face (upper face) of this silicon layer 22 is subjected to ion implantation with P-type dopant. The dopant is diffused to locally form P-type layers 23, 28, and 26 partially in the upper face of the silicon layer 22. Here, a square-shaped P-type layer 26 is formed in the internal region of the silicon layer 22. An annular P-type layer 28 is formed deeper than the P-type layer 26 so as to surround the P-type layer 26. A plurality of annular P-type layers 23 are formed nearly as deep as the P-type layer 28 so as to surround the P-type layer 28. Typically, about one P-type layer 23 is formed per a withstand voltage of 100 V of the IGBT 21. Likewise, a P-type layer (not shown) is formed also in the other face (lower face) of the silicon layer 22. Here, the portion sandwiched between the P-type layers 23, 26, and 28 formed in the upper portion of the silicon layer 22 and the P-type layer (not shown) formed in the lower portion thereof is an N-type layer 29.

Figure 8:
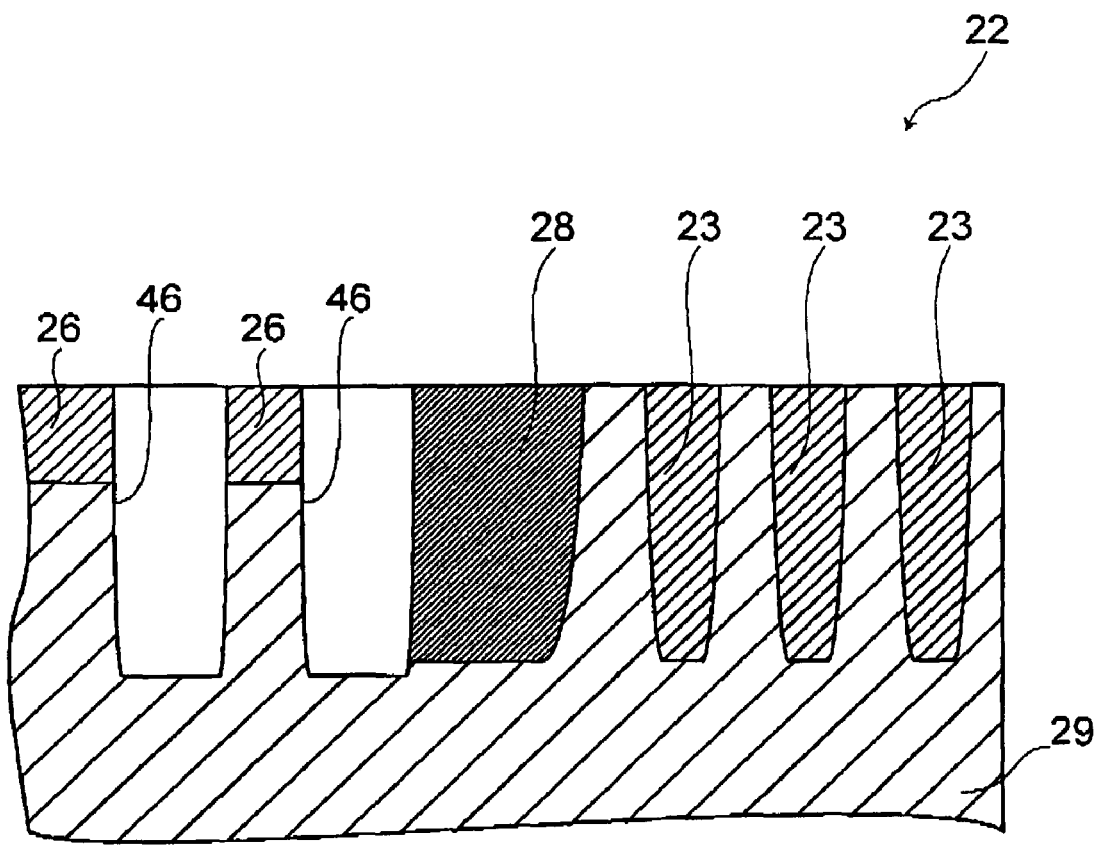

Next, as shown in FIG. 8, by RIE (Reactive Ion Etching), trench grooves 46 are formed from the upper face of the silicon layer 22 through the P-type layer 26 to the N-type layer 29. As viewed from above, the trench groove 46 is shaped like a stripe, and a plurality of trench grooves 46 are formed equidistantly in parallel to each other.

Figure 9:
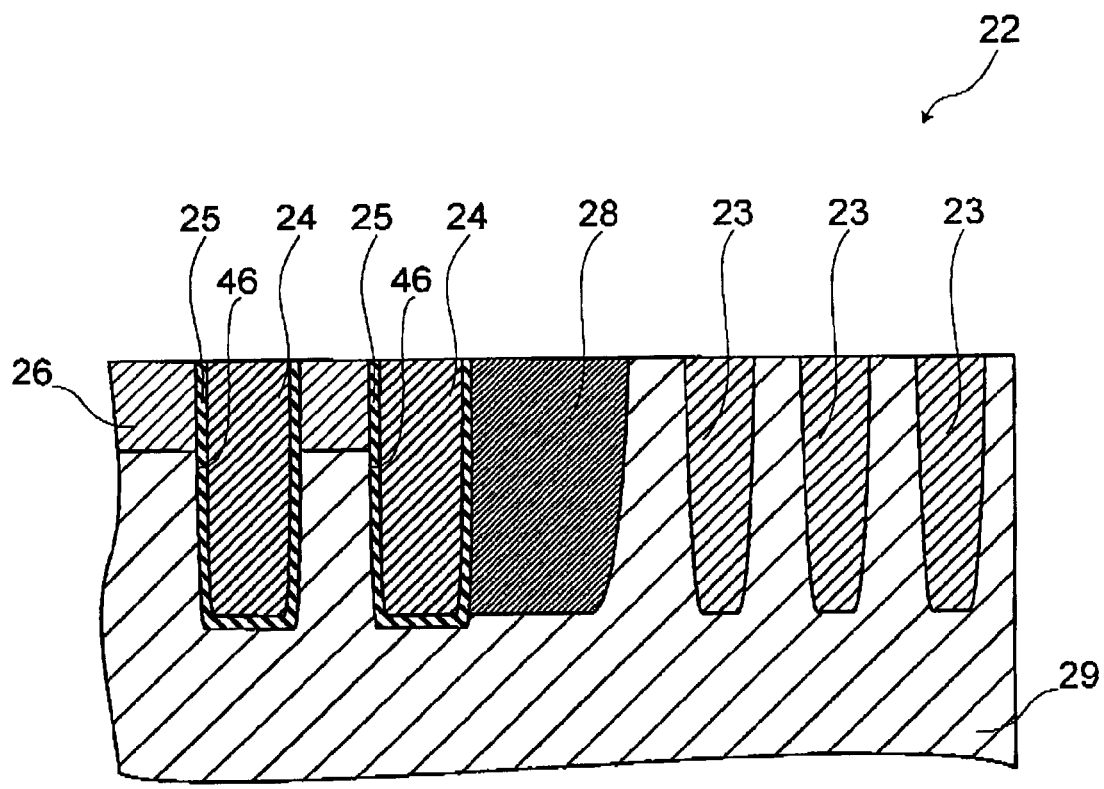

Next, as shown in FIG. 9, thermal oxide film is formed on the inner face of the trench groove 46 to form a gate insulating film 25. Here, the gate insulating film 25 may be formed by growing a silicon oxide film using the CVD (Chemical Vapor Deposition) technique.

Next, polysilicon is deposited on the silicon layer 22 and buried in the trench groove 46. Then the polysilicon is selectively etched so as to remain only inside the trench groove 46. Thus a striped gate electrode 24 is formed.

Figure 10:
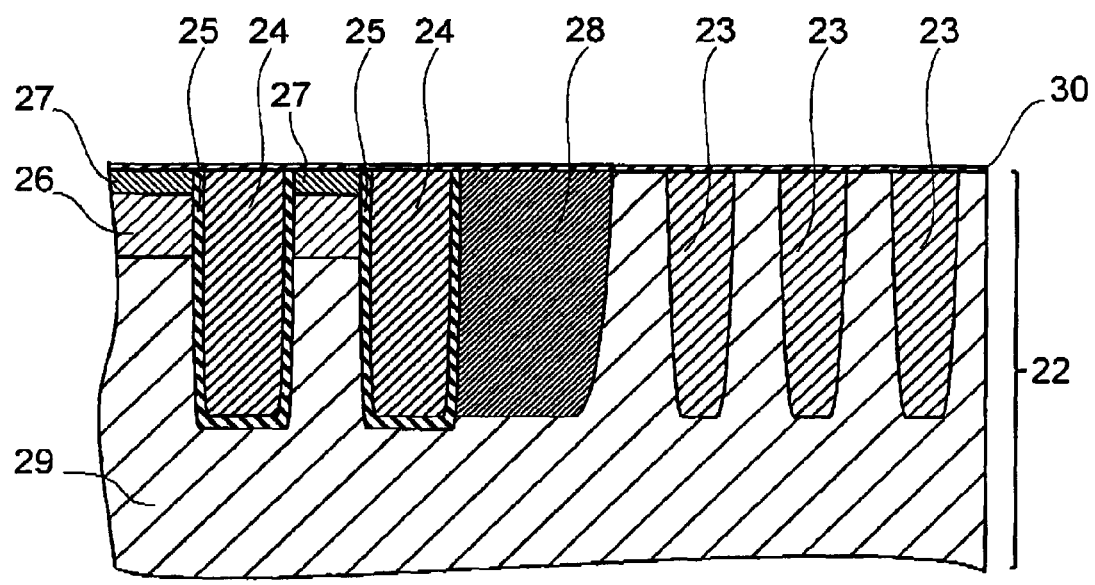

Next, as shown in FIG. 10, a cap film 30 is formed on the entire surface of the silicon layer 22. Next, the upper face of the silicon layer 22 is selectively subjected to ion implantation with N-type dopant, which is diffused to selectively form an N-type layer 27 partially in the upper face of the P-type layer 26. Here, the N-type layer 27 is intermittently placed along the extending direction of the gate electrode 24 for increasing short-circuit withstand capability.

Figure 11:
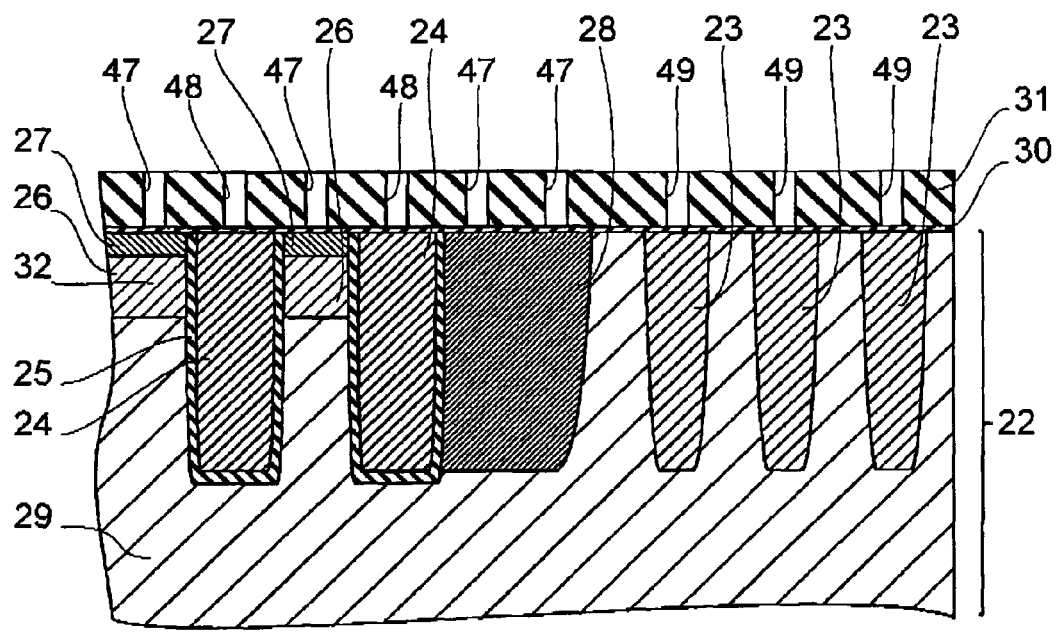

Next, as shown in FIG. 11, BPSG is illustratively deposited on the entire surface of the cap film 30 to form an interlayer insulating film 31. The interlayer insulating film 31 has a thickness of e.g. about 1.5 microns. Then the interlayer insulating film 31 is selectively etched to form trench grooves 47, 48, and 49. The trench grooves 47 extend in the same direction as the gate electrode 24 and are formed at the center of the region between the gate electrodes 24 and on both outsides of the region in which the gate electrodes 24 are arranged. The trench groove 48 extends in the same direction as the gate electrode 24 and is formed at the center of the directly overlying region of the gate electrode 24. The trench groove 49 is formed in the directly overlying region of the P-type layer 23. The trench grooves 47, 48, and 49 are formed simultaneously and with the same width and depth. Here, the cap film 30 can be used as an etching stopper.

Figure 12:
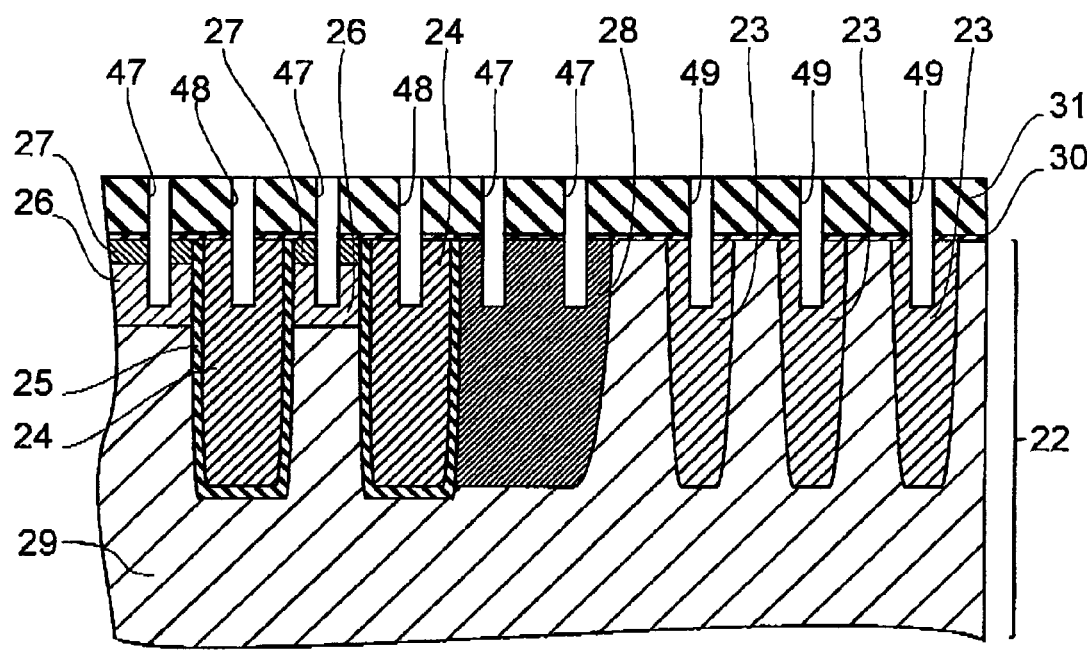

Next, as shown in FIG. 12, the bottom of the trench grooves 47 to 49 formed in the interlayer insulating film 31 is further etched. Thus the trench grooves 47 to 49 are deepened so as to penetrate the cap film 30 and reach a depth of e.g. about 0.5 microns from the upper face of the silicon layer 22. Hence the trench grooves 47 to 49 have a depth of e.g. about 2 microns. Thus the trench groove 47 reaches the interior of the P-type layer 26, the trench groove 48 reaches the interior of the gate electrode 24, and the trench groove 49 reaches the interior of the P-type layer 23.

Figure 13:
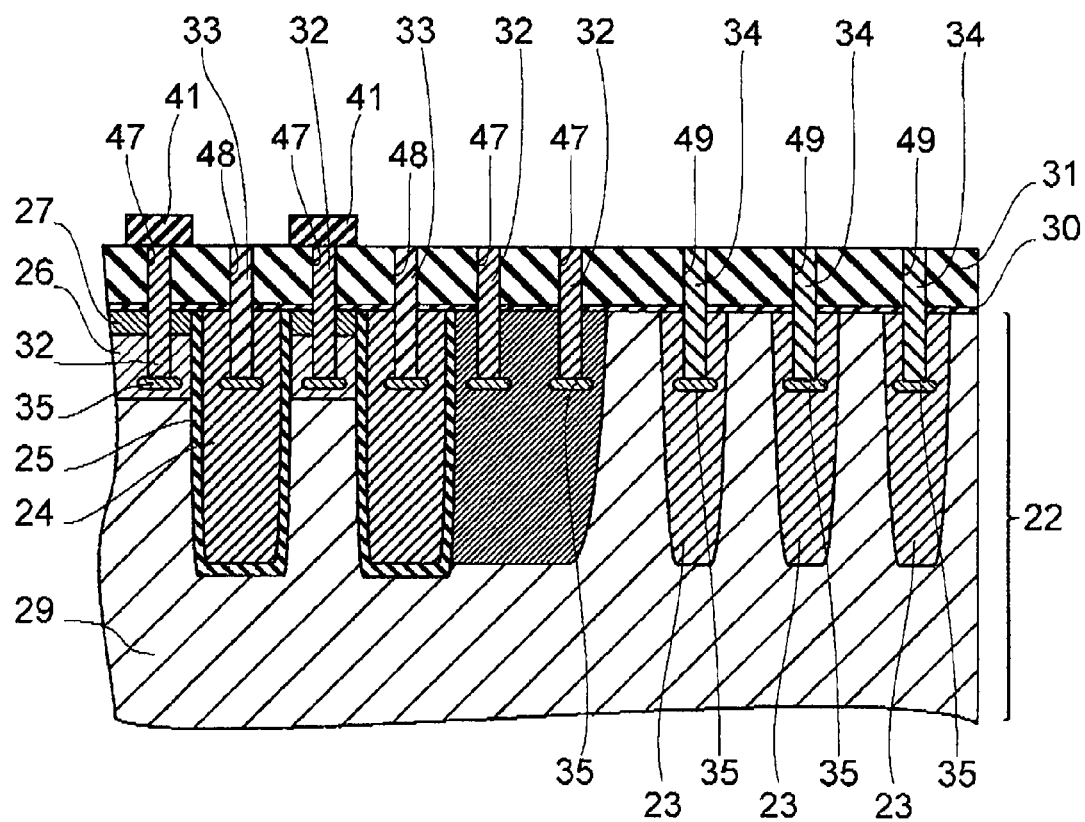

Next, as shown in FIG. 13, tungsten is deposited and buried in the trench grooves 47, 48, and 49. Then tungsten on the interlayer insulating film 31 is etched away. Thus an emitter plug 32 made of tungsten and connected to the P-type layer 26 is formed inside the trench groove 47, a gate plug 33 made of tungsten and connected to the gate electrode 24 is formed inside the trench groove 48, and a contact plug 34 made of tungsten and connected to the P-type layer 23 is formed inside the trench groove 49. Here, because the trench grooves 47 to 49 have a nearly equal width, tungsten can be reliably buried in these trench grooves. Trench grooves having different widths would induce a problem that one trench groove is filled with tungsten but another trench groove is not.

Here, a $P^+$-type layer 35 is formed directly below the emitter plug 32, the gate plug 33, and the contact plug 34.

Next, TEOS is deposited on the interlayer insulating film 31 and selectively etched away to form an insulating film 41, which selectively covers part of the upper face of the emitter plug 32 and selectively covers part of the upper face of the gate plug 33.

Next, as shown in FIG. 3, aluminum is deposited to a thickness of e.g. 2 to 4 microns and etched to form an emitter pad 36, a gate pad 37, and a field plate 38 spaced from each other on the interlayer insulating film 31 and the insulating film 41. Here, the insulating film 41 is interposed between the emitter plug 32 and the gate pad 37, and between the gate plug 33 and the emitter pad 36. In other words, the insulating film 41 has openings in the region between the emitter plug 32 and the emitter pad 36, and in the region between the gate plug 33 and the gate pad 37. Hence the emitter plug 32 is connected only to the emitter pad 36, the gate plug 33 is connected only to the gate pad 37, and the contact plug 34 is connected only to the field plate 38. Thus the IGBT 21 shown in FIGS. 2 to 6 is formed.

Next, the operation of the IGBT 21 according to this example is described.

The emitter pad 36 of the IGBT 21 is connected to a negative electrode, and the collector electrode (not shown) is connected to a positive electrode. Here, the P-type layer 23 serving as a guard ring is illustratively placed in the floating state. In this condition, a potential of the gate threshold or higher is applied to the gate pad 37. Then the potential is applied to one end of the gate plug 33, and applied to the gate electrode 24 entirely in the longitudinal direction through the gate plug 33. Thus the P-type layer 26 becomes conducting. Hence electrons are supplied from the N-type layer 27 serving as the source layer into the silicon layer 22, holes are supplied from the P-type layer (not shown) serving as the collector layer into the silicon layer 22, and hence a current flows in the silicon layer 22. Here, part of the holes that are not combined with electrons in the silicon layer 22 pass through the P-type layer 26 serving as the P-base and are absorbed in the emitter plug 32.

Next, the effect of this example is described.

Figure 14A:
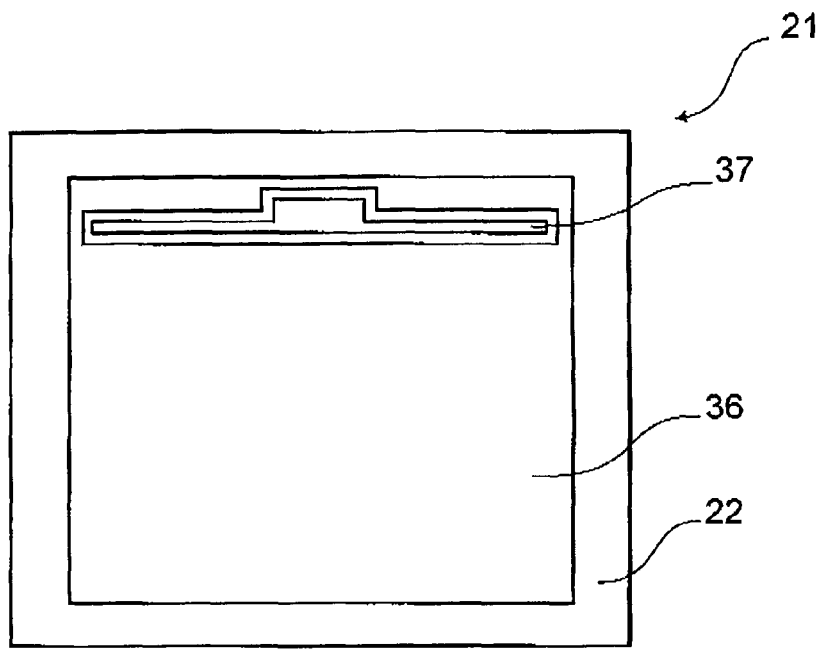
FIGS. 14A and 14B are schematic plan views showing the effect of this example, where
Figure 14B:
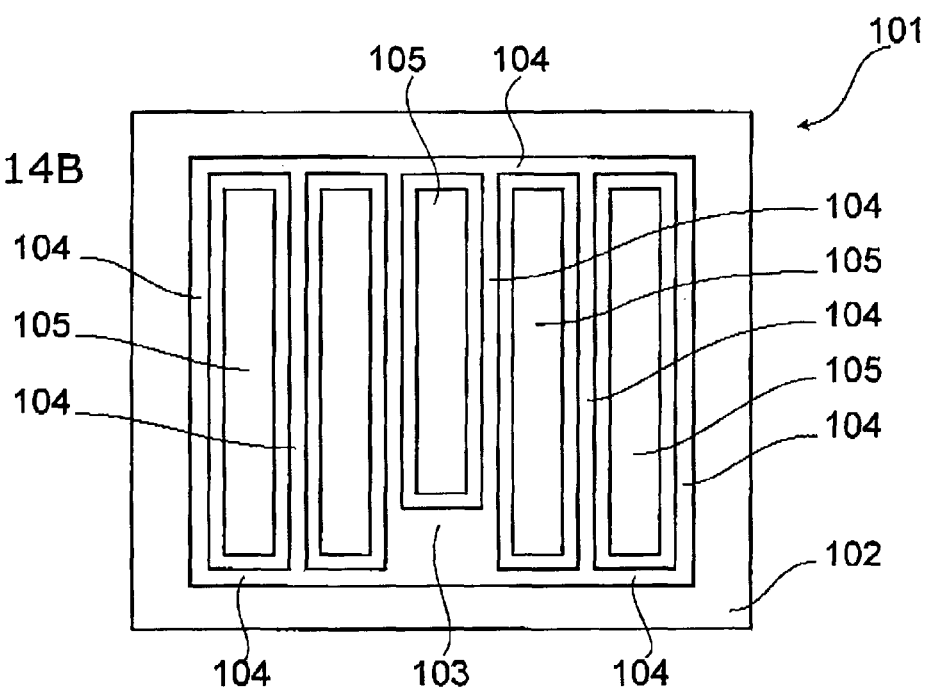

FIGS. 14A and 14B are schematic plan views showing the effect of this example, where FIG. 14A shows an IGBT according to this example, and FIG. 14B shows an IGBT according to a comparative example. For convenience, FIGS. 14A and 14B show only the silicon layer, the emitter pad, the gate pad, and the gate finger interconnect described below.

Figure 15:
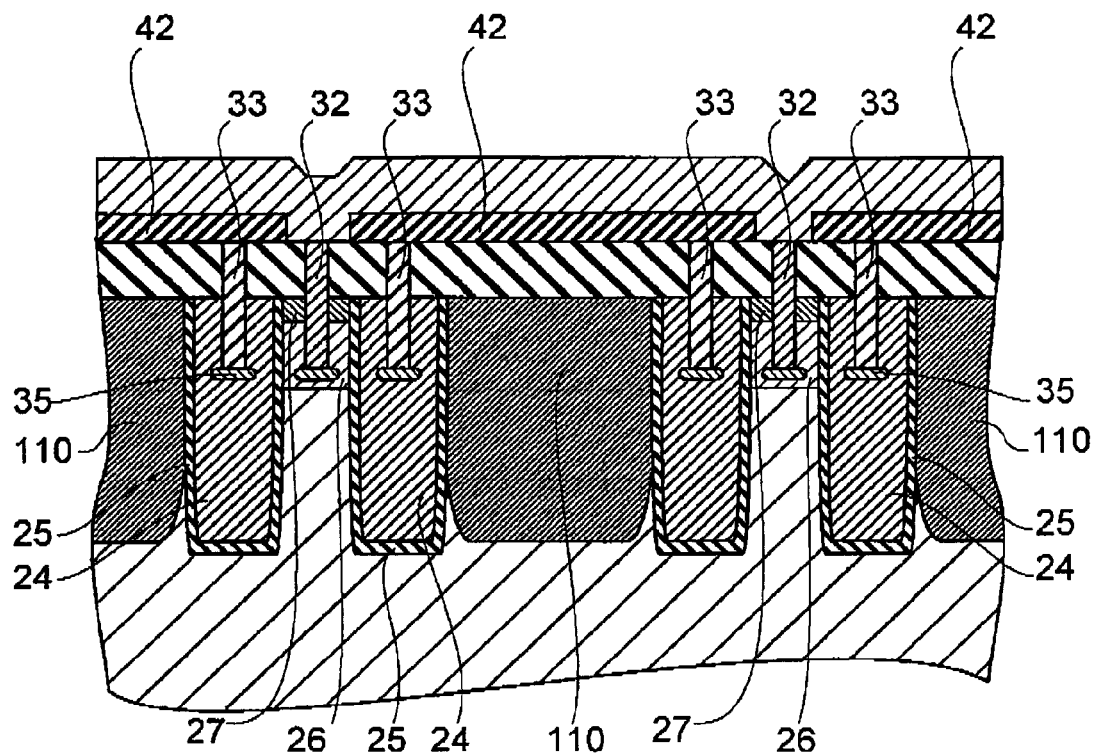
FIG. 15 is a cross-sectional view showing an IGBT according to another aspect of this example.

FIG. 15 is a cross-sectional view showing an IGBT according to another aspect of this example.

In this example, the gate plug 33 made of tungsten is buried in the gate electrode 24 along its longitudinal direction. Hence, if a potential is applied to one end of the gate plug 33, the potential can be transmitted to the entire length of the gate electrode 24. Thus, as shown in FIG. 14A, the gate pad 37 can be provided only on one edge of the silicon layer 22, and the emitter pad 36 can be provided on the other region. Therefore the emitter pad 36 can be formed as a continuous film with a large area.

On the other hand, an IGBT 101 according to the comparative example shown in FIG. 14B includes no gate plug. In this IGBT 101, if a gate pad is provided only on one edge on the silicon layer 102, a long gate electrode is needed and has an increased internal resistance. Thus, in the IGBT 101, as shown in FIG. 14B, gate finger interconnects 104 extracted from the gate pad 103 need to be laid to cover the entire region on the silicon layer 102. A gate electrode (not shown) is connected between the adjacent gate finger interconnects 104. Consequently, emitter pads 105 are distributed in a plurality of regions partitioned by the gate pad 103 and the gate finger interconnects 104. The gate finger interconnect 104 is illustratively made of aluminum and covered with a polyimide layer.

However, if an external plate electrode is connected to the emitter pad 105 using solder for passing a large current through such an IGBT 101, the solder may be placed on the polyimide layer covering the gate finger interconnect 104 and break insulation between the gate finger interconnect 104 and the emitter pad 105. Furthermore, because the emitter pads 105 are independent of each other, the potential varies with the emitter pads 105, causing breakdown due to current concentration. Thus fabrication of packages with the emitter pad 105 connected to a plate electrode may lead to yield reduction or breakdown in use. Furthermore, the gate electrode and the source layer (N-type layer) cannot be provided in the region of the gate finger interconnect 104 and the surrounding region. Hence these regions are dead space having no contribution to driving the IGBT 101. Thus the active area of the IGBT decreases, and hence the applicable current decreases. Furthermore, such discontinuities, i.e. portions disturbing the repetitive pattern, increase nonuniformity and induce breakdown.

In contrast, according to this example, the longitudinal resistance of the gate electrode 24 can be reduced. Thus there is no need for gate finger interconnects, and the emitter pad 36 can be formed as a single large continuous film. Hence there is no yield reduction even if solder is placed on the emitter pad 36. Therefore the emitter pad 36 can be connected to a plate electrode, thereby achieving a large current capacity. Furthermore, there are no irregularities due to gate finger interconnects. Thus solder bonding is improved, thereby decreasing electric resistance and thermal resistance at the junction. This reduces electric power loss, and further enhances heat dissipation and uniform heat distribution. Furthermore, according to this example, the dead space due to gate finger interconnects can be eliminated. Hence the active area can be made 10 to 20% broader than in the comparative example shown in FIG. 14B. This allows a larger current capacity. Furthermore, no discontinuities occur in the pattern, and the entire chip is formed as repetition of the same pattern. This prevents current concentration and breakdown.

Furthermore, according to this example, a gate plug 33 made of tungsten is connected to the gate electrode 24 in its entire length. Hence, as compared with the case of no gate plug 33, the gate resistance can be reduced. Thus, even if the gate electrode 24 is thinned, the delay and voltage reduction in gate signals can be reduced, and hence the IGBT can be downscaled.

Furthermore, according to this example, the emitter plug 32 is buried inside the P-type layer 26. Hence part of the holes flowing into the P-type layer 26 can be absorbed by the emitter plug 32 before reaching the N-type layer 27. Thus latch-up can be reliably prevented.

In addition, as shown in FIG. 15, for example, a floating P-type layer 110 may be placed partially in the region between the gate electrodes for facilitating electron injection. This can block holes from flowing into the P-base. Then the injected electrons are increased, which enables devices with low resistance to be fabricated. Here, the P-type layer 110 preferably has a width of approximately 8 microns or less.

Furthermore, according to this example, a cap film 30 is provided on the silicon layer 22. Thus, when the IGBT 21 is manufactured, the cap film 30 can be used as an etching stopper in forming the trench grooves 47 to 49 in the step shown in FIG. 11. Hence, even if the interlayer insulating film 31 has an uneven film thickness, the lower end of the trench grooves 47 to 49 can be aligned at the cap film 30. Consequently, when the trench grooves 47 to 49 are dug into the silicon layer 22 in the subsequent step shown in FIG. 12, the depth of the trench grooves 47 to 49 can be made uniform with reference to the upper face of the silicon layer 22.

Furthermore, in this example, the emitter plug 32, the gate plug 33, and the contact plug 34 are provided in the interlayer insulating film 31 and connected to the P-type layer 26, the gate electrode 24, and the P-type layer 23, respectively. Thus all the emitter pad 36, the gate pad 37, and the field plate 38 can be provided on the interlayer insulating film 31. More specifically, the emitter pad 36, the gate pad 37, and the field plate 38 can be coplanarly provided by growing a conductive film illustratively made of aluminum on the upper face of the interlayer insulating film 31 and patterning this conductive film. Thus step breakage can be avoided in the emitter pad 36, the gate pad 37, and the field plate 38, and the yield of the IGBT 21 can be improved.

On the contrary, without providing a contact plug in the interlayer insulating film 31, a large opening may be formed in the portion of the interlayer insulating film 31 corresponding to the directly overlying region of the P-type layer 23, and the conductive film for forming the emitter pad and the gate pad may be buried also in this opening to get in direct contact with the P-type layer 23. However, in this method, because the conductive film is formed on the step, step breakage may occur in the conductive film.

Furthermore, in this example, the depth of the P-type layer 28 is comparable with the depth of the gate electrode 24. Hence, even if an avalanche phenomenon occurs, the generated holes flow into the P-type layer 28 and are prevented from flowing into the P-type layer 26. Thus the breakdown of the IGBT 21 can be prevented. Furthermore, because the depth of the P-type layer 28 is comparable with the depth of the gate electrode 24, electric field concentration on the end and corner of the gate electrode 24 can be prevented. Consequently, the breakdown withstand capability, the withstand voltage, and the cosmic ray withstand capability of the IGBT 21 can be improved. Here, the P-type layer 28 is preferably deeper than the gate electrode 24.

Furthermore, in this example, the emitter pad 36 is shaped so as to include therein a rectangle occupying 50% or more of the area of the emitter pad 36. Hence, when the emitter pad 36 is connected to an external plate electrode, the large area occupying 50% or more of the emitter pad 36 can be used for junction. Here, the emitter pad 36 has no portion that is extremely far from the junction of the external electrode. Thus the operation and temperature of the IGBT 21 can be made uniform. Moreover, because the emitter pad 36 is a large continuous film, alignment in bonding the external electrode is facilitated.

Furthermore, in this example, the trench opening width Wt and the mesa width Wm have the relation given by the above formula (1). The effect of facilitating electron injection into the silicon layer 22 is positively correlated with the value of (Wt+Wm)/Wm. Hence, by making the trench opening width Wt wider than the mesa width Wm, the amount of electron injection can be increased, and the loss can be decreased. On the other hand, the strength of the mesa is inversely proportional to the square of the mesa width Wm. Hence the structure becomes unstable if the mesa width is extremely narrowed. According to the knowledge obtained by the inventors, if the mesa width Wm is half or more of the trench opening width Wt, the mesa has a sufficient strength and can achieve high reliability.

In this example, the upper face of the emitter pad 36 may be plated to thicken the emitter pad. The plating material can be copper, aluminum, or solder.

This can reduce the resistance in extracting heat and current from the upper face of the emitter pad when the emitter pad is subjected to large-area connection with solder. By way of example, when the upper face of the emitter pad 36 is plated and further connected with solder, the resistance is reduced to one third or less as compared with the connection based on bonding wire without plating.

Furthermore, thick film formation by plating increases the heat capacity of the emitter pad itself. Thus the short-circuit withstand capability can be improved.

Moreover, by plating the emitter pad, the lateral resistance can be significantly reduced in the entire surface of the device. Therefore devices less susceptible to current concentration with high breakdown resistance can be fabricated.

Thus, according to this example, a large-area, continuous emitter pad can be provided. Hence the upper face of the emitter pad can be plated to achieve the above advantageous effects. On the contrary, the conventional segmented emitter pad cannot achieve such effects because the emitter pads are separated from each other.

Next, variations of this example are described.

FIGS. 16 to 20 are each a schematic plan view illustrating an IGBT according to a variation of the first example. For convenience, FIGS. 16 to 20 show only the silicon layer, the emitter pad, and the gate pad.

Figure 16:
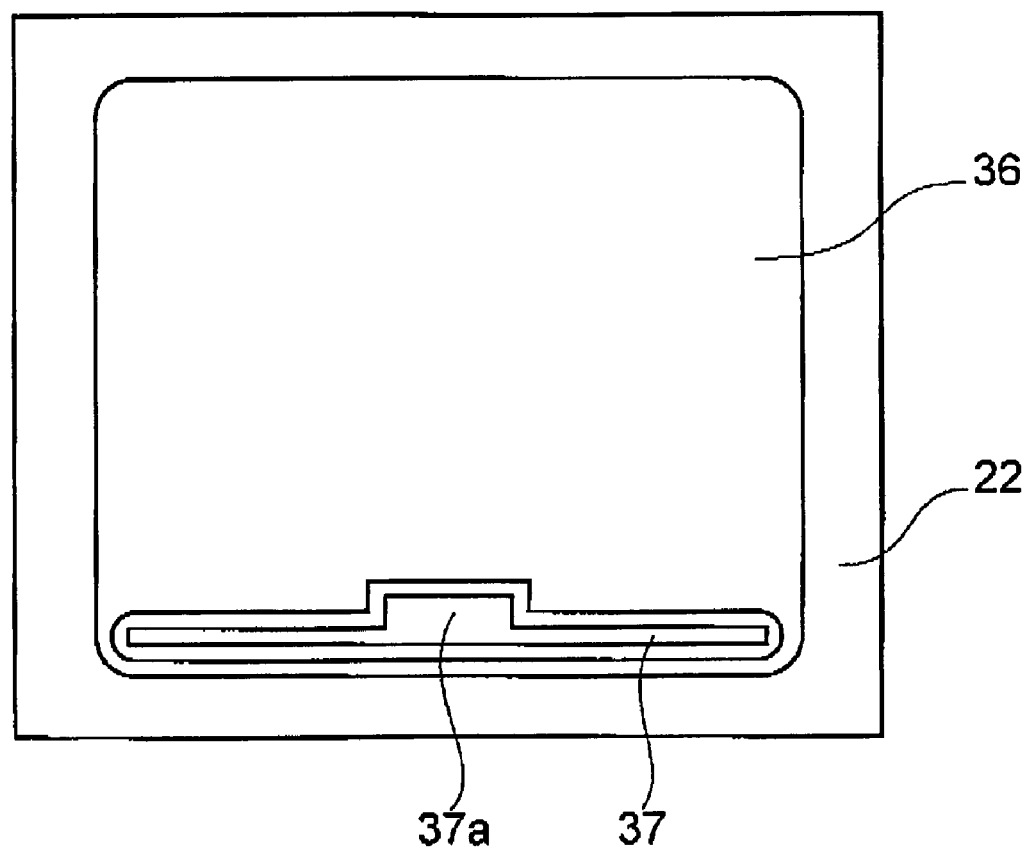
FIG. 16 is a schematic plan view illustrating an IGBT according to a first variation of this example.

In a first variation shown in FIG. 16, the projection 37a of the gate pad 37 extends toward the center of the silicon layer 22, i.e. extends inward. The configuration of this variation other than the foregoing is the same as that of the first example described above.

Figure 17:
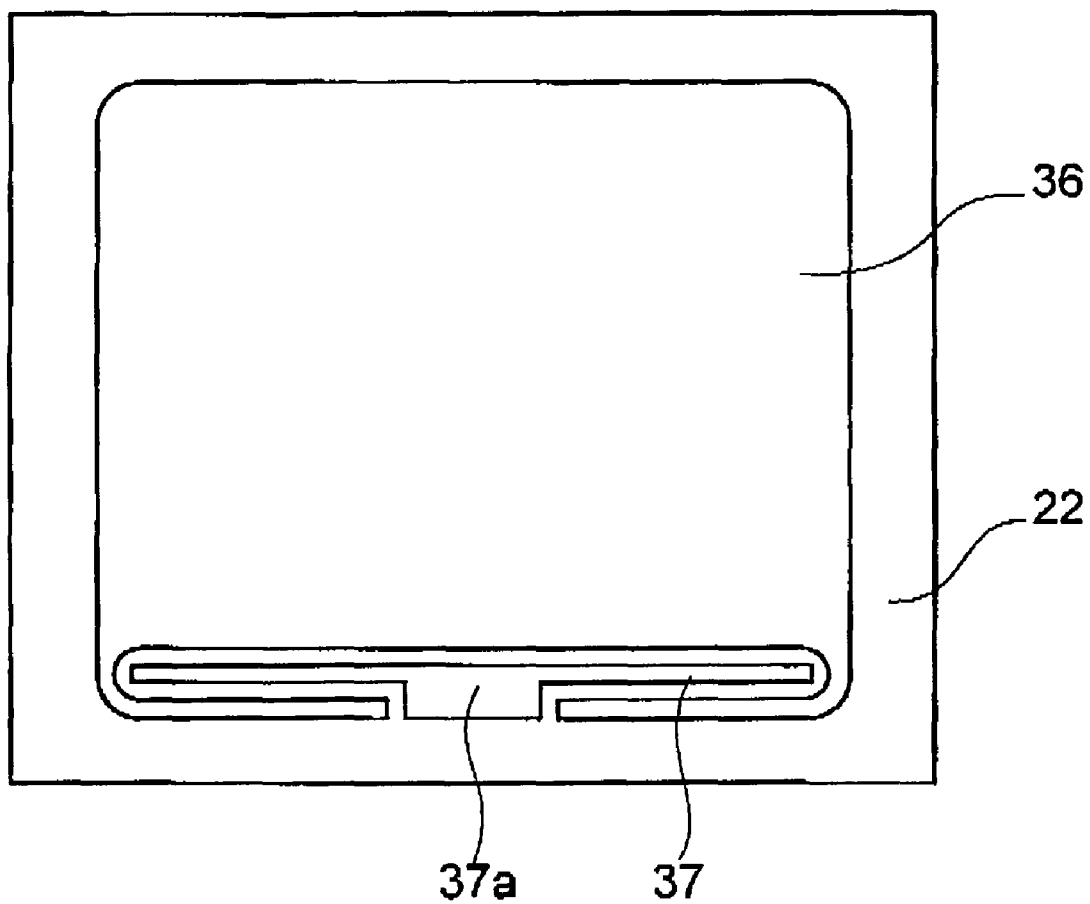
FIG. 17 is a schematic plan view illustrating an IGBT according to a second variation of this example.

In a second variation shown in FIG. 17, the projection 37a of the gate pad 37 is placed at the edge of the central region of the silicon layer 22, and the portion of the gate pad 37 other than the projection 37a is surrounded by the emitter pad 36. The configuration of this variation other than the foregoing is the same as that of the first example described above.

Figure 18:
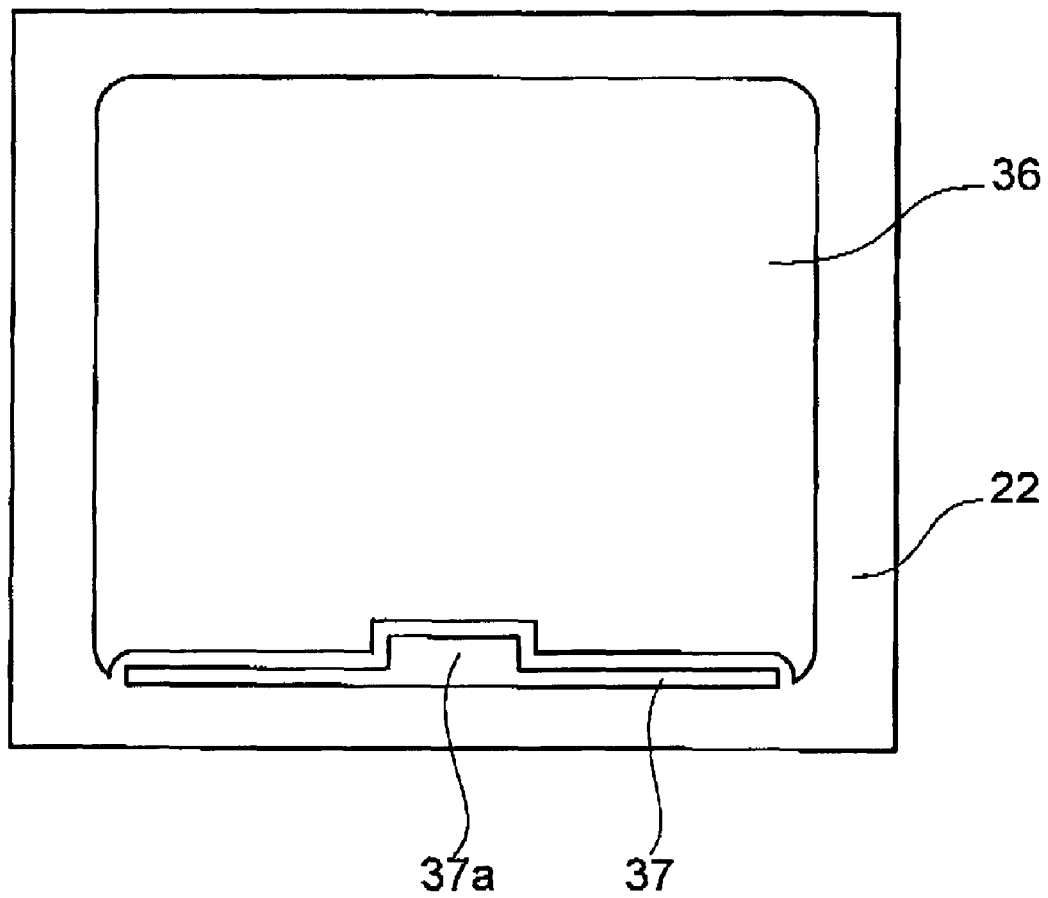
FIG. 18 is a schematic plan view illustrating an IGBT according to a third variation of this example.

In a third variation shown in FIG. 18, the gate pad 37 is placed on the edge of the central region of the silicon layer 22, and the projection 37a extends inward. The emitter pad 36 does not surround the gate pad 37, but is placed on one side of the gate pad 37. The configuration of this variation other than the foregoing is the same as that of the first example described above.

Figure 19:
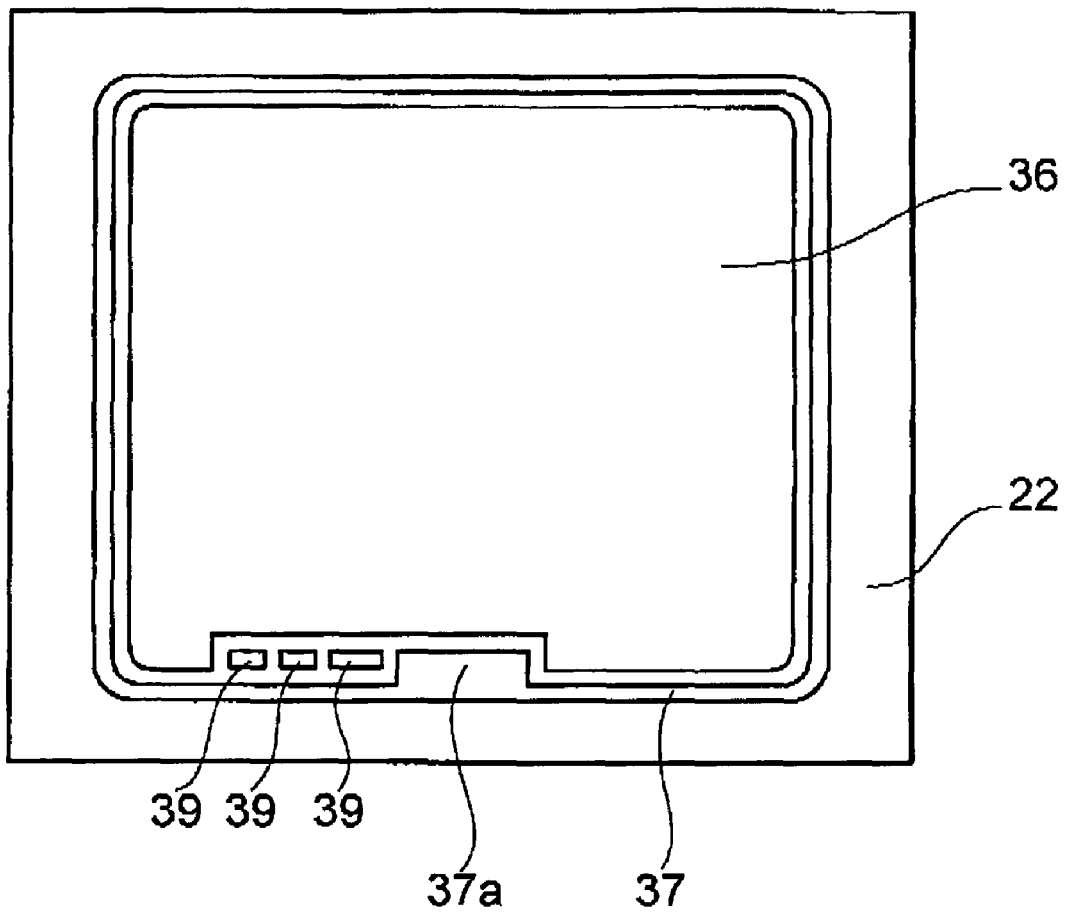
FIG. 19 is a schematic plan view illustrating an IGBT according to a fourth variation of this example.

In a fourth variation shown in FIG. 19, the gate pad 37 surrounds the emitter pad 36, and the projection 37a of the gate pad 37 extends inward. Furthermore, three rectangular sense pads 39 are provided lateral to the projection 37a inside the gate pad 37. The sense pad can be a temperature sense diode for detecting the heat generating temperature of the device, a gate potential sense pad for detecting the potential difference across the gate, or other various functions. The configuration of this variation other than the foregoing is the same as that of the first example described above.

Figure 20:
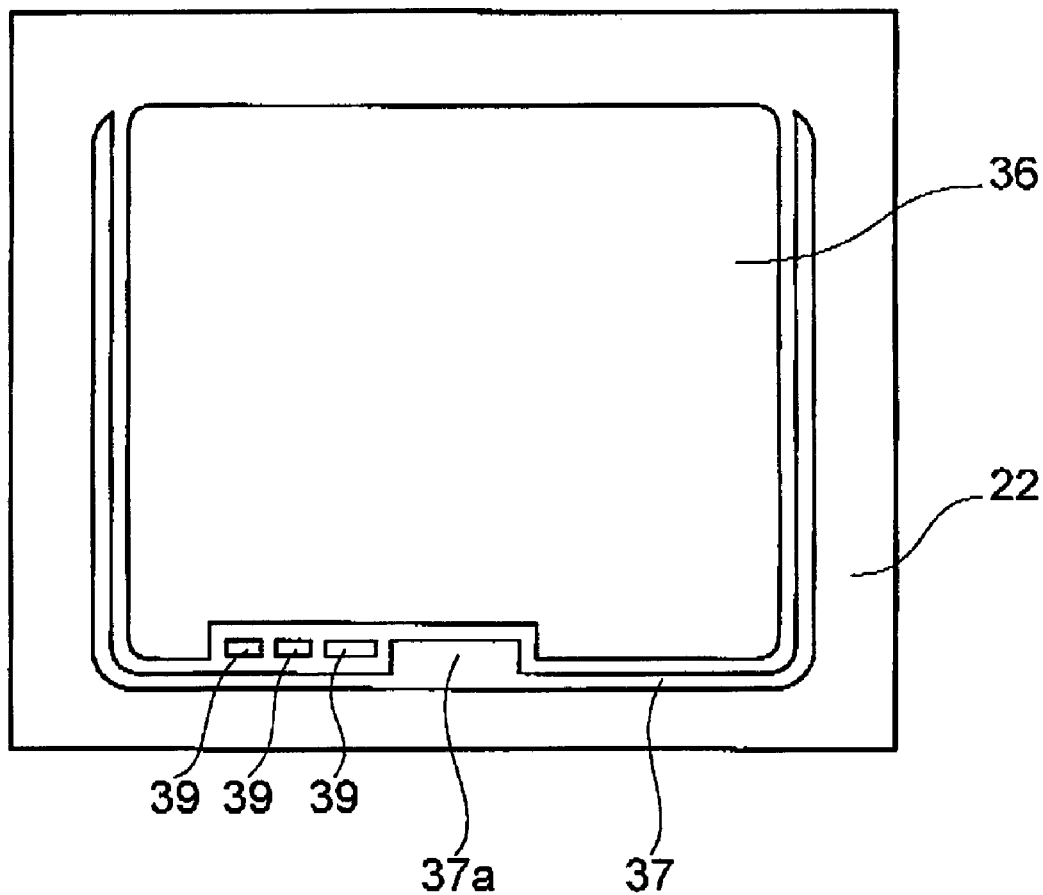
FIG. 20 is a schematic plan view illustrating an IGBT according to a fifth variation of this example.

In a fifth variation shown in FIG. 20, the gate pad 37 has a rectangular U-shape. That is, the gate pad 37 does not completely surround the emitter pad 36, but is placed outside only three sides of the emitter pad 36. The configuration of this variation other than the foregoing is the same as that of the fourth variation shown in FIG. 19. Here, the gate pad 37 may be placed outside only two sides of the emitter pad 36.

Next, a second example of this embodiment is described.

Figure 21:
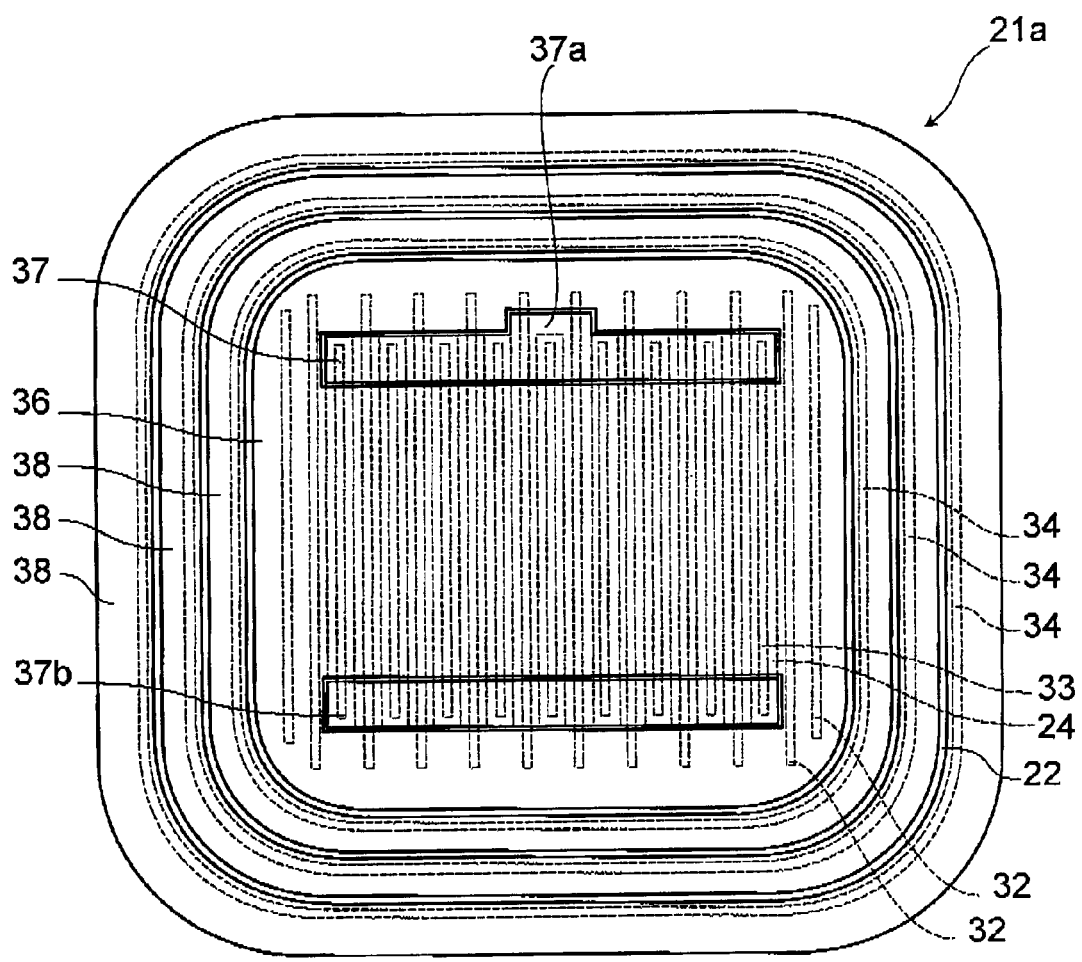
FIG. 21 is a plan view illustrating an IGBT according to a second example of the first embodiment.

FIG. 21 is a plan view illustrating an IGBT according to this example.

As shown in FIG. 21, the IGBT 21a according to this example is different from the IGBT 21 according to the first example described above (see FIG. 2) in that the IGBT 21a includes two gate pads. More specifically, in addition to the gate pad 37, the IGBT 21a includes a gate pad 37b. The gate pad 37b is provided in the directly overlying region of the edge opposite to the edge of the gate electrode 24 located in the directly underlying region of the gate pad 37, and is connected to the gate plug 33. That is, one end of the gate plug 33 is connected to the gate pad 37, and the other end of the gate plug 33 is connected to the gate pad 37b. The configuration of this example other than the foregoing is the same as that of the first example described above.

As compared with the first example described above, this example includes two gate pads. Hence signals can be applied to the gate electrode 24 at both ends thereof, and the gate delay can be further reduced. Here, the area of the emitter pad 36 decreases by the area occupied by the gate pad 37b relative to the first example. However, as in the first example, the emitter pad 36 can be formed as a single large continuous film. Thus there is no problem in solder bonding. The operation and effect of this example other than the foregoing is the same as those of the first example described above.

Next, a third example of this embodiment is described.

Figure 22:
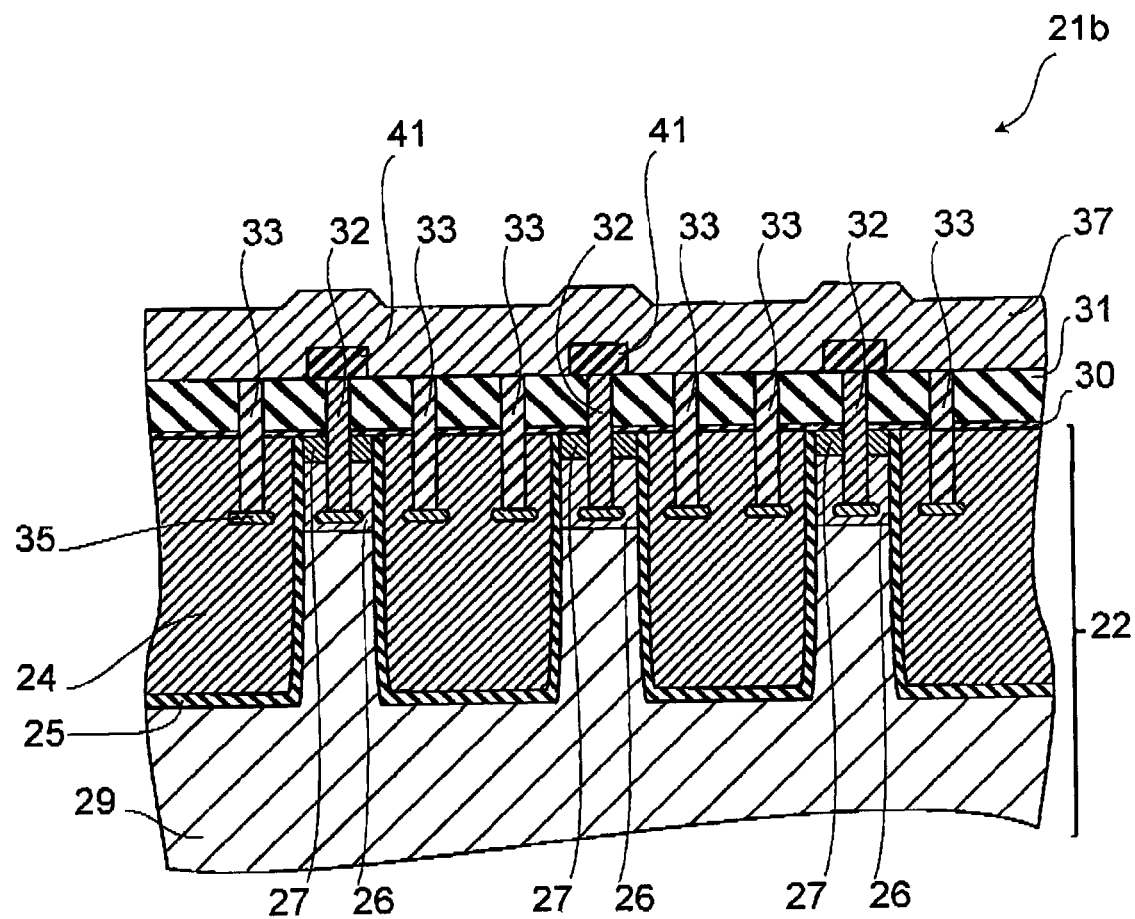
FIG. 22 is a cross-sectional view illustrating an IGBT according to a third example of the first embodiment.

FIG. 22 is a cross-sectional view illustrating an IGBT according to this example.

In the IGBT 21b according to this example, the trench opening width is twice or more the mesa width. Thus the gate resistance can be further reduced. Moreover, two gate plugs 33 are connected to each gate electrode 24. On the other hand, as in the first example, one emitter plug 32 is connected to each region between the gate electrodes 24. Hence the emitter plug 32 and the gate plug 33 are not arranged alternately, but a set of one emitter plug 32 and two gate plugs 33 is repeatedly arranged. Thus the mesa width can be narrowed to prevent latch-up more reliably. Furthermore, by connecting two gate plugs to one gate electrode, the gate resistance can be further reduced, and simultaneously, the plug spacing can be made constant even if the trench opening width is twice or more the mesa width, which facilitates forming plugs. The configuration, operation, and effect of this example other than the foregoing are the same as those of the first example described above.

Next, a fourth example of this embodiment is described.

The semiconductor apparatus according to this example is an IGBT.

Figure 23:
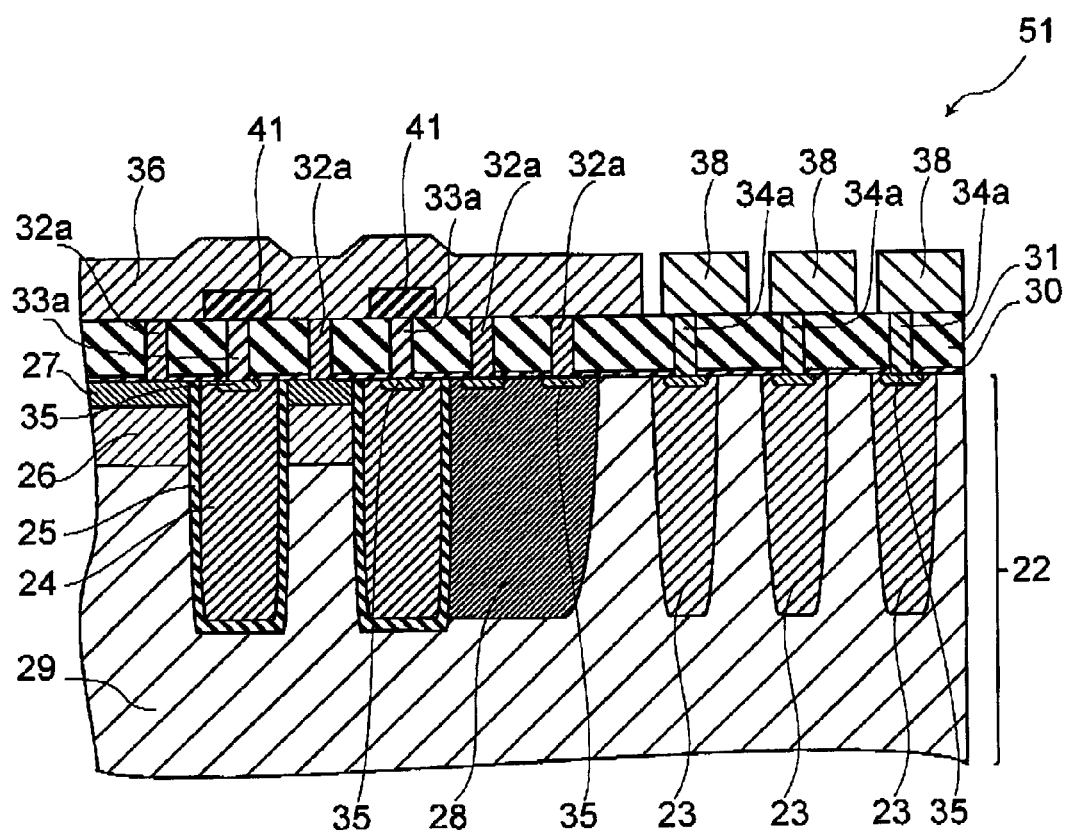
FIGS. 23 and 24 are cross-sectional views illustrating an IGBT according to a fourth example of this embodiment.
Figure 24:
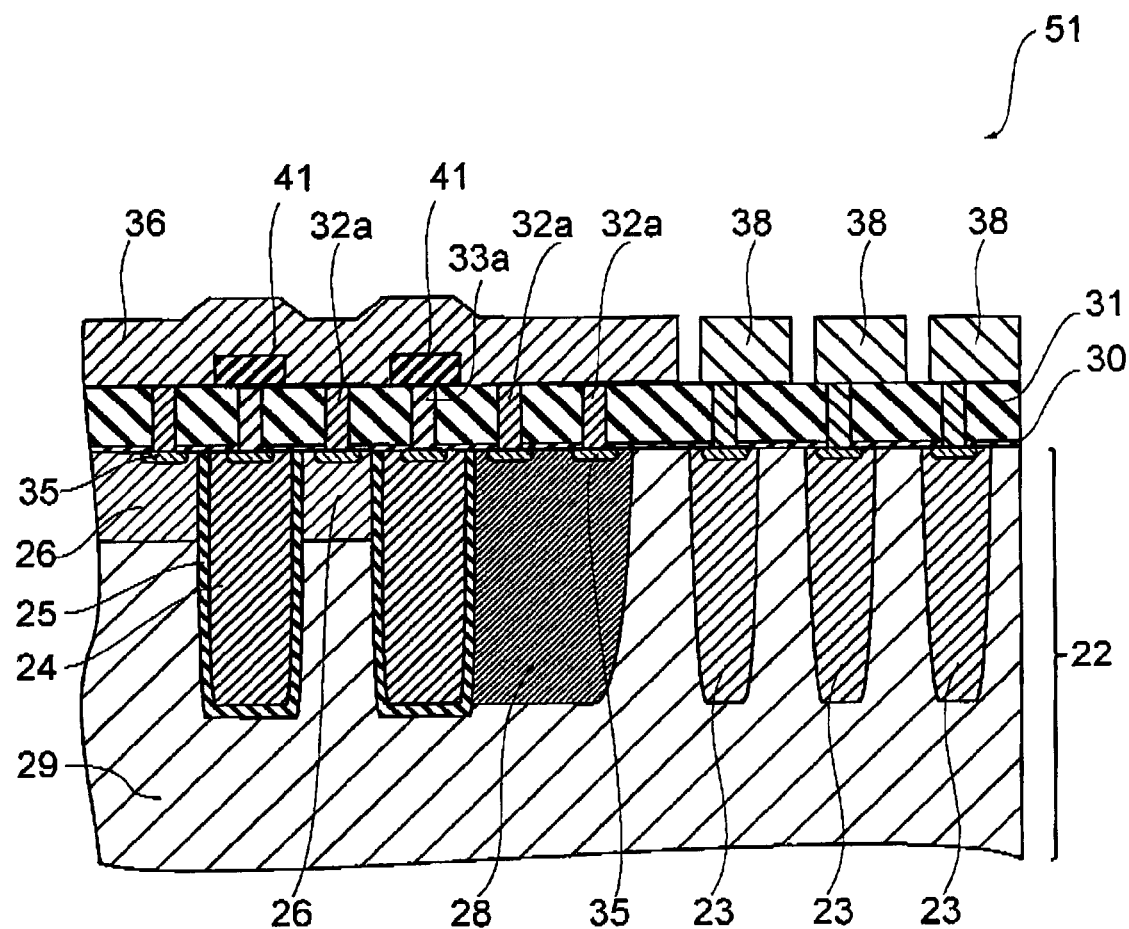

FIGS. 23 and 24 are cross-sectional views illustrating an IGBT according to this example. The cross section shown in FIG. 23 corresponds to the cross section shown in FIG. 4 in the first example. FIG. 24 shows a cross section parallel to that in FIG. 23, and shows a portion not including the N-type layer 27 (see FIG. 23).

As shown in FIGS. 23 and 24, in the IGBT 51 according to this example, the position of the lower face of the emitter plug 32a, the gate plug 33a, and the contact plug 34a nearly coincides with the position of the upper face of the silicon layer 22, and does not reach the interior of the silicon layer 22 and the gate electrode 24. More specifically, the emitter plug 32a is in contact with the upper face of the N-type layer 27, the P-type layer 26, or the P-type layer 28. The gate plug 33a is in contact with the upper face of the gate electrode 24. The contact plug 34a is in contact with the upper face of the P-type layer 23. As in the first example described above, the plugs penetrate the interlayer insulating film 31 and the cap film 30, and the upper ends of the plugs are connected to the emitter pad 36, the gate pad 37, and the field plate 38, respectively. The configuration of this example other than the foregoing is the same as that of the first example described above.

In the IGBT 51 according to this example, the plugs are not buried in the silicon layer 22 and the gate electrode 24, which facilitates manufacturing. Also in this example, as in the first example, the gate resistance is reduced by the gate plug 33a, and the gate pad is provided only on one edge of the silicon layer 22. Thus the emitter pad 36 can be advantageously formed as a continuous film with large area. The operation and effect of this example other than the foregoing is the same as those of the first example described above.

In addition, in this example, the gate electrode 24 may be shallowed to a depth comparable with the P-type layer 26, for example. By shallowing the gate electrode, parasite capacitance between the gate electrodes can be reduced.

Next, a fifth example of this embodiment is described.

Figure 25:
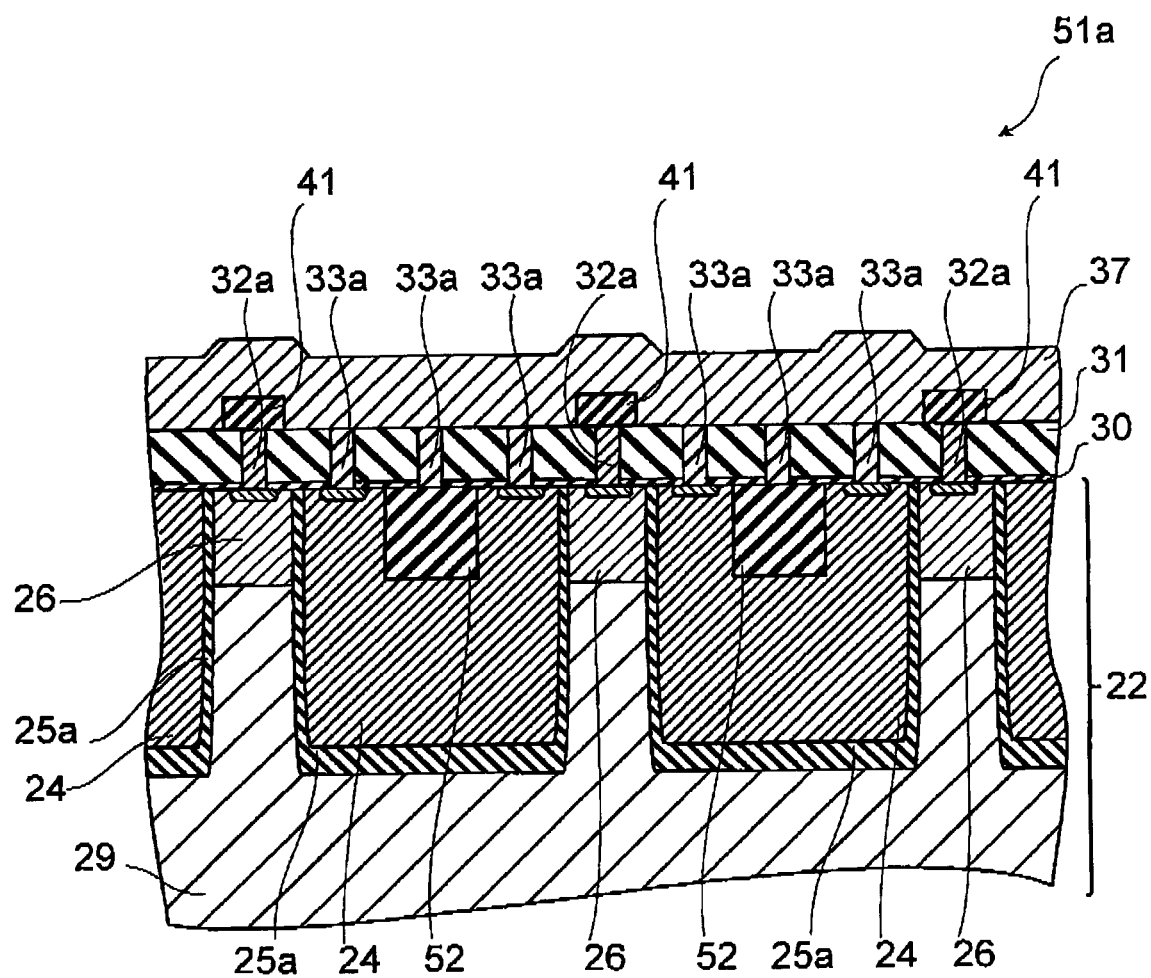
FIG. 25 is a cross-sectional view illustrating an IGBT according to a fifth example of the first embodiment.

FIG. 25 is a cross-sectional view illustrating an IGBT according to this example.

In the IGBT 51a according to this example, the trench opening width is about three times the mesa width. Furthermore, an insulating portion 52 illustratively made of silicon oxide film is buried in the center of the upper portion of the gate electrode 24. Three gate plugs 33a are provided in the directly overlying region of one gate electrode 24. Among them, the lower face of the two gate plugs 33a placed on both sides is in contact with the upper face of the gate electrode 24. Thus these two gate plugs 33a are connected to the gate electrode 24. On the other hand, the lower face of the one gate plug 33a placed at the center is in contact with the upper face of the insulating portion 52. Thus this gate plug 33a is not connected to the gate electrode 24.

As in the fourth example, one emitter plug 32a is connected to each region between the gate electrodes 24. Hence the emitter plug 32a and the gate plug 33a are not arranged alternately, but a set of one emitter plug 32a and three gate plugs 33a is repeatedly arranged. Thus the plug spacing can be made constant even if the trench opening width is about three times the mesa width, which facilitates forming plugs.

Furthermore, in the gate insulating film 25a, the film thickness of the portion covering the bottom face of the gate electrode 24 is thicker than the film thickness of the portion covering the side face of the gate electrode 24. Thus parasite capacitance between the gate electrode 24 and the silicon layer 22 can be reduced, and hence the gate delay can be avoided.

As described in the first example, the gate electrode is formed by forming a trench groove in the upper face of the silicon layer 22, depositing polysilicon on the silicon layer 22 to bury polysilicon in the trench groove, and then removing the polysilicon deposited on the portion other than the inside of the trench groove. However, when the width of the trench groove is increased, the amount of polysilicon to be deposited and buried in the trench groove is increased, and productivity is decreased.

In this context, in this example, the amount of polysilicon deposited on the silicon layer after forming the trench groove is reduced so that the trench groove is not completely filled. A silicon oxide film is formed in the portion inside the trench groove that is not filled with polysilicon, i.e. at the center of the upper portion in the trench groove. This silicon oxide film becomes the insulating portion 52. Thus, even when a wide gate electrode is formed, the deposited amount of polysilicon can be reduced, and high productivity can be achieved. The configuration, operation, and effect of this example other than the foregoing are the same as those of the first example described above.

In this example, the portion of the trench groove that is not filled with polysilicon is filled back with silicon oxide film. However, the invention is not limited thereto. For example, silicon nitride film or other insulating film, or polysilicon, can be used for filling back. Furthermore, unless any problem occurs in the subsequent steps, metal or alloy can be used for filling back. Thus the gate resistance can be further reduced.

Next, a sixth example of this embodiment is described.

Figure 26:
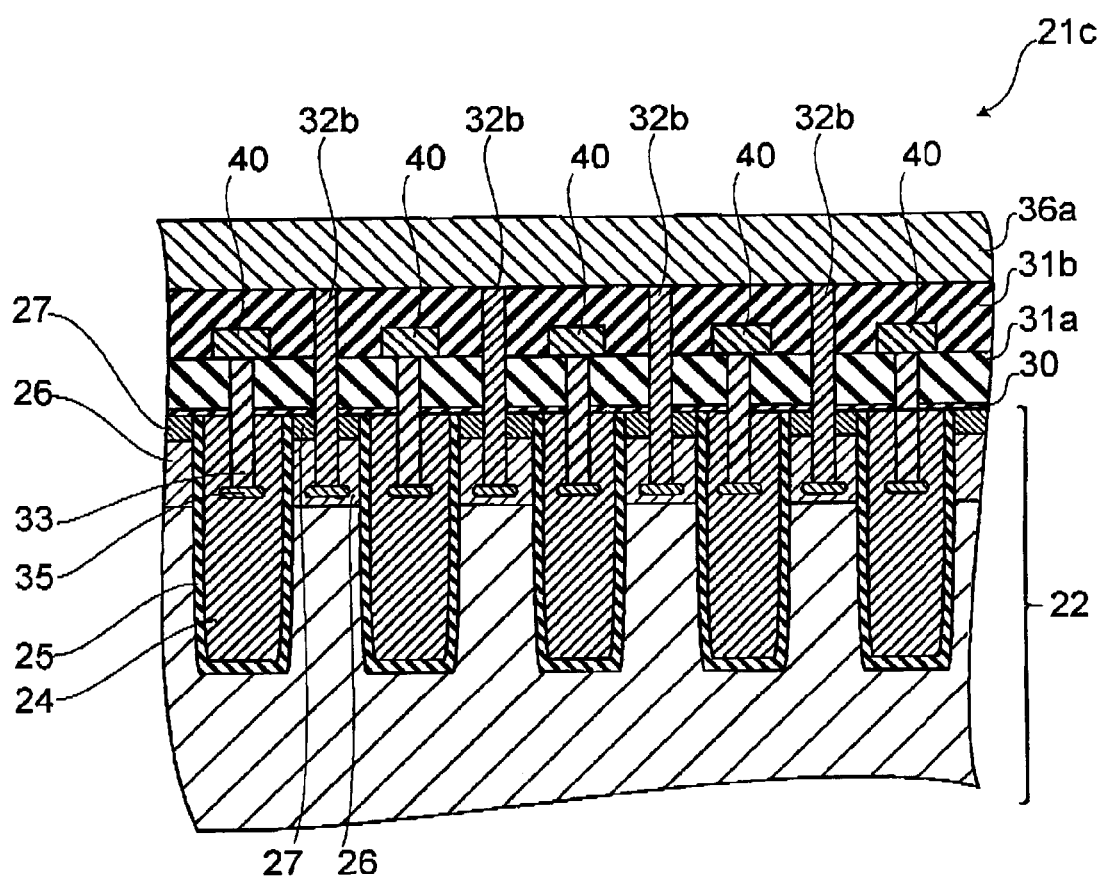
FIG. 26 is a cross-sectional view illustrating an IGBT according to a sixth example of the first embodiment.

FIG. 26 is a cross-sectional view illustrating an IGBT according to this example.

The IGBT 21c according to this example includes two interlayer insulating films. More specifically, an interlayer insulating film 31b is provided on the interlayer insulating film 31a. A plurality of gate interconnects 40 extending in the same direction as the gate electrode 24 are provided in the directly overlying region of the gate electrodes 24 at the interface between the interlayer insulating film 31a and the interlayer insulating film 31b. The gate interconnect 40 is connected to a gate pad (not shown) at the edge of the IGBT 21c. An emitter pad 36a is provided on the entire surface of the interlayer insulating film 31b. Furthermore, the emitter plug 32b penetrates the interlayer insulating films 31a and 31b and is connected to the emitter pad 36a. The gate plug 33 penetrates only the interlayer insulating film 31a and is connected to the gate interconnect 40. Also according to this example, the emitter pad can be formed as a single large continuous film. The configuration, operation, and effect of this example other than the foregoing are the same as those of the first example described above.

Next, a seventh example of this embodiment is described.

Figure 27:
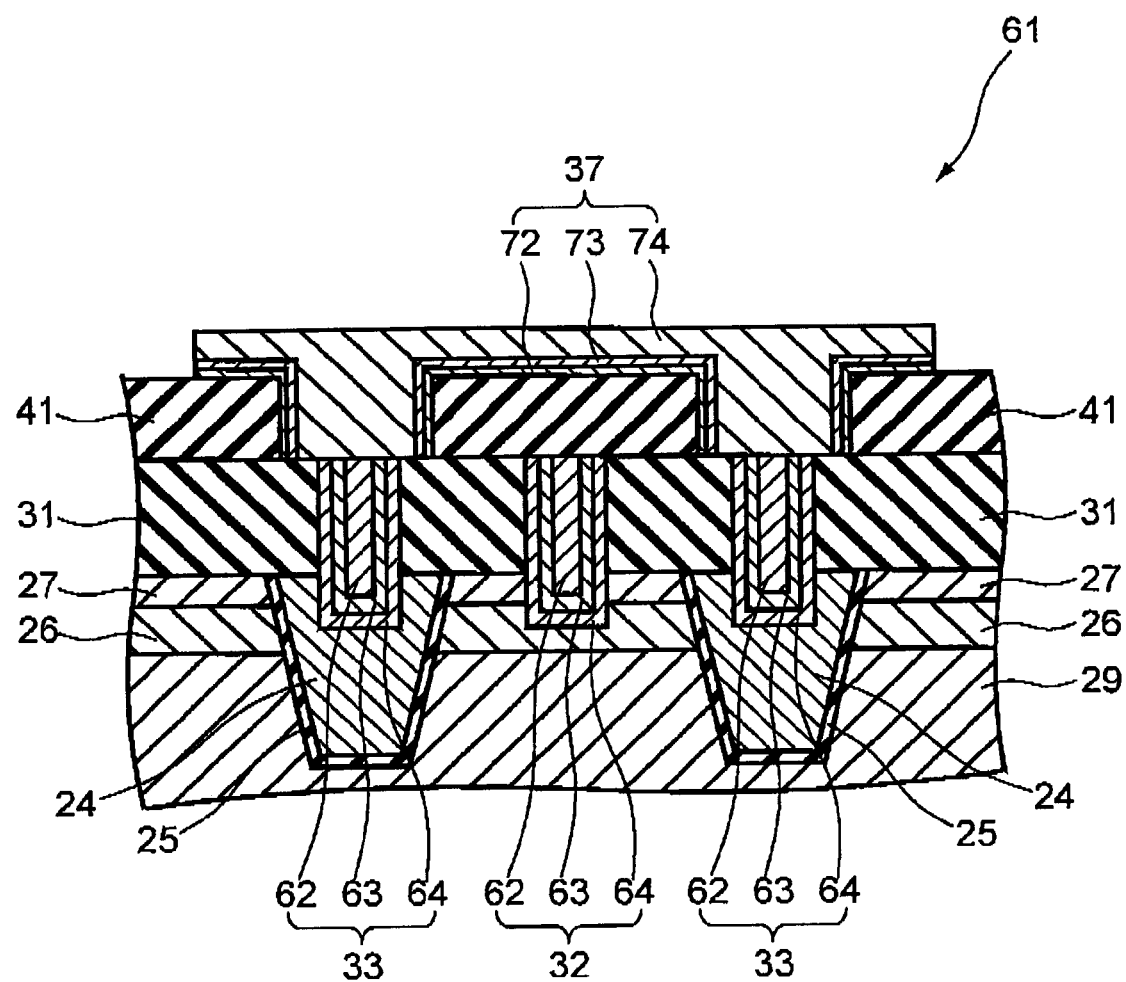
FIG. 27 is a cross-sectional view illustrating an IGBT according to a seventh example of the first embodiment.

FIG. 27 is a cross-sectional view illustrating an IGBT according to this example.

FIG. 27 shows only the central region, i.e. active area, of the IGBT. The configuration of the peripheral region of the IGBT according to this example is the same as that of the first example described above.

In the IGBT 61 according to this example, each of the emitter plug 32 and the gate plug 33 has a multilayer structure. More specifically, the emitter plug 32 includes a core member 62, which constitutes the core of the emitter plug 32 and is primarily responsible for electrical conduction in the emitter plug 32. The core member 62 is illustratively made of tungsten (W). The emitter plug 32 further includes a barrier layer 63 covering the core member 62. The barrier layer 63 is illustratively made of titanium nitride (TiN).

The emitter plug 32 further includes a reaction layer 64 illustratively made of titanium silicide ($TiSi_2$) covering the barrier layer 63. The reaction layer 64 forms junctions with the N-type layer 27 and the P-type layer 26. Thus the emitter plug 32 has a three-layer structure composed of, sequentially from inside, a core member 62 made of tungsten, a barrier layer 63 made of titanium nitride, and a reaction layer 64 made of titanium silicide. Likewise, the gate plug 33 also has a three-layer structure composed of a core member 62, a barrier layer 63, and a reaction layer 64, where the reaction layer 64 forms a junction with the gate electrode 24.

The emitter plug 32 is connected to the N-type layer 27 (N-source) not at its bottom face but at its side face. As viewed in the extending direction of the emitter plug 32, the region of each side face of the emitter plug 32 in contact with the N-type layer 27 has a length of 0.5 times or more the width of the emitter plug 32. For example, when the emitter plug 32 has a width of 0.3 microns, the region of each side face of the emitter plug 32 in contact with the N-type layer 27 has a length of 0.15 microns or more.

The thickness of the reaction layer 64 is more than 2.5 nanometers and not more than 0.25 times the width of the emitter plug 32. Likewise, also in the gate plug 33, the thickness of the reaction layer 64 is more than 2.5 nanometers and not more than 0.25 times the width of the gate plug 33.

In the IGBT 61 according to this example, the interlayer insulating film 31 has a thickness of e.g. 1.4 to 1.5 microns. The portion of the emitter plug 32 and the gate plug 33 (hereinafter also collectively and simply referred to as "plug") buried in the silicon layer 22 has a height of 0.5 to 0.6 microns. Thus the total height of each plug is 1.9 to 2.1 microns. As described above, the plug has a width of e.g. 0.3 microns. Thus the plug has an aspect ratio of e.g. about 6 to 7. The lower limit of this aspect ratio is determined by the minimum film thickness of the interlayer insulating film 31 and the minimum of the above contact length between the emitter plug 32 and the N-type layer 27. The upper limit is determined by the manufacturing limit of the plug. In view of these factors, the plug (emitter plug 32 and gate plug 33) preferably has an aspect ratio of e.g. 5 to 10. The configuration of this example other than the foregoing is the same as that of the first example described above.

Next, a method for manufacturing an IGBT according to this example is described.

FIGS. 28 to 32 are cross-sectional views illustrating a method for manufacturing an IGBT according to this example. FIGS. 28 to 32 show only the central region of the IGBT. The following description focuses on a method for manufacturing the central region of the IGBT. Also in the method for manufacturing an IGBT according to this example, as in the first example described above, the peripheral region is also formed in conjunction with the central region. The forming state of the peripheral region in each step is the same as that in the first example described above.

Figure 28:
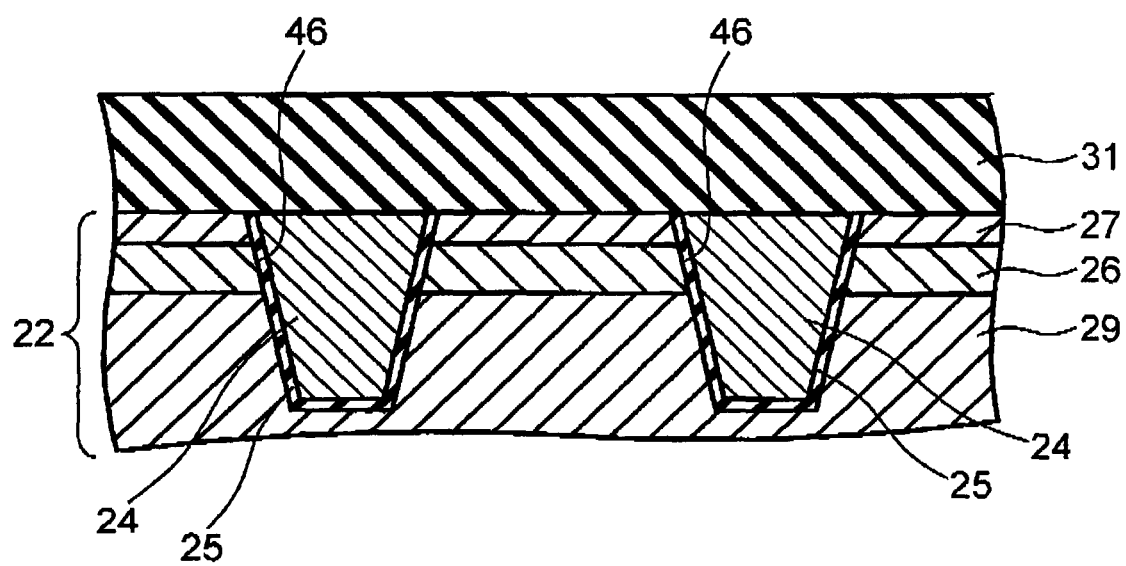
FIGS. 28 to 32 are cross-sectional views illustrating a method for manufacturing an IGBT according to this example.

As shown in FIG. 28, as in the first example described above, diffusion layers such as a P-type layer 26 and an N-type layer 27 are formed in the upper portion of the silicon layer 22. A P-type layer (not shown) serving as a collector layer is formed in the lower portion of the silicon layer 22. A trench groove 46 is formed in the upper face of the silicon layer 22. A gate insulating film 25 made of silicon oxide and a gate electrode 24 made of polysilicon are formed inside the trench groove 46. Next, silicon oxide film is grown on the silicon layer 22 by the CVD (Chemical Vapor Deposition) technique to form an interlayer insulating film 31 made of silicon oxide. The interlayer insulating film 31 has a film thickness of e.g. 1.4 to 1.5 microns.

Figure 29:
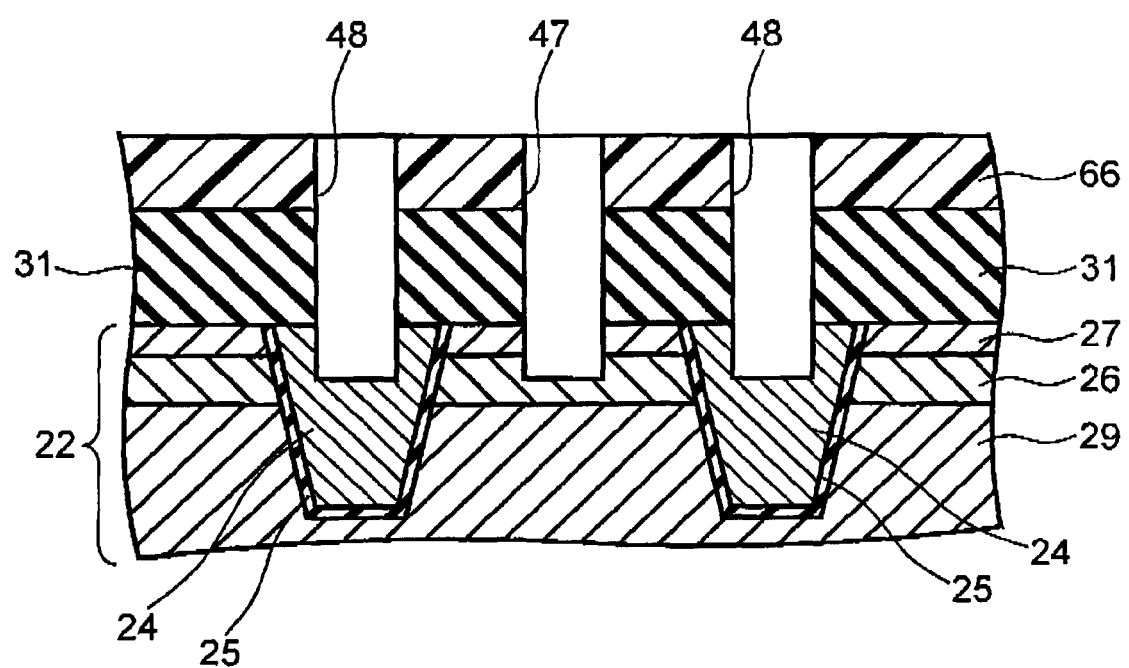

Next, as shown in FIG. 29, a photoresist 66 is applied onto the interlayer insulating film 31. The photoresist 66 is exposed through a mask and developed to form openings at the center of the directly overlying region of the gate electrode 24 and at the center of the region between the gate electrodes 24, i.e. at the center of the mesa. Here, the opening is shaped like a stripe extending in one direction and has a width of e.g. 0.3 microns. Next, the patterned photoresist 66 is used as a mask to selectively remove the interlayer insulating film 31 by dry etching. Thus trench grooves 47 and 48 are formed in the interlayer insulating film 31.

Next, the photoresist 66 is removed, and the interlayer insulating film 31 is used as a mask to selectively remove the silicon layer 22 and the gate electrode 24 by dry etching. Thus the trench grooves 47 and 48 are elongated into the silicon layer 22 and the gate electrode 24, respectively. Here, the trench groove 47 is configured to penetrate the N-type layer 27 and reach the P-type layer 26. The vertical length (height) of the region of the side face of the trench groove 47 in which the N-type layer 27 is exposed is half or more of the width of the trench groove 47. For example, when the trench groove 47 has a width of 0.3 microns, the exposed region of the N-type layer 27 has a height of 0.15 microns or more, e.g. 0.5 microns. Here, the depth of the trench groove 48 is generally equal to the depth of the trench groove 47.

Figure 30:
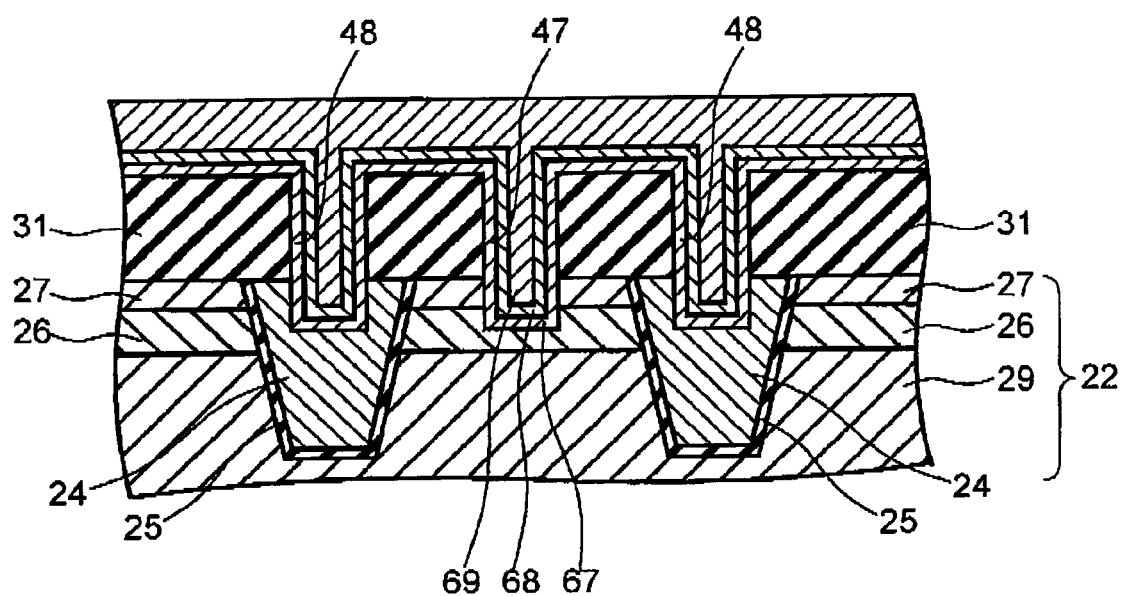

Next, as shown in FIG. 30, titanium (Ti) and titanium nitride (TiN) are continuously deposited by the CVD technique. When titanium is deposited, for example, $TiCl_4$ gas and $H_2$ gas are used as raw material gas, and the substrate temperature is 550° C. or more. The deposited amount of titanium is thicker than 1 nanometer and not more than 0.1 times the width of the trench groove 47, e.g. 10 nanometers. The term "deposited amount" used herein refers to the equivalent film thickness of a uniform continuous film that would be formed from the deposited material.

Thus, with titanium deposited on the substrate, the titanium reacts with silicon (Si) in the silicon layer 22, the gate electrode 24, and the interlayer insulating film 31 to form titanium silicide ($TiSi_2$). Consequently, a titanium silicide layer 67 is formed on the inner face of the trench grooves 47 and 48 and on the interlayer insulating film 31, and forms a junction with the N-type layer 27 and the P-type layer 26, or with the gate electrode 24. Here, the volume of titanium silicide is about 2.5 times the volume of titanium. Therefore the film thickness of the titanium silicide layer 67 is more than 2.5 nanometers and not more than 0.25 times the width of the trench groove 47, e.g. 25 nanometers.

Then, subsequent to titanium, titanium nitride is deposited to form a titanium nitride layer 68. The titanium nitride layer 68 serves to prevent oxidation of the titanium silicide layer 67 and has a film thickness of e.g. 5 nanometers.

Next, a tungsten (W) layer 69 is formed on the titanium nitride layer 68 by the CVD technique. Here, the titanium nitride layer 68 serves as a seed metal, and the tungsten layer 69 is grown by columnar grain crystallization.

Figure 31:
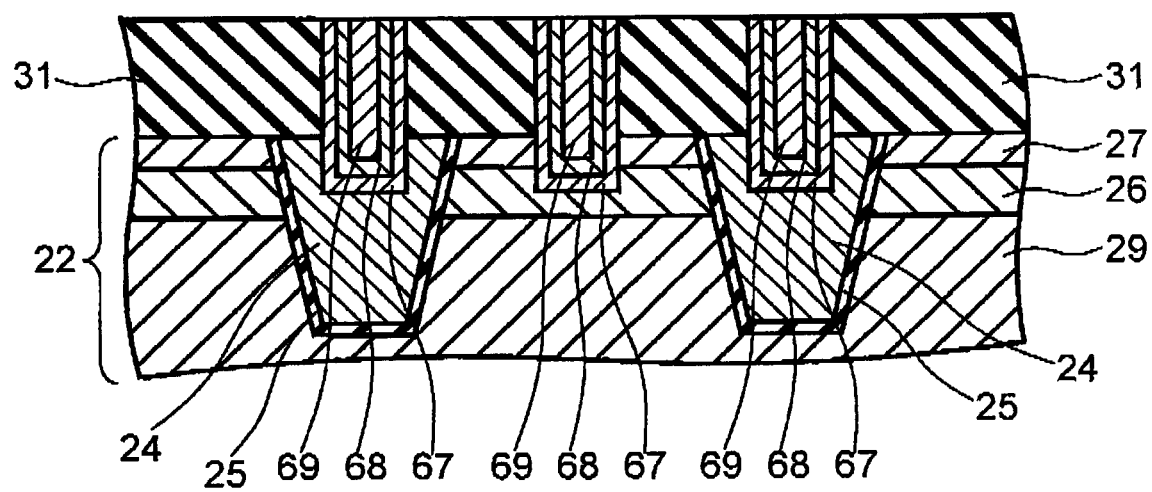

Next, as shown in FIG. 31, the tungsten layer 69, the titanium nitride layer 68, and the titanium silicide layer 67 are polished by the CMP (Chemical Mechanical Polishing) technique to remove the portion formed in the region other than the inside of the trench grooves 47 and 48. Thus the titanium silicide layer 67 remaining in the trench grooves 47 and 48 becomes the reaction layer 64, the titanium nitride layer 68 becomes the barrier layer 63, and the tungsten layer 69 becomes the core member 62. Consequently, an emitter plug 32 composed of the core member 62, the barrier layer 63, and the reaction layer 64 is formed in the trench groove 47, and a gate plug 33 composed of the core member 62, the barrier layer 63, and the reaction layer 64 is formed in the trench groove 48. The reaction layer 64 of the emitter plug 32 forms a junction with the N-type layer 27 and the P-type layer 26. The reaction layer 64 of the gate plug 33 forms a junction with the gate electrode 24.

Figure 32:
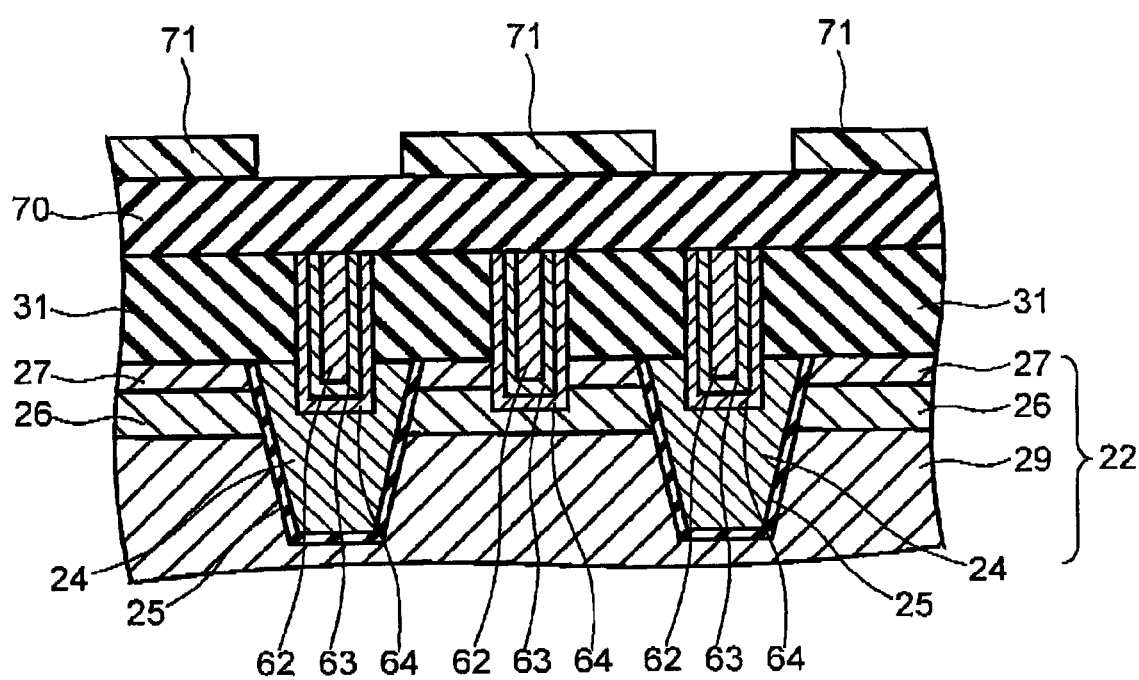

Next, as shown in FIG. 32, a silicon oxide film 70 is grown on the interlayer insulating film 31 by the CVD technique. The silicon oxide film 70 has a film thickness of e.g. 300 nanometers. Next, a photoresist 71 is applied onto the silicon oxide film 70. The photoresist 71 is exposed and developed to form openings separated from each other partially in the directly overlying region of the emitter plug 32 and partially in the directly overlying region of the gate plug 33.

Next, as shown in FIG. 27, the photoresist 71 (see FIG. 32) is used as a mask to form openings in the silicon oxide film 70 by dry etching, where the emitter plug 32 and the gate plug 33 are exposed. Then the photoresist 71 is removed.

Next, a titanium layer 72 and a titanium nitride layer 73 are grown by sputtering to form a barrier metal composed of the titanium layer 72 and the titanium nitride layer 73. This barrier metal has a film thickness of e.g. 25 nanometers. Subsequently, aluminum (Al) is deposited by sputtering to form an aluminum layer 74. The aluminum layer 74 has a film thickness of e.g. 2 microns.

Next, a photoresist (not shown) is formed on the aluminum layer 74. This photoresist is patterned by exposure and development. The patterned photoresist is used as a mask to perform dry etching, thereby patterning the aluminum layer 74, the titanium nitride layer 73, and the titanium layer 72. Thus a gate pad 37, an emitter pad (not shown), and a field plate (not shown) are formed. Consequently, an IGBT 61 according to this example is fabricated. In the method for manufacturing an IGBT according to this example, the configuration other than the foregoing is the same as that of the first example described above.

Next, the ground for numerical limitations in this example is described.

Length of the region of the side face of the emitter plug 32 in contact with the N-type layer 27 (third semiconductor layer) as viewed in the extending direction of the emitter plug 32 (first direction): 0.5 times or more the width of the emitter plug 32

In this example, the emitter plug 32 extends in one direction like a stripe. Hence the contact area between the emitter plug 32 and the N-type layer 27 serving as an N-source can be represented by the contact length between the emitter plug and the N-type layer as viewed in the extending direction of the emitter plug. Because the emitter plug 32 is in contact with the N-type layer 27 not at its bottom face but at its side face, the advantageous effect of increasing the contact area cannot be achieved unless the total contact length on both sides of the emitter plug is not less than the length of the bottom face of the emitter plug. Therefore as viewed in the extending direction of the emitter plug, the region on one side of the emitter plug in contact with the N-type layer preferably has a length of 0.5 times or more the width of the emitter plug.

The length of this region has no upper limit in particular. However, increase of this length entails a deep emitter plug, which is difficult to form. Thus, from the viewpoint of formation stability of the emitter plug, the length of this region is preferably 10 times or less the width of the emitter plug.

Deposited amount of titanium: More than 1 nanometer and not more than 0.1 times the width of the trench groove FIG. 33 is a graph showing the effect of the deposited amount of titanium caused on the device sheet resistance in this example, where the horizontal axis represents the deposited amount of titanium, and the vertical axis represents the device sheet resistance.

Figure 34A:
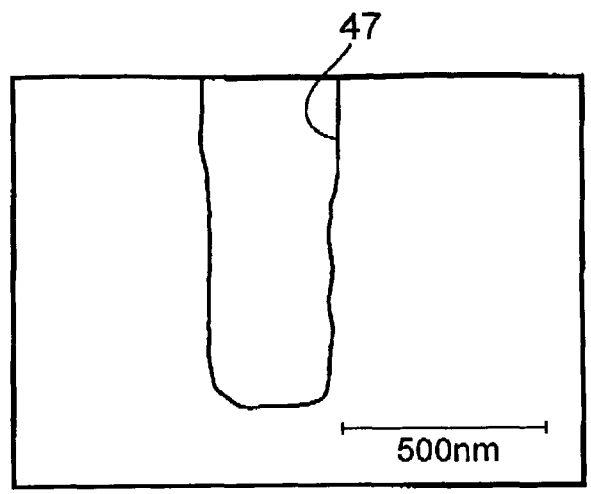
FIGS. 34A to 34C are linear drawings, each traced from a SEM photograph of a sample where titanium is deposited on the inner face of a trench groove and reacted with silicon.
Figure 34B:
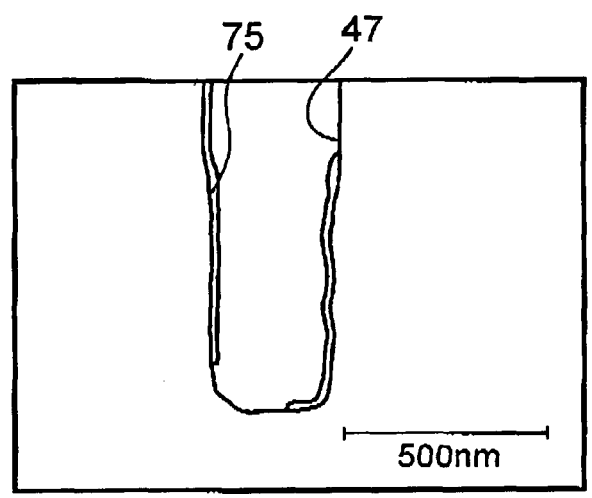
Figure 34C:
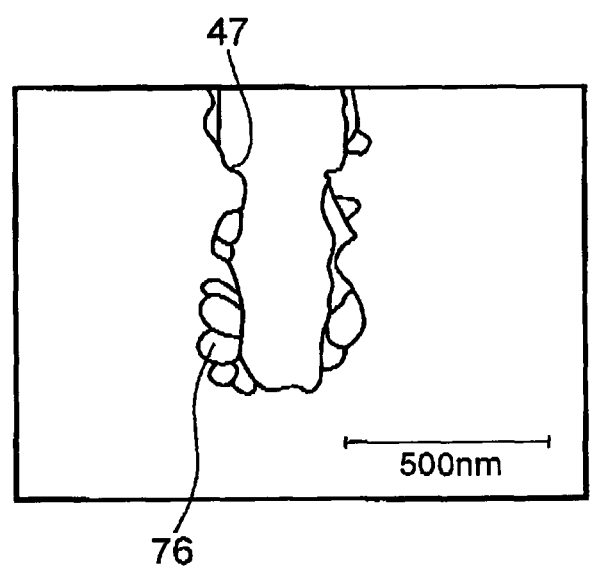

FIGS. 34A to 34C are linear drawings, each traced from a SEM (Scanning Electron Microscope) photograph of a sample where titanium is deposited on the inner face of a trench groove and reacted with silicon. FIG. 34A shows a sample with the deposited amount of titanium being 1 nanometer. FIG. 34B shows a sample with the deposited amount of titanium being 10 nanometers. FIG. 34C shows a sample with the deposited amount of titanium being 50 nanometers.

Figure 33:
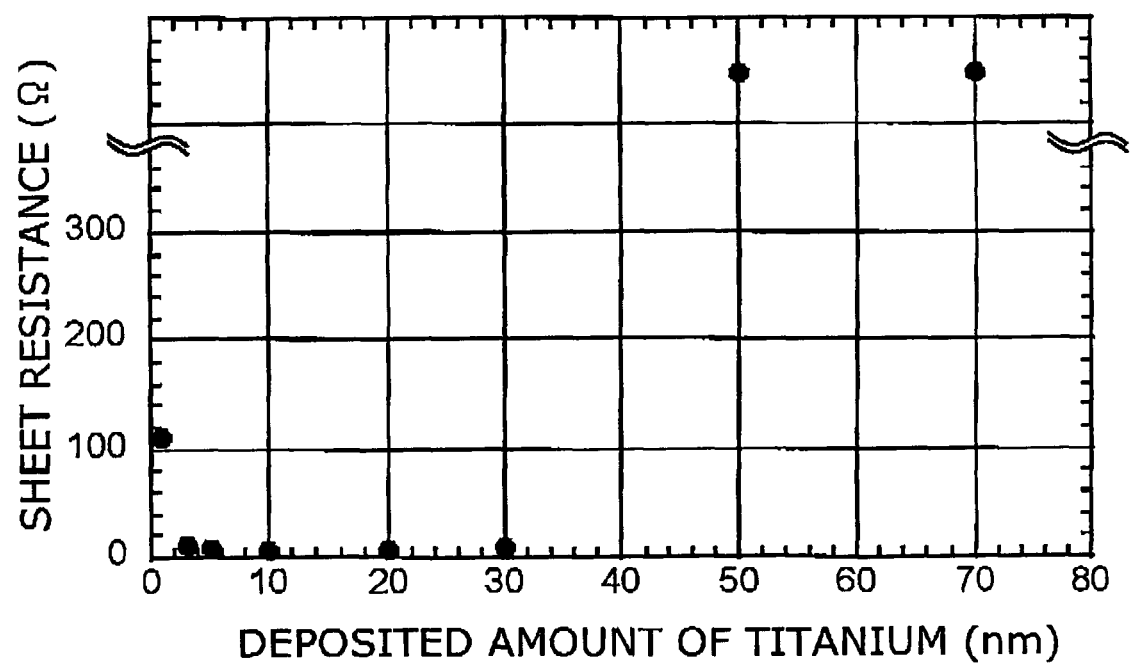
FIG. 33 is a graph showing the effect of the deposited amount of titanium caused on the device sheet resistance in this example, where the horizontal axis represents the deposited amount of titanium, and the vertical axis represents the device sheet resistance.

The IGBT shown in FIGS. 33 and 34 in its characteristics and shape is an IGBT having the configuration shown in FIG. 27 where the width of the trench groove is 0.3 microns and the contact depth is 0.5 microns. In FIG. 33, the deposited amount of titanium is 1, 3, 5, 10, 20, 30, 50, and 70 nanometers. The deposited amount of titanium nitride is kept constant at 5 nanometers.

As shown in FIG. 33, when the deposited amount of titanium is 1 nanometer, the device sheet resistance exhibits a high value exceeding 100Ω. However, when the deposited amount of titanium is more than 1 nanometer, the sheet resistance rapidly decreases to a low value of 10Ω or less. When the deposited amount of titanium is within the range of more than 1 nanometer and not more than 30 nanometers, which corresponds to 0.1 times the width of the trench groove (300 nanometers), the sheet resistance stably exhibits a low value. However, when the deposited amount of titanium is 50 nanometers or more, the sheet resistance has a high value exceeding the measurement range.

The reason for this is described in the following. Titanium is deposited on the inner face of the trench groove formed in the silicon layer. At temperatures of 400° C. or higher, the titanium undergoes alloying reaction with silicon in the silicon layer to form titanium silicide ($TiSi_2$). Typically, natural oxide film exists on the surface of silicon. When titanium is silicidized, its volume expands by a factor of 2.5 and destroys the natural oxide film of silicon. Thus titanium silicide is reliably connected to the silicon layer. Consequently, the emitter plug formed later is reliably connected to the silicon layer.

However, when the deposited amount of titanium is 1 nanometer or less, the absolute amount of titanium is insufficient to stably form titanium silicide, and hence the emitter plug cannot be reliably connected to the silicon layer. For example, as shown in FIG. 34A, when the deposited amount of titanium is 1 nanometer, continuous titanium silicide film is not observed on the inner face of the trench groove 47. Conceivable reasons for this include the possibility that natural oxide film of silicon inhibits the reaction between titanium and silicon, and the possibility that the surface of titanium is already oxidized. In fact, TEM (Transmission Electron Microscope) observation at large magnification reveals titanium silicide film partially produced on the inner face of the trench groove. However, no titanium silicide film is produced at the bottom and the corners of the trench groove.

In contrast, when the deposited amount of titanium is within the range of more than 1 nanometer and not more than 30 nanometers, which corresponds to 0.1 times the width of the emitter plug, continuous titanium silicide film is formed stably. Thus the emitter plug is reliably connected to the silicon layer. For example, as shown in FIG. 34B, when the deposited amount of titanium is 10 nanometer, a thin titanium silicide film 75 is observed on the inner face of the trench groove 47. In FIG. 34B, as a matter of convenience for preparing the sample, there is a portion where the titanium silicide film 75 is not observed. However, the titanium silicide film 75 is formed entirely on the inner face of the trench groove 47.

On the other hand, when the deposited amount of titanium is too much, an excessive amount of titanium silicide is produced. Then bulky crystals of titanium silicide are grown and form irregularities on the inner face of the trench groove. This disturbs the subsequent burying of tungsten and increases the sheet resistance. For example, as shown in FIG. 34C, when the deposited amount of titanium is 50 nanometers, bulky crystal grains 76 of titanium silicide are observed. If the trench groove has a sufficiently large width, it can be filled with tungsten irrespective of some irregularities on the inner face of the trench groove. Thus the upper limit of the deposited amount of titanium depends on the width of the trench groove. The upper limit of the deposited amount of titanium is one tenth of the width of the trench groove.

For the above reasons, it is preferable that, when the emitter plug is formed, the deposited amount of titanium be more than 1 nanometer and not more than 0.1 times the width of the trench groove. Reliability increases when the deposited amount of titanium is 3 nanometers or more. Furthermore, when titanium reacts with silicon to produce titanium silicide, the volume increases by a factor of 2.5. Thus a preferable range of the thickness of the titanium silicide layer, i.e. reaction layer, is more than 2.5 nanometers and not more than 2.5 times the width of the emitter plug. This also applies to the gate plug.

Next, the effect of this example is described.

In this example, the emitter plug and the gate plug are buried in the silicon layer and the gate electrode, respectively. Thus the resistance between the emitter plug and the silicon layer and the resistance between the gate plug and the gate electrode can be reduced.

Figure 35:
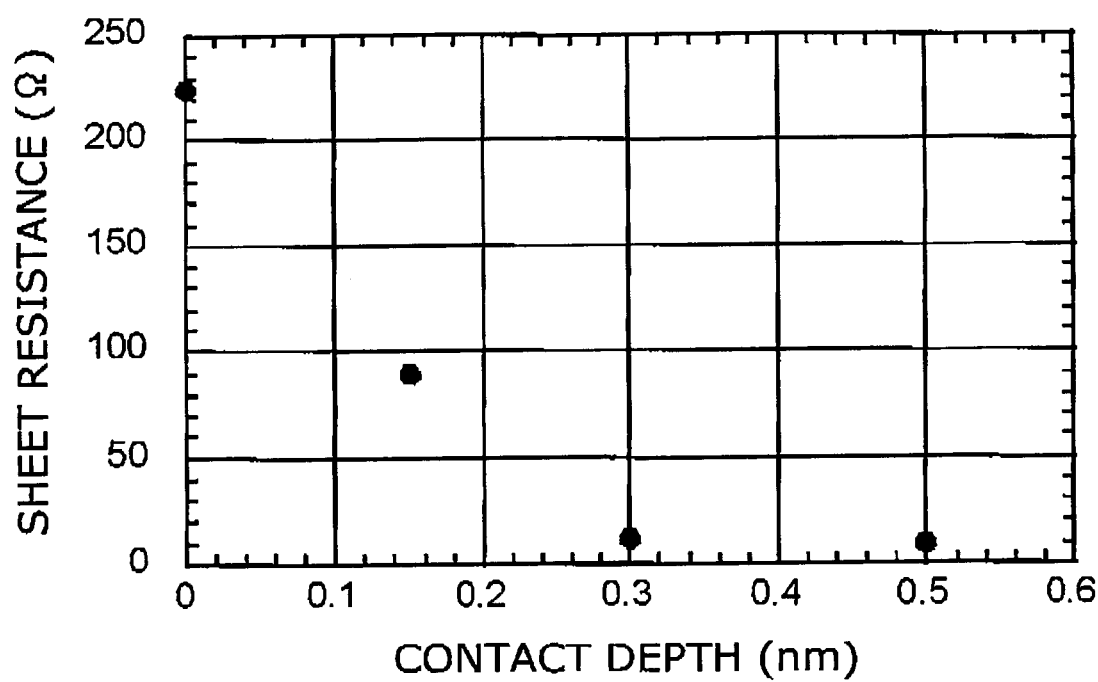
FIG. 35 is a graph showing the effect of the contact depth on the sheet resistance, where the horizontal axis represents the depth of the portion of an emitter plug buried in a silicon layer (contact depth), and the vertical axis represents the device sheet resistance.

FIG. 35 is a graph showing the effect of the contact depth on the sheet resistance, where the horizontal axis represents the depth of the portion of an emitter plug buried in a silicon layer (hereinafter also referred to as "contact depth"), and the vertical axis represents the device sheet resistance.

As shown in FIG. 35, when the contact depth is zero, that is, when the emitter plug is not buried in the silicon layer and is in contact with the silicon layer only at its bottom face, the sheet resistance is relatively high. As the contact depth increases from this condition, the contact area between the side face of the emitter plug and the N-type layer increases, and the sheet resistance decreases. If the emitter plug penetrates the N-type layer, the contact area stops increasing irrespective of further increase of the contact depth, and hence the sheet resistance stops decreasing. Thus, when the region of each side face of the emitter plug 32 in contact with the N-type layer 27 has a length of 0.5 times or more the width of the emitter plug 32 as viewed in the extending direction of the emitter plug 32, the resistance between the emitter plug and the silicon layer can be reduced relative to the case where the emitter plug is not buried in the silicon layer.

Furthermore, in this example, when the emitter plug and the gate plug are formed, titanium is deposited on the inner face of the trench groove, and the titanium is allowed to react with silicon contained in the silicon layer and the gate electrode, thereby producing a reaction layer. Thus the emitter plug can be reliably connected to the silicon layer, and the gate plug can be reliably connected to the gate electrode. Here, if the deposited amount of titanium is more than 1 nanometer and not more than 0.1 times the width of the emitter plug, then a uniform reaction layer can be formed, and good connection condition can be achieved.

Furthermore, in this example, the deposition of titanium is immediately followed by the deposition of titanium nitride to form a barrier layer. This can prevent the oxidation of titanium, and prevent the silicidation of titanium from being inhibited. Furthermore, the subsequently deposited tungsten can be grown with good adhesiveness.

Furthermore, in this example, titanium, titanium nitride, and tungsten are deposited by the CVD technique. Thus these materials can be reliably deposited on the inner face of the trench groove. On the contrary, if these materials are deposited by a deposition technique with high rectilinearity such as sputtering, they are deposited preferentially in the vicinity of the entrance rather than the inside of the trench groove. In fact, this does not cause a serious problem in forming the conventional devices, which are not so downscaled, because the trench groove has a large width. However, as the aspect ratio of the trench groove increases with device downscaling, it is extremely difficult to grow materials on the inner face of the trench groove.

Figure 36:
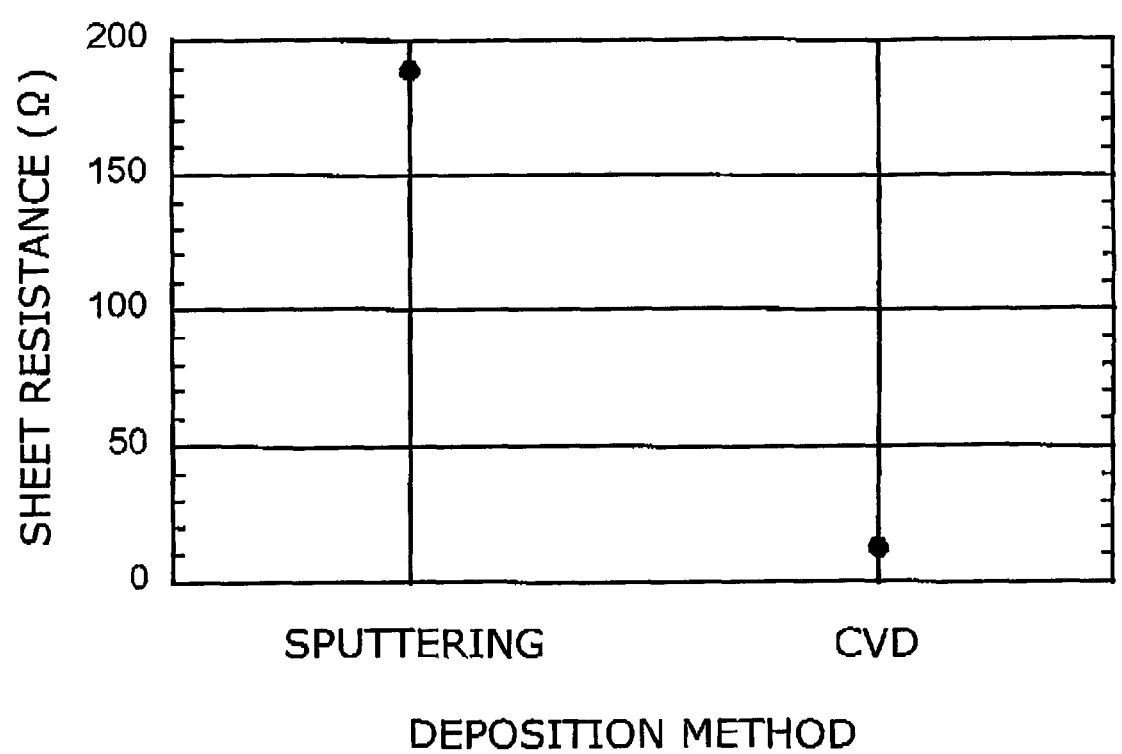
FIG. 36 is a graph showing the effect of the deposition method on the connection condition of a plug in an IGBT according to this example, where the horizontal axis represents the deposition method for titanium, titanium nitride, and tungsten, and the vertical axis represents the device sheet resistance.

FIG. 36 is a graph showing the effect of the deposition method on the connection condition of a plug in an IGBT according to this example, where the horizontal axis represents the deposition method for titanium, titanium nitride, and tungsten, and the vertical axis represents the device sheet resistance.

The IGBT shown in FIG. 36 in its characteristics is an IGBT having the configuration shown in FIG. 27 where the width of the trench groove is 0.3 microns and the contact depth is 0.5 microns.

As shown in FIG. 36, when titanium or the like is deposited by sputtering, it is impossible to deposit a titanium film on the side face of the trench groove, and the device sheet resistance has an extremely high value of 100Ω or more. In contrast, when titanium or the like is deposited by the CVD technique, a continuous titanium film can be deposited on the side face of the trench groove, and the device sheet resistance can be reduced to a low value of about 15Ω.

Thus, according to this example, an emitter plug is buried in the silicon layer. The contact length (contact depth) between each side face of the emitter plug and the N-type layer 27 (N-source) is 0.5 times or more the width of the emitter plug. When the emitter plug is formed, titanium is deposited on the inner face of the trench groove by the CVD technique to form a reaction layer made of titanium silicide. The deposited amount of titanium is more than 1 nanometer and not more than 0.1 times the width of the trench groove. Then titanium nitride and tungsten are deposited by the CVD technique. Thus the resistance between the emitter plug and the N-type layer can be reduced. Hence the IGBT can be downscaled, and the reduction of voltage in the conducting state of the device (hereinafter referred to as "ON voltage") is made compatible with the reduction of electric power loss at the time of switching (hereinafter referred to as "switching loss").

In this example, titanium, titanium nitride, and tungsten are deposited on the inner face of the trench groove to form a reaction layer made of titanium silicide, a barrier layer made of titanium nitride, and a core member made of tungsten. However, the invention is not limited thereto.

More specifically, the material deposited first after the trench groove is formed may be any material if the material can be deposited by CVD and is reactive with materials contained in the semiconductor layer and the gate electrode, and if the products of this reaction has a certain electrical conductivity. In this example, the semiconductor layer is a silicon layer, and the gate electrode is made of polysilicon. Hence the material may be any metal or alloy reactive with silicon. For example, the material may be a transition metal such as cobalt (Co), nickel (Ni), tantalum (Ta), or vanadium (V), besides titanium. These materials are silicidized to form a reaction layer containing silicon.

The material forming the barrier layer may be any material that can prevent the oxidation of the reaction layer, that has a certain electrical conductivity, and on which the core member is grown with good adhesiveness.

Furthermore, the material forming the core member is also not limited to tungsten, but may be any material having higher electrical conductivity than the material forming the gate electrode (polysilicon in this example). However, preferably, it is a material soft enough to be planarized by CMP after deposition. For example, besides tungsten, copper (Cu) can also be used.

In this example, when titanium is deposited by CVD, the substrate temperature is 550° C. or more to react the deposited titanium with silicon to form a reaction layer made of titanium silicide. However, the invention is not limited thereto. For example, titanium may be deposited to form a titanium film by setting the substrate temperature to a temperature at which titanium does not react with silicon, e.g. a temperature of 450° C. or less. Then, by heating the titanium film in a nitrogen atmosphere at a temperature of 550° C. for 90 minutes, the titanium film can be silicidized to form a reaction layer.

Furthermore, in this example, the trench groove has a width of 0.3 microns. However, the width is not limited thereto. The configuration of the device is also not limited to the configuration shown in FIG. 27. For example, the interlayer insulating film 31 and the insulating film 41 may be made of TEOS. Furthermore, the method for manufacturing the device is also not limited to the method shown in FIGS. 28 to 32.

Next, an eighth example of this embodiment is described.

Figure 37:
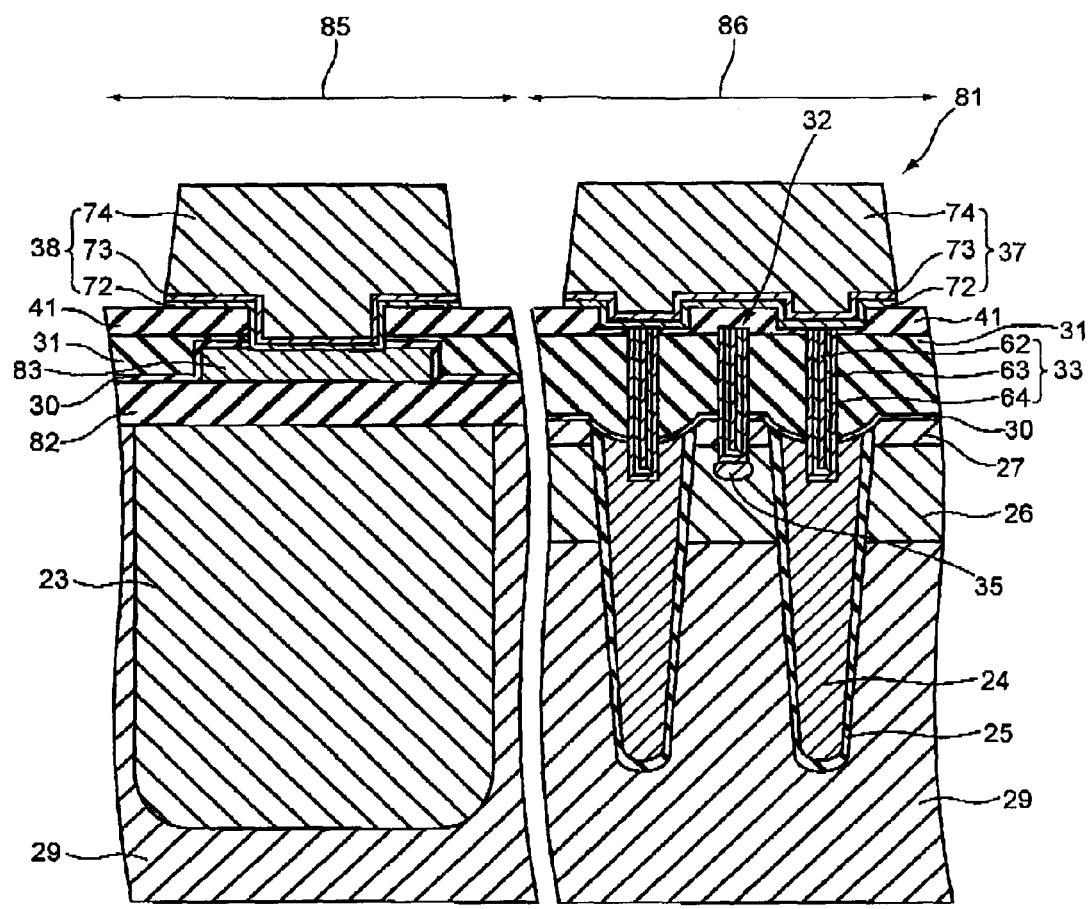
FIG. 37 is a cross-sectional view illustrating an IGBT according to an eighth example of the first embodiment.

FIG. 37 is a cross-sectional view illustrating an IGBT according to this example. FIG. 37 shows both the central region and the peripheral region of the IGBT.

As shown in FIG. 37, the IGBT 81 according to this example includes, in the peripheral region 85, a guard ring insulating film 82 made of silicon oxide ($SiO_2$) on the silicon layer 22. The guard ring insulating film 82 covers the P-type layer 23 constituting the guard ring. A diode 83 is provided on the guard ring insulating film 82. The diode 83 is made of polysilicon where a P-type region and an N-type region (not shown) are separately formed so as to be adjacent to each other. Temperature variation in the diode 83 varies its resistance, and hence the diode 83 functions as a temperature detection unit. Furthermore, the guard ring insulating film 82 and the diode 83 are covered with the interlayer insulating film 31 made of TEOS and the insulating film 41 made of TEOS. Moreover, the upper face of the diode 83 is connected to the field plate 38. The gate pad 37 and the field plate 38 are formed from a lamination of the titanium layer 72, the titanium nitride layer 73, and the aluminum layer 74.

By way of example, the guard ring insulating film 82 has a thickness of 0.7 microns, the diode 83 has a thickness of 0.5 microns, and the portion of the interlayer insulating film 31 located above the diode 83 has a thickness of 0.2 microns. Hence this part has a total thickness of 1.4 microns. Furthermore, as shown in FIG. 37, the thickness of the interlayer insulating film 31 in the central region 86 is equal to the total thickness of the guard ring insulating film 82 and the interlayer insulating film 31 in the peripheral region 85. Hence, in the central region 86, the portion of the emitter plug 32 and the gate plug 33 (plug) buried in the interlayer insulating film 31 has a height of 1.4 microns. On the other hand, the height of the portion of the plug buried in the silicon layer 22 and the gate electrode 24 (contact depth) is e.g. 0.5 to 0.6 microns. Hence the entire plug has a height of e.g. 1.9 to 2.0 microns.

Thus, in the IGBT including a diode 83 in the peripheral region 85, the thickness of the interlayer insulating film 31 needs to be not less than a certain thickness. In association therewith, the height of the plug is not less than a certain height. On the other hand, in order that reduction of ON voltage may be compatible with the reduction of switching loss, the device needs to be downscaled. Thus such devices entail plugs with a high aspect ratio, and are difficult to manufacture by conventional techniques. However, according to this example, as described above, plugs with a high aspect ratio can be stably formed. Hence a downscaled IGBT having a temperature detection unit can be manufactured. The configuration, operation, and effect of this example other than the foregoing are the same as those of the first example described above.

Next, a ninth example of this embodiment is described.

Figure 38:
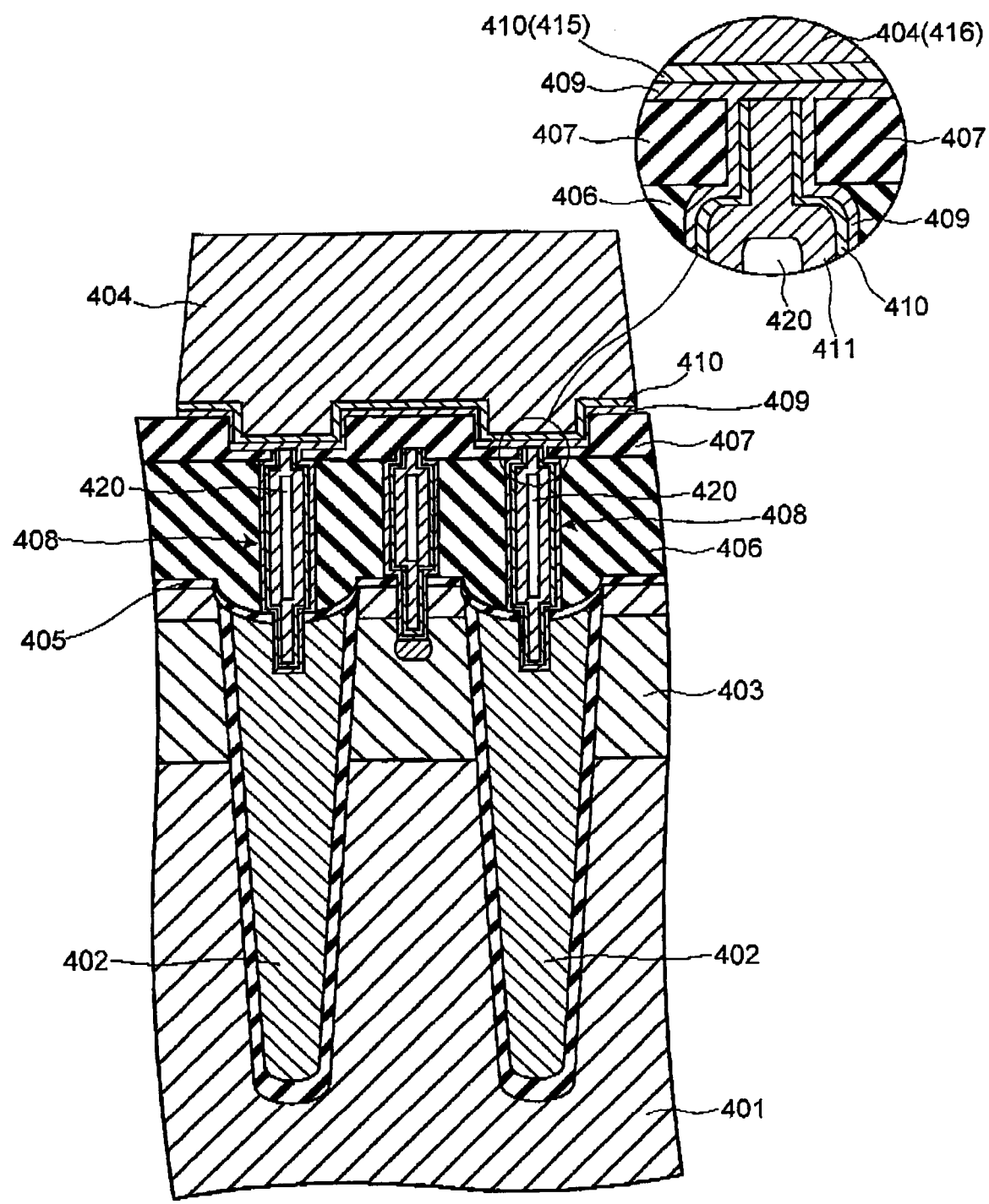
FIG. 38 is a cross-sectional view illustrating an IGBT according to a ninth example of the first embodiment.

FIG. 38 is a cross-sectional view illustrating an IGBT according to this example. FIG. 38 schematically shows the contact portion of this device in the inset.

As shown in FIG. 38, the IGBT 400 according to this example includes a silicon single crystal substrate 401. A plurality of trench gate electrodes 402 are provided in the surface of the silicon single crystal substrate 401. The portion between adjacent trench gate electrodes 402 is a mesa 403 where a current flows. The trench gate electrodes 402 and mesas 403 are separated from an overlayer electrode interconnect 404 by an undoped interlayer insulating film 405 (buffer insulating film), a doped interlayer insulating film 406, and an undoped interlayer insulating film 407 (cap insulating film). The interlayer insulating films 405, 406, and 407 include contact lines 408 for connecting the overlayer electrode interconnect 404 to the trench gate electrode 402 or the mesa 403. In the contact line 408, a contacting metal (Ti) 409, a barrier metal (TiN) 410, and a buried contact metal (W) 411 linked to the overlayer interconnect 404 are laminated in this order from outside. A void 420 is formed in the buried contact metal 411, i.e. in the vicinity of the center of the contact line 408.

Next, a method for manufacturing an IGBT according to this example is described.

FIGS. 39 to 45 are process cross-sectional views illustrating a method for manufacturing an IGBT according to this example.

Figure 39:
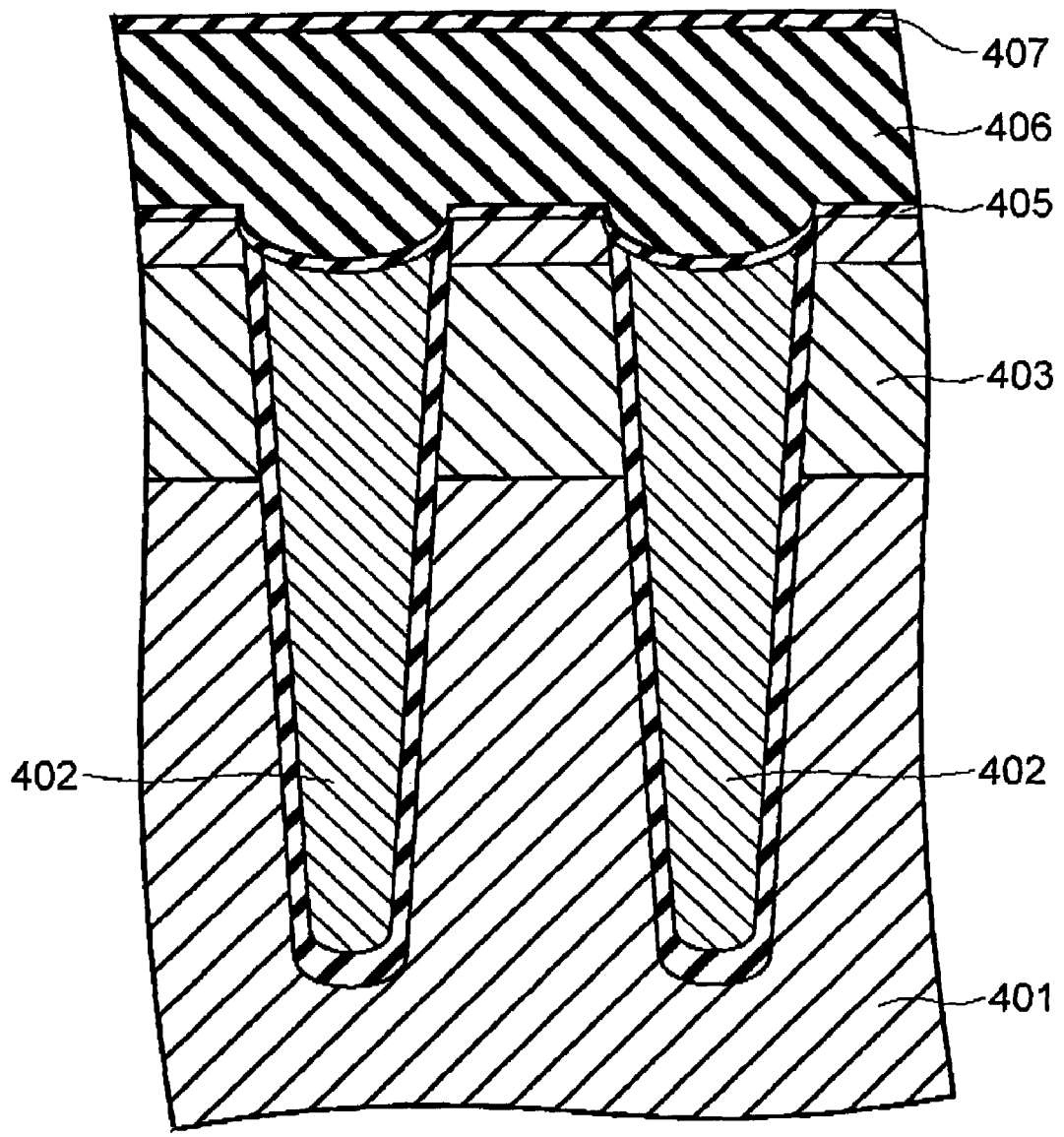
FIGS. 39 to 45 are process cross-sectional views illustrating a method for manufacturing an IGBT according to the ninth example.

First, as shown in FIG. 39, a trench gate electrode 402 is formed in the upper face of the silicon single crystal substrate 401. Then a first interlayer insulating film 405 (buffer insulating film) made of silicon oxide is formed by thermal oxidation. The interlayer insulating film 405 has a thickness of e.g. 50 nanometers. Subsequently, a second interlayer insulating film 406 made of BPSG (Boron Phosphorus doped Silicon Glass) and having a thickness of e.g. 1.2 microns is deposited by the CVD (Chemical Vapor Deposition) technique. Furthermore, a third interlayer insulating film 407 (cap film) made of TEOS (Tetra Ethoxy Silicon) and having a thickness of e.g. 0.3 microns is deposited by the CVD technique.

Figure 40:
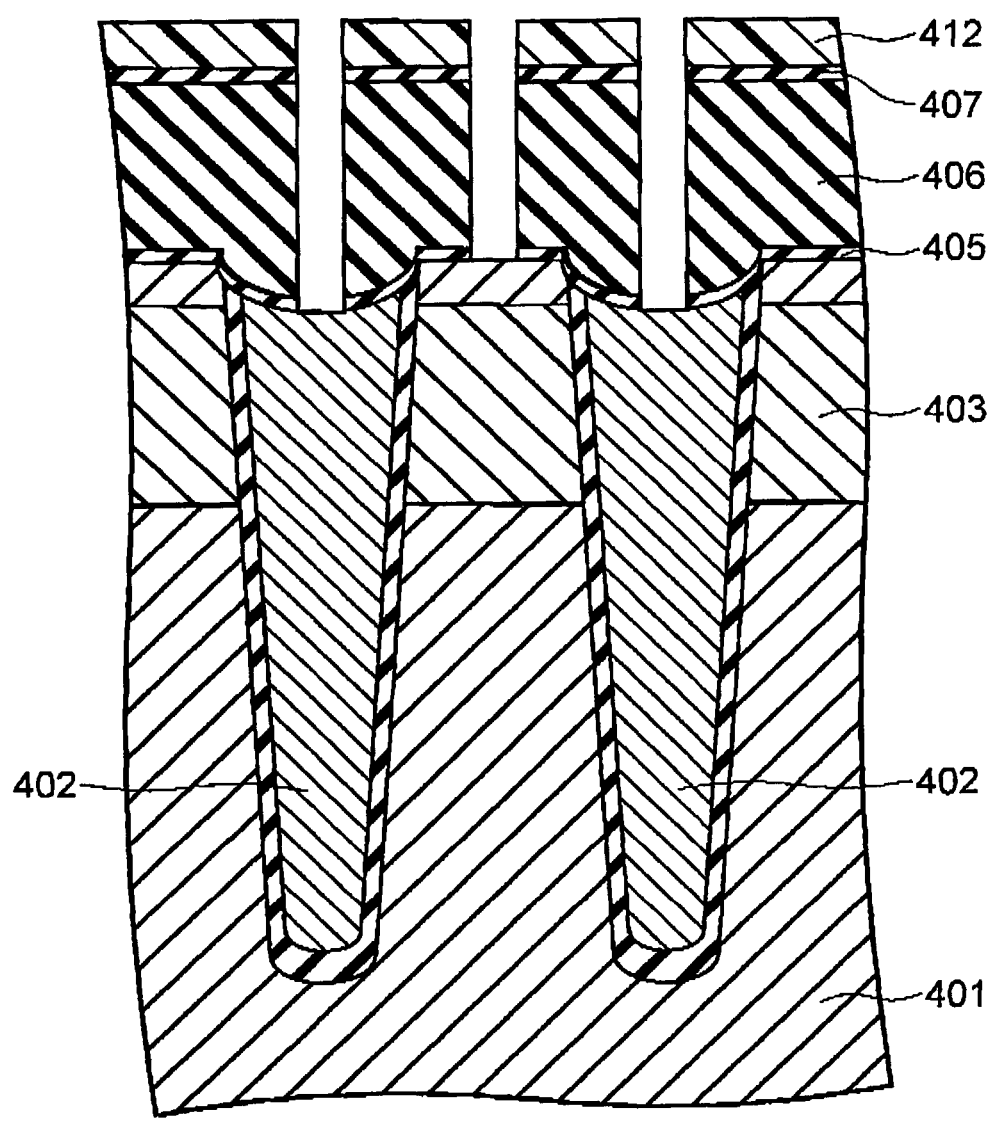

Next, as shown in FIG. 40, a photoresist 412 is applied onto the interlayer insulating film 407 and exposed so as to form openings in the regions which are to be a trench gate electrode 402 and a mesa 403. Here, the opening width is e.g. 0.3 microns. Next, the photoresist 412 is used as a mask to perform dry etching from the opening to the surface of the silicon single crystal substrate 401, thereby simultaneously etching the interlayer insulating films 405, 406, and 407. Subsequently, after the photoresist 412 is peeled off, the interlayer insulating film 407 is used as a mask to dry etch the silicon substrate 401 and the trench gate electrode 402 to a depth of ½ or more of the opening width of 0.3 microns. This is intended for obtaining a surface area of twice or more the surface area of the contact line 408 in the case where the silicon substrate 401 and the trench gate electrode 402 are not etched. In this example, the etching amount is 0.5 microns.

Figure 41:
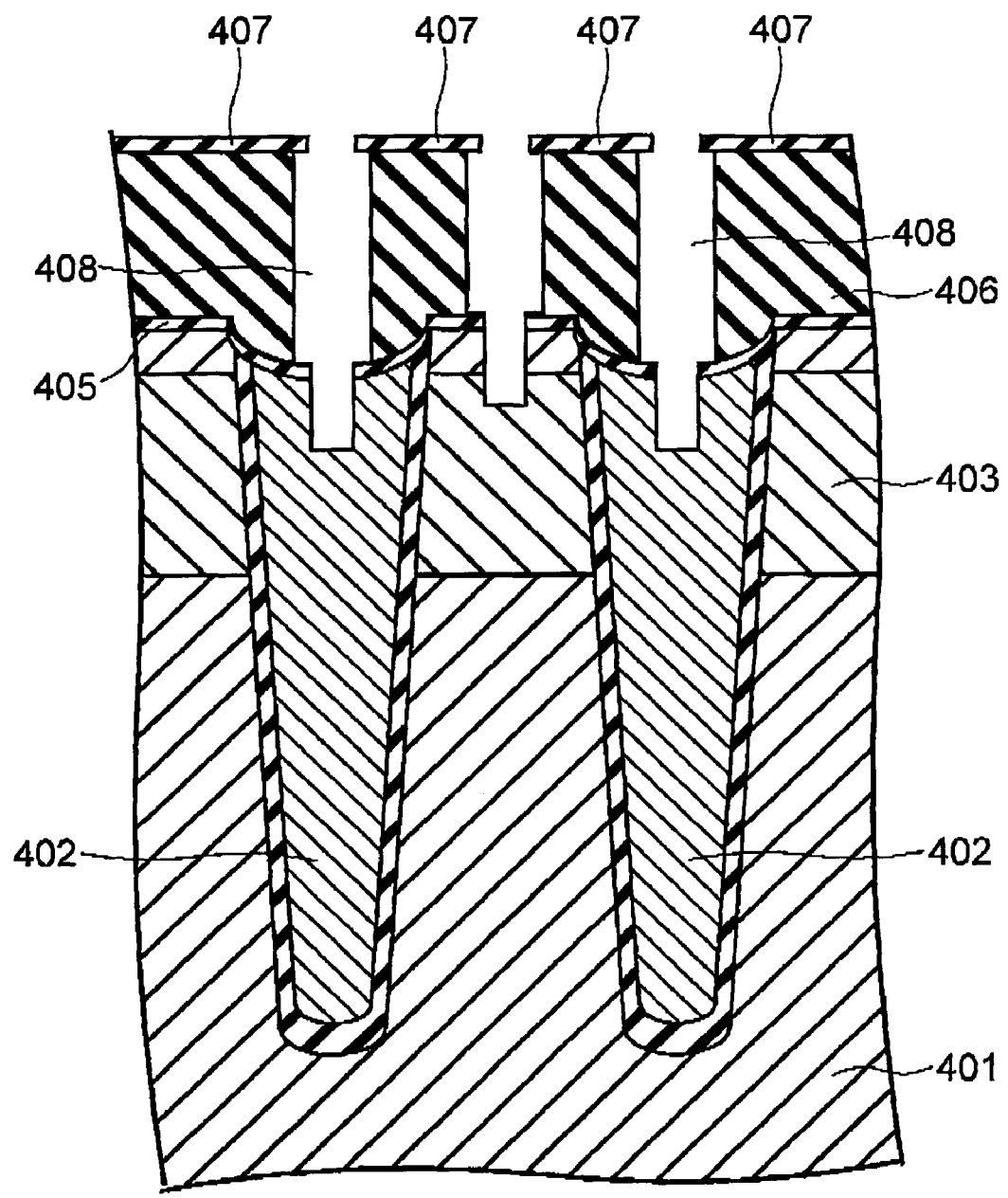

Subsequently, as shown in FIG. 41, cleaning is performed for the purpose of removing reaction products of the dry etching. In this example, treatment with hydrofluoric acid diluted to 1:200 is performed for a treatment time equivalent to an abrasion amount of 10 nanometers in thermal oxide film. Thus the retreat amount is about 10 nanometers in the undoped interlayer insulating film 405 (buffer insulating film) and the interlayer insulating film 407 (cap film). However, the doped interlayer insulating film 406 made of BPSG is retreated about 30 nanometers because the abrasion rate in chemical etching increases by the doped amount. Hence the contact line 408 is finished with bowing, where it is thin at the frontage and the bottom face and thick at the center.

Figure 42:
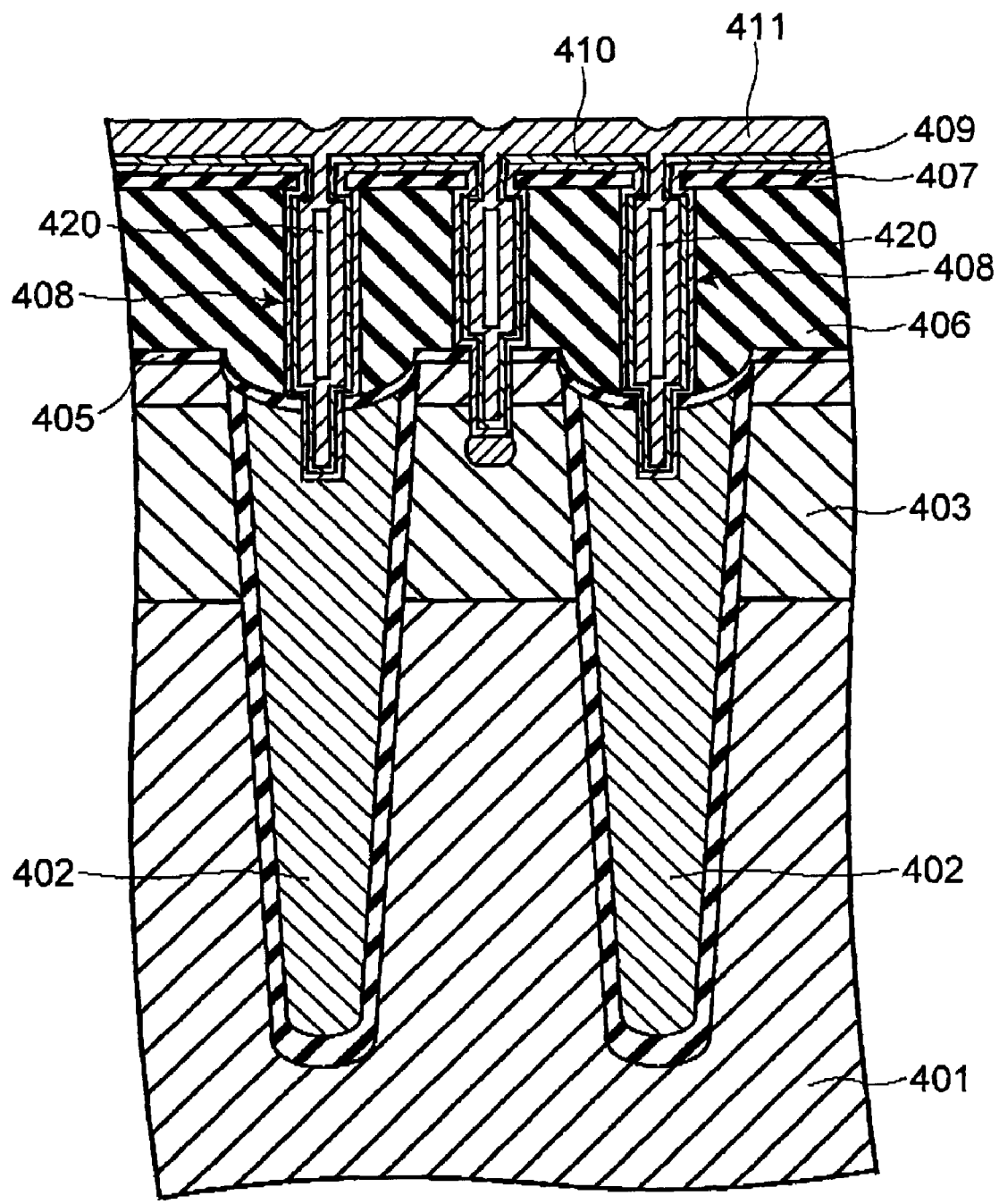

Subsequently, as shown in FIG. 42, in the contact line 408, a contact metal Ti (titanium) 409 and a barrier metal (oxidation-resistant film for titanium) TiN (titanium nitride) 410 are continuously deposited by the CVD technique. Here, the film thickness of Ti (titanium) 409 is not less than 1/100 and not more than 1/10 of the contact opening width, i.e. 0.3 microns. For example, the film thickness of Ti (titanium) 409 is 10 nanometers. TiN (titanium nitride) 410 is deposited 5 nanometers. Furthermore, the substrate temperature during deposition is illustratively 650° C. Thus Ti (titanium) 409 reacts with silicon to form $TiSi_2$ (titanium silicide).

Subsequently, W (tungsten) 411 is deposited by the CVD technique. Here, the TiN (titanium nitride) 410 serves as a seed metal, and W (tungsten) 411 is grown and deposited by columnar grain crystallization. At this time, the second interlayer insulating film 406 between the first interlayer insulating film 405 (buffer insulating film) and the third interlayer insulating film 407 (cap insulating film) has a bowing shape (fat in the middle). Hence the contact opening of the third interlayer insulating film 407 (cap insulating film) is first clogged with W (tungsten) 411 to form a void (cavity) 420 in W (tungsten) 411 buried in the second interlayer insulating film 406. Thus, inside the contact line 408, Ti 409, TiN 410, and W 411 are laminated in this order from outside. On the interlayer insulating film 407, Ti 409, TiN 410, and W 411 are laminated in this order from the underlayer side. Ti 409 in the contact line 408 continues to Ti 409 above the interlayer insulating film 407, TiN 410 in the contact line 408 continues to TiN 410 above the interlayer insulating film 407, and W 411 in the contact line 408 continues to W 411 above the interlayer insulating film 407.

Figure 43:
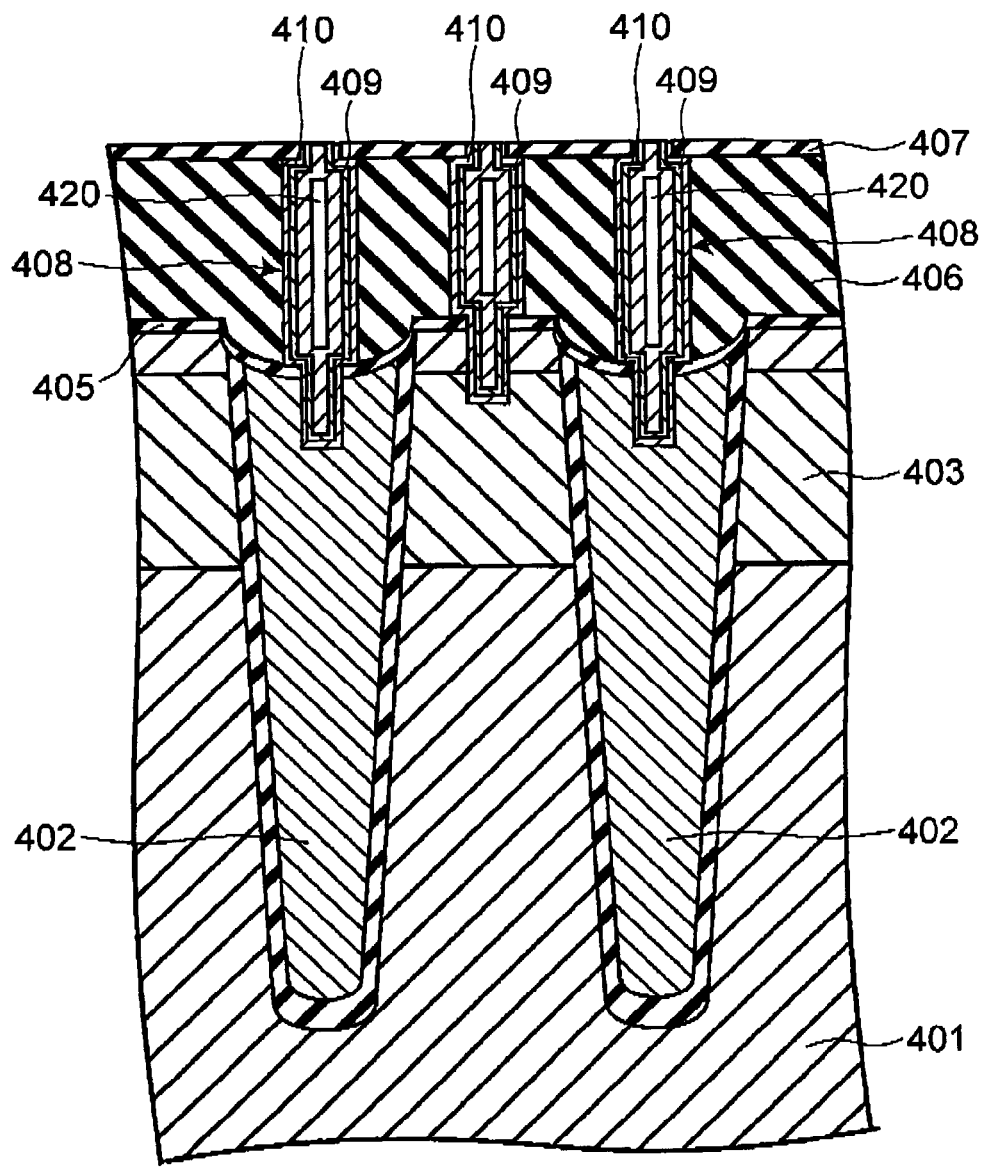

Then, as shown in FIG. 43, W (tungsten) 411 is polished by the CMP (Chemical Mechanical Polishing) technique so as to remove Ti (titanium) 409, TiN (titanium nitride) 410, and W (tungsten) 411 deposited outside the contact opening, thereby planarizing the surface.

Figure 44:
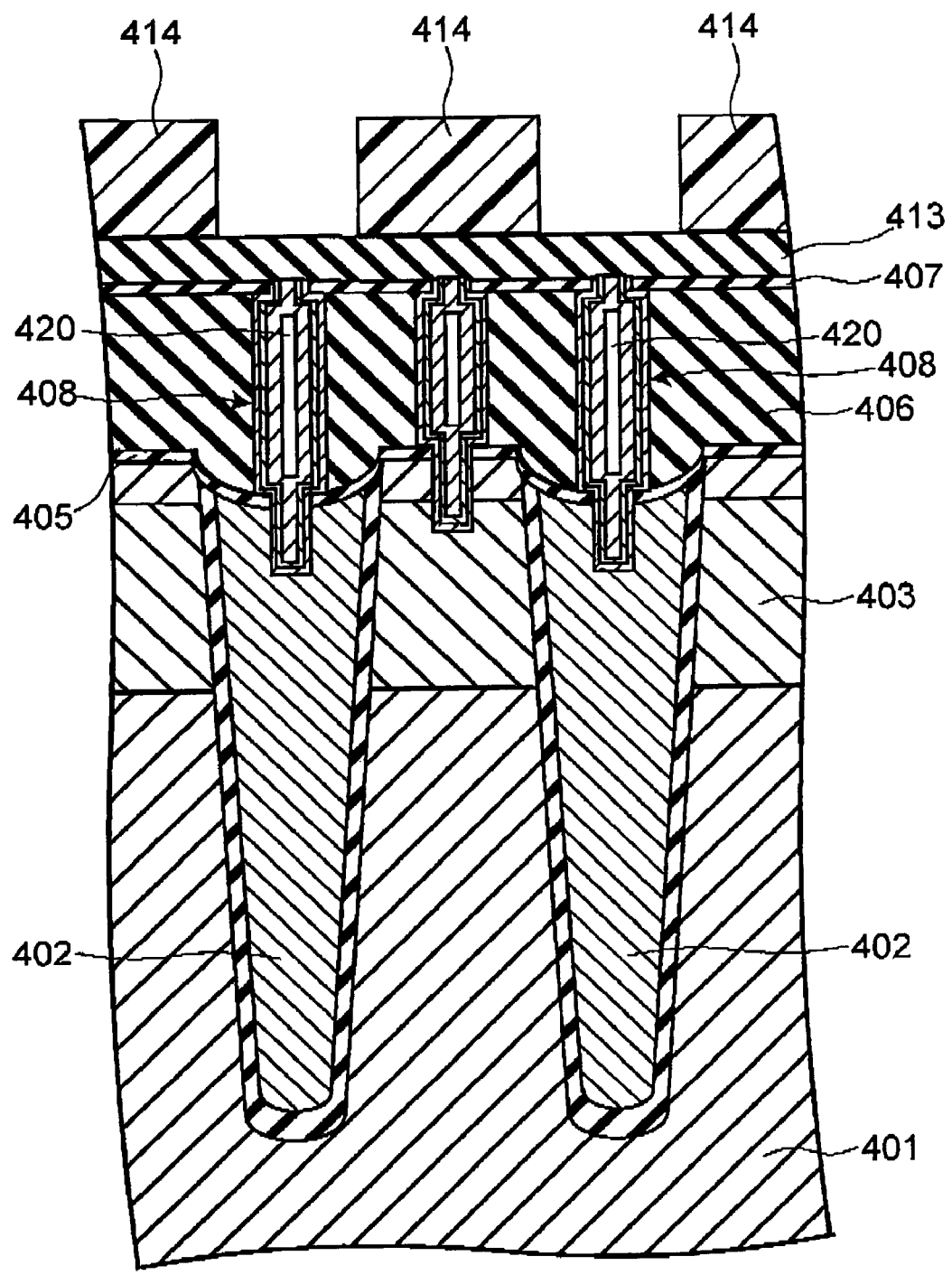

Then, as shown in FIG. 44, a silicon oxide film 413 is deposited by the CVD technique. The silicon oxide film 413 has a film thickness of e.g. 300 nanometers. Furthermore, a photoresist 414 is applied, and exposed to form openings so that the contact of the trench gate electrode and the contact of the mesa are separated from each other. The figures of this example show only the contact of the gate electrode. The opening of the mesa contact is separated therefrom in the direction perpendicular to the page.

Figure 45:
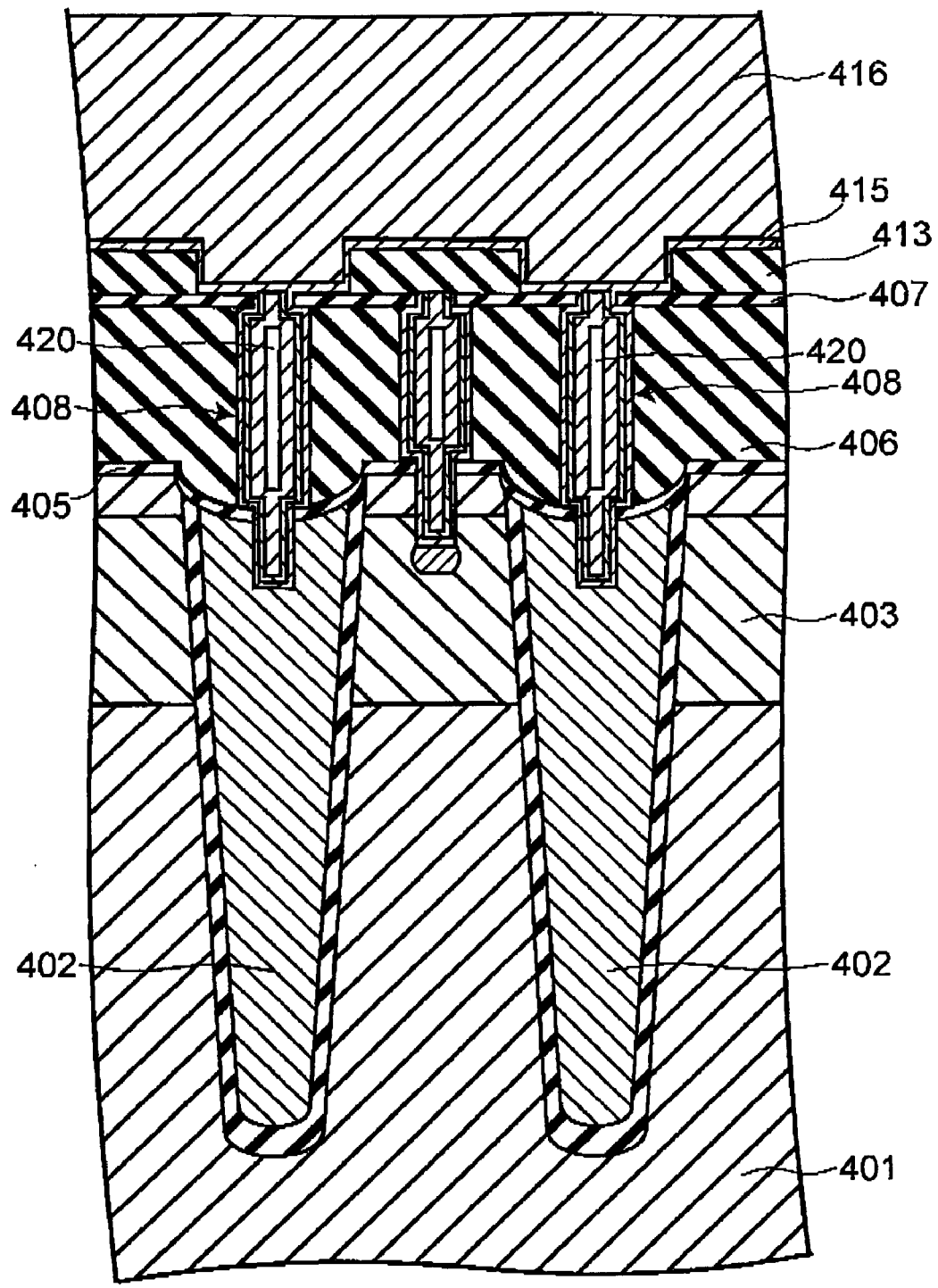

Subsequently, as shown in FIG. 45, the photoresist 414 (see FIG. 44) is used as a mask to dry etch the silicon oxide film 413 until the contact surface (the surface of W (tungsten) 411) is exposed. Subsequently, after the photoresist 414 is peeled off, a barrier metal 415 serving as an interconnect electrode and Al (aluminum) 416 serving as an electrode are deposited by sputtering. In this example, the barrier metal 415 has a three-layer structure composed of a Ti (titanium) layer, a TiN (titanium nitride) layer, and a Ti (titanium) layer, each having a film thickness of 20 nanometers. The electrode Al (aluminum) 416 has a film thickness of 2 microns. Subsequently, the overlayer Al (aluminum) 416 is patterned with a photoresist and dry etched to remove unnecessary electrode interconnect.

The amount of warpage of a sample thus fabricated was evaluated.

Figure 46:
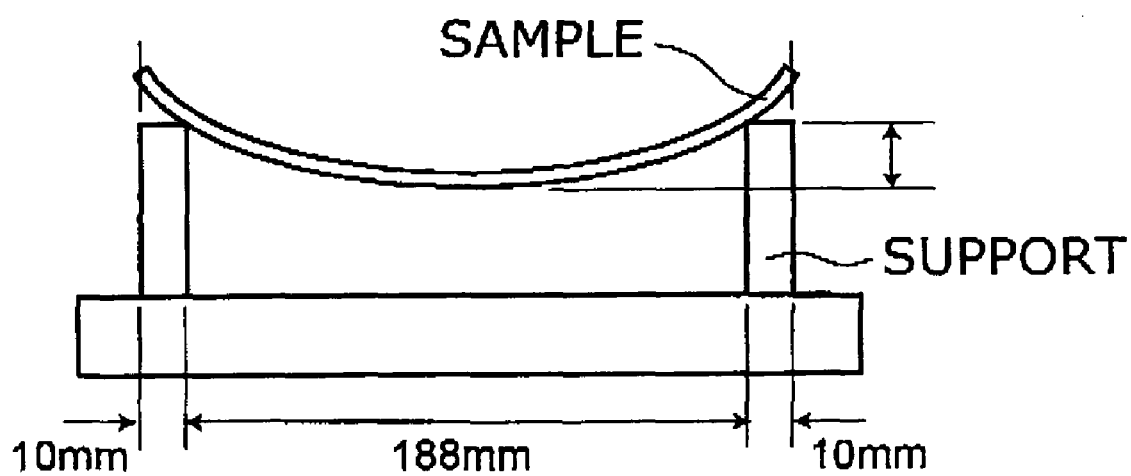
FIG. 46 shows a method for evaluating the amount of warpage in the ninth example.

FIG. 46 shows a method for evaluating the amount of warpage.

A silicon wafer (725 microns thick) having a diameter of 200 millimeters fabricated by the above method (sample A) was thinned by polishing from the backside to a thickness of 200 microns. Then, as shown in FIG. 46, the position of 10 millimeters from the wafer edge was placed on a support, and the amount of wafer warpage from the support was measured. As a result, with regard to wafers in this example, the average amount of warpage for 10 samples (n equals to 10) was 2.2 millimeters.

By way of comparison, 10 samples were prepared for each of a silicon wafer with no device fabricated thereon (sample B) and a wafer having a structure in which the interlayer insulating films in this example were formed of only the third interlayer insulating film 408 (cap insulating film) and no void (cavity) was formed in the buried metal W (tungsten) 411 (sample C). The samples were polished from the wafer backside to 200 μm thick. The amount of wafer warpage was measured like sample A.

As a result, the amount of warpage of the silicon wafer with no device fabricated thereon (sample B) was about 1.5 millimeters. It turned out that this was the amount of warpage due to the self weight of the wafer. On the other hand, the amount of warpage of the wafer having a structure with no void (cavity) formed therein (sample C) was about 20 millimeters, and hence it turned out that the amount of wafer warpage was obviously large. The foregoing results are summarized in TABLE 1.

TABLE 1

| | Wafer warpage (in mm) | | |
|---|---|---|---|
| | Sample A (this example) | Sample B (no device fabrication) | Sample C (no void) |
| Thinned after device fabrication | 2.2 | 1.5 | 20.0 |
| Thinned before electrode formation | 1.8 | 1.5 | 1.8 |

One of the factors of the above result is the increase of the wafer self weight due to the increased mass of W (tungsten) because no void (cavity) is formed. In addition, a possibility is considered that the void (cavity) produced in the W (tungsten) plug induces stress relief.

In this context, before depositing Al (aluminum) 416, which is the overlayer electrode interconnect having the largest stress, the wafer was thinned by polishing to a thickness of 200 microns, and the amount of wafer warpage was measured in this condition. As a result, the amount of warpage in the wafer having a void (cavity) according to the structure of this example (sample A) was about 1.8 mm. On the other hand, the wafer having a structure with no void (cavity) (sample C) was also about 1.8 mm. It turns out from this result that the stress in the overlayer electrode interconnect Al (aluminum) 416 is relieved by the void formed in the plug.

Next, a tenth example of this embodiment is described.

Figure 47:
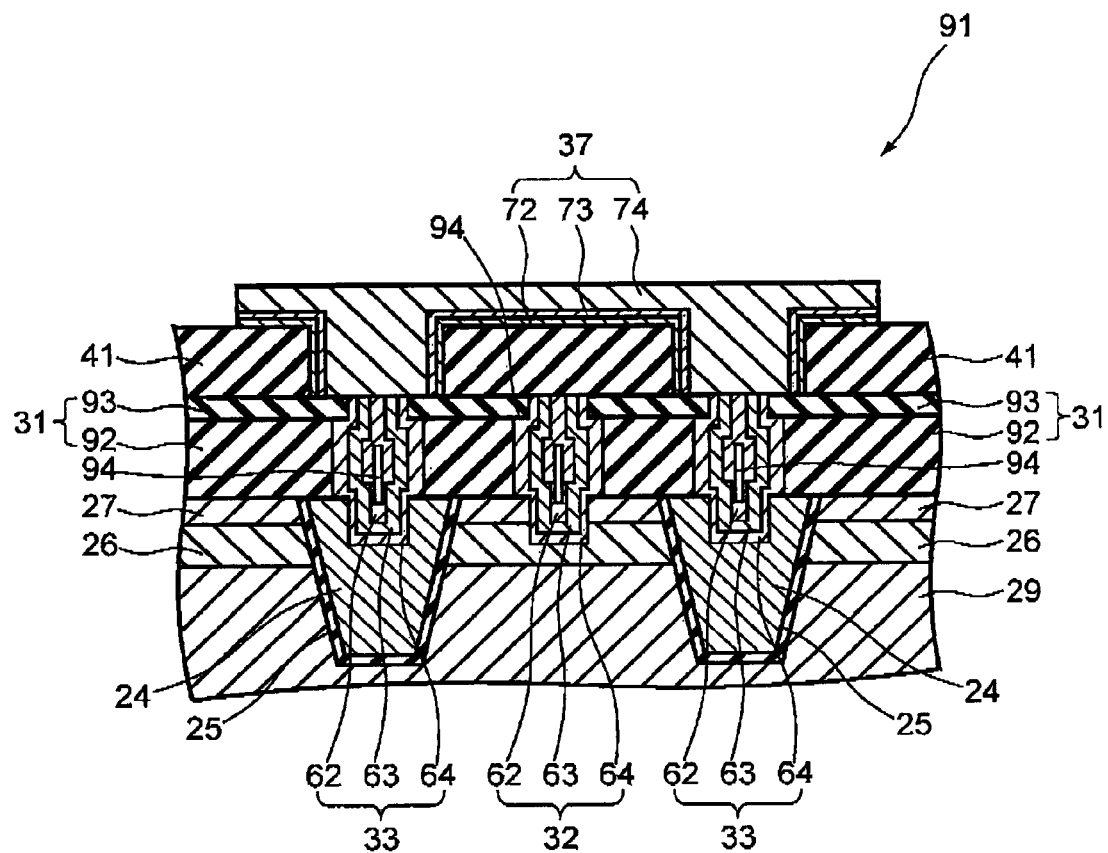
FIG. 47 is a cross-sectional view illustrating an IGBT according to a tenth example of the first embodiment.

FIG. 47 is a cross-sectional view illustrating an IGBT according to this example.

As shown in FIG. 47, in the IGBT 91 according to this example, the interlayer insulating film 31 is a two-layer film composed of a BPSG (Boro-Phospho Silicate Glass) layer 92 and a silicon oxide layer 93 formed on the BPSG layer 92. The interlayer insulating film 31 has a total thickness of e.g. 1.5 microns, in which the underlayer BPSG layer 92 has a thickness of e.g. 1.3 microns, and the overlayer silicon oxide layer 93 has a thickness of e.g. 0.2 microns.

In the plug (emitter plug 32 and gate plug 33), the width of the middle portion, i.e. the portion buried in the BPSG layer 92, is larger than the width of the underlying portion (lower portion) and the width of the upper portion, i.e. the portion buried in the silicon oxide layer 93. The reason for this is as follows. The BPSG layer 92 and the silicon oxide layer 93 are laminated to form an interlayer insulating film 31, and then the trench grooves 47 and 48 (see FIG. 29) are formed by wet etching. Here, the BPSG layer 92 is more selectively etched than the silicon oxide layer 93 and the silicon layer. Hence the width of the portion of the trench grooves 47 and 48 in the BPSG layer 92 becomes larger than the width of the portion in the silicon oxide layer 93 and the portion in the gate electrode 24, the P-type layer 26, and the N-type layer 27. On the other hand, in the middle portion of the plug, a void 94 is formed inside the core member 62 made of tungsten. The void 94 is a cavity including therein an air layer or other gas layer. The void 94 is sealed at the upper portion and the lower portion of the plug, and extends in the extending direction of the plug. The configuration of this example other than the foregoing is the same as that of the IGBT 61 (see FIG. 27) according to the seventh example described above.

According to this example, because a void is formed inside the plug, stress applied to the plug can be relieved. Thus the configuration stability of the IGBT can be enhanced. By way of example, plugs are formed in the upper portion of a P-type silicon wafer having a diameter of 8 inches and a thickness of 760 microns, and then this P-type silicon wafer is polished from the lower face side to form a P-type layer having a thickness of 100 microns. In this case, when no void is formed in the plug, warpage of about 2 to 4 centimeters occurs in the entire wafer. However, when a void is formed in the plug, the amount of warpage of the entire wafer can be reduced to 2 to 3 millimeters. Thus the IGBT is planarized by forming a void in the plug, which facilitates packaging. The effect of this example other than the foregoing is the same as that of the seventh example described above.

The plugs described in this example, i.e. the emitter plug and the gate plug with a void formed therein, are also applicable to the first to six and the eighth example described above, and examples of the second and third embodiment described below.

Next, a second embodiment of the invention is described.

Figure 48:
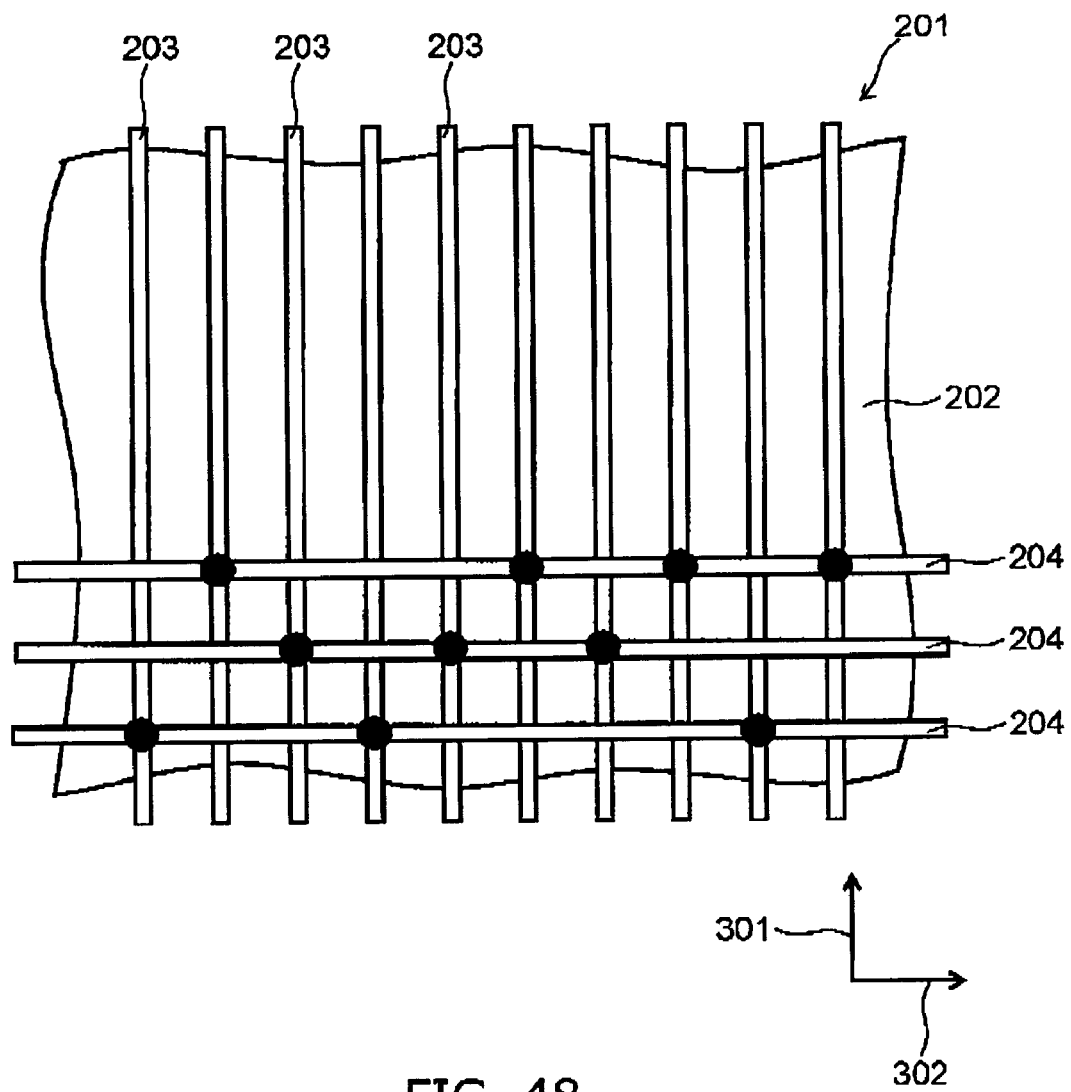
FIG. 48 is a schematic plan view illustrating a power semiconductor device according to a second embodiment of the invention.

FIG. 48 is a schematic plan view illustrating a power semiconductor device according to this embodiment.

The power semiconductor device 201 according to this embodiment includes a semiconductor substrate 202. A plurality of gate electrodes (not shown) are provided in the upper face of this semiconductor substrate 202. The gate electrode extends in a direction 301 parallel to the upper face of the semiconductor substrate 202. A voltage is applied to the gate electrode, and thereby the gate electrode controls the current flowing in the semiconductor substrate 202.

A plurality of contact lines 203 made of conductive material and extending in the direction 301 are provided in the directly overlying region of the gate electrode. Each gate electrode, nearly in its entire length, is in contact with the contact line 203, and hence is connected to the contact line 203.

Furthermore, a plurality of control lines 204 made of conductive material are provided above the contact lines 203. The control line 204 extends in a direction 302, which is parallel to the upper face of the semiconductor substrate 202 and crosses the direction 301. The direction 302 is illustratively orthogonal to the direction 301. The control line 204 is not directly in contact with the contact line 203, but these lines are in a skew position.

Between the contact lines 203 and the control lines 204, a plurality of connection members (not shown) for connecting a contact line 203 to at least one control line 204 are provided. Thus the plurality of gate electrodes are divided into a plurality of groups, each corresponding to a control line 204 connected through the contact line 203 and the connection members. The connection member is formed in the connection layer (not shown) provided between the interconnect layer including the contact lines 203 and the interconnect layer including the control lines 204.

In FIG. 48, the connection point between the contact line 203 and the control line 204, i.e. the position where the connection member is placed, is indicated by a bullet (•). For example, as illustrated in FIG. 48, the power semiconductor device 201 includes three control lines 204. Each contact line 203 is connected to one of the control lines 204 through the connection member. Thus the plurality of gate electrodes are divided into three groups: a "first group" connected to the first control line 204, a "second group" connected to the second control line 204, and a "third group" connected to the third control line 204.

In this embodiment, each group of gate electrodes can be independently driven by applying mutually independent signals to the control lines 204. Thus, for example, the method for driving the gate electrode can be selected depending on the driving frequency of the power semiconductor device 201. For example, when a relatively low driving frequency is used for driving, the gate electrodes belonging to all the groups can be switched. When a relatively high driving frequency is used for driving, only the gate electrodes belonging to part of the groups can be switched. Thus the tradeoff between the loss due to ON voltage and the switching loss can be varied depending on the driving frequency to reduce the sum of electric power loss. Furthermore, for example, the timing of changing the conducting/nonconducting state of the semiconductor substrate 202, i.e. the timing of switching, can be shifted between the groups. Thus the switching loss at turn-off time can be reduced with maintaining low ON voltage.

Alternatively, the gate electrodes can be grouped to divide the semiconductor substrate 202 into a plurality of regions, and only the region being likely to exceed the breakdown withstand capability can be turned off. Thus the device breakdown can be prevented without rendering the entire device nonconducting.

In this embodiment, each gate electrode is provided with a contact line 203, and the gate electrode is connected to the contact line 203 in its entire length. Thus the resistive component in the gate electrode can be reduced.

With regard to manufacturing a power semiconductor device 201 according to this embodiment, in manufacturing a plurality of types of devices having different connection relationships between the contact lines 203 and the control lines 204, the connection relationship between the contact lines 203 and the control lines 204 can be arbitrarily selected by selecting the disposed position of connection members in the connection layer. Thus design change and manufacturing are easy in the power semiconductor device 201 according to this embodiment.

In the following, examples for realizing the power semiconductor device according to this embodiment are described.

First, a first example of this embodiment is described. In this example, an IGBT is described as an example of the power semiconductor device.

Figure 49:
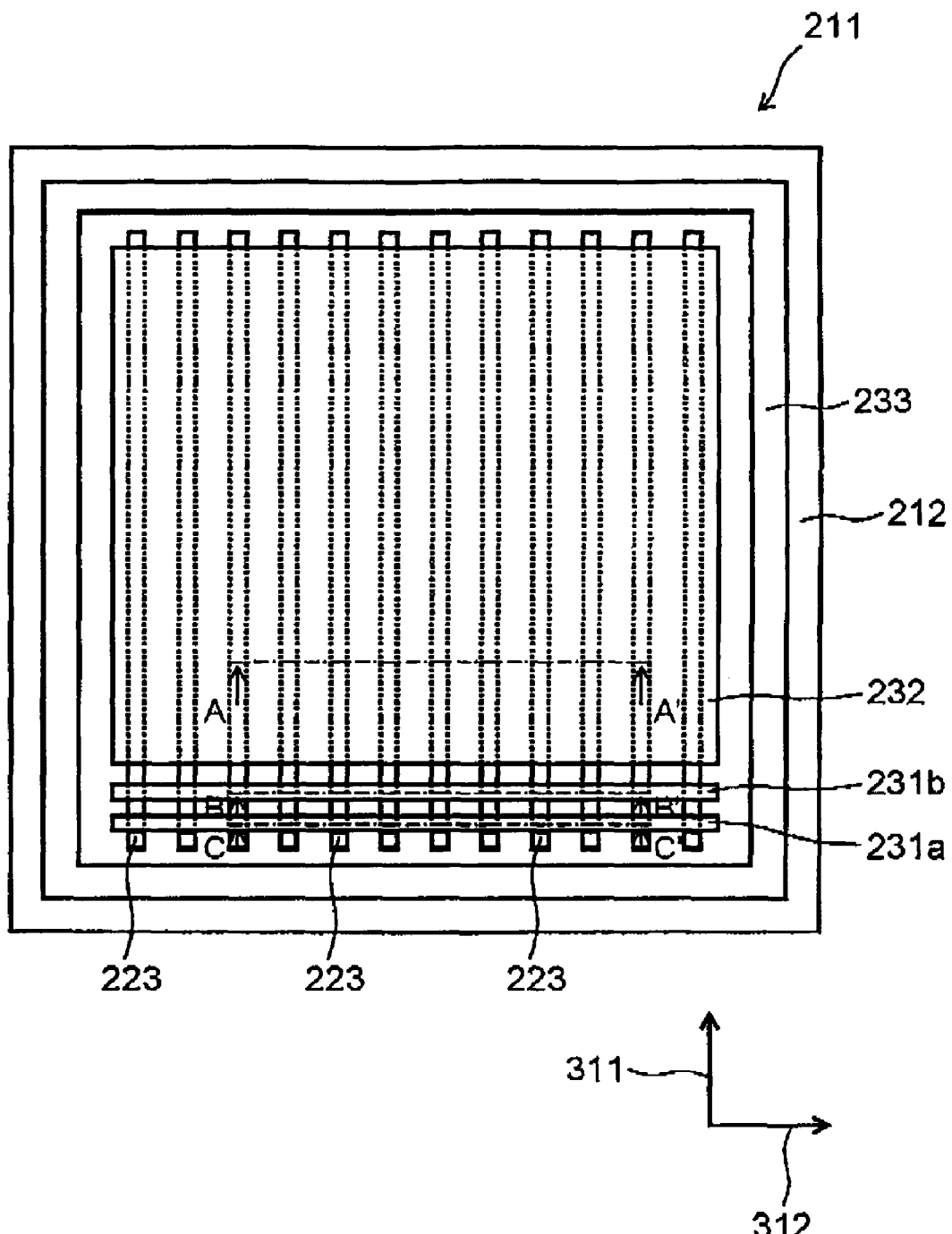
FIG. 49 is a plan view illustrating an IGBT according to a first example of the second embodiment.

FIG. 49 is a plan view illustrating an IGBT according to this example. In FIG. 49, for clarity, the control line and the contact line are shown thicker than in reality, and hence the number of lines is smaller than in reality.

Figure 50:
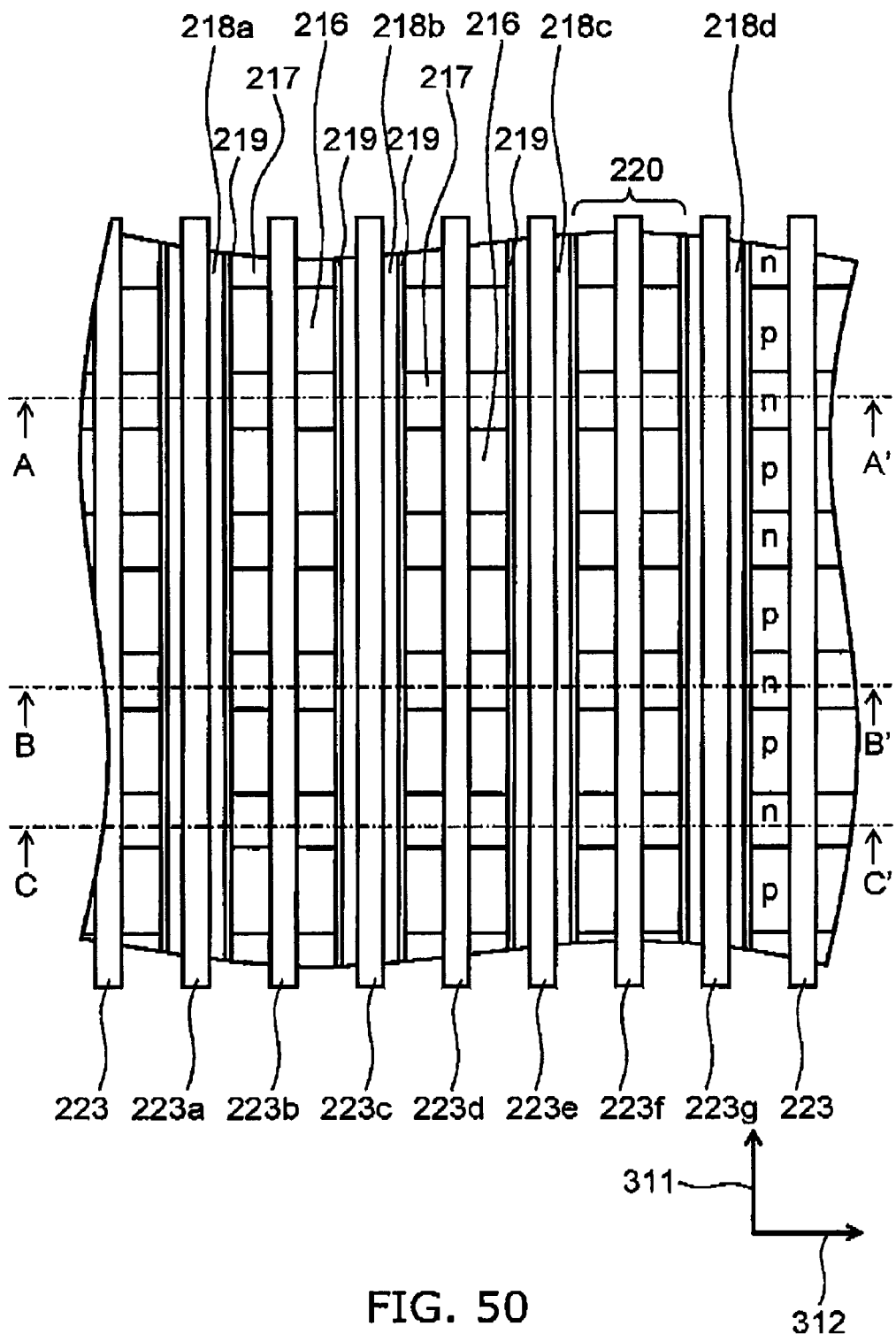
FIG. 50 is a partial plan view illustrating the semiconductor substrate and the contact lines in this IGBT.
Figure 51:
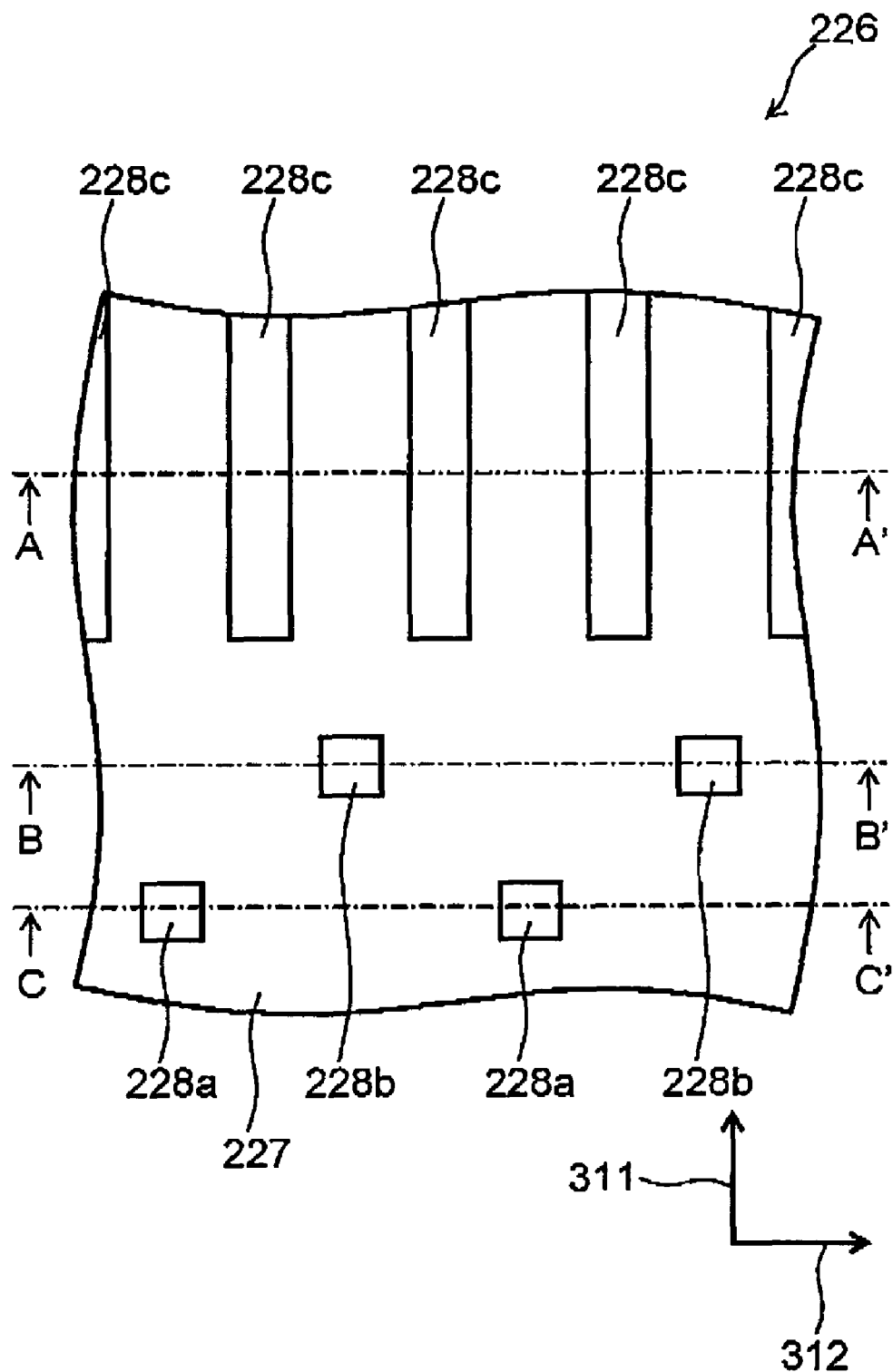
FIG. 51 is a partial plan view illustrating the connection layer including connection members in the portion of this IGBT shown in FIG. 50.
Figure 52:
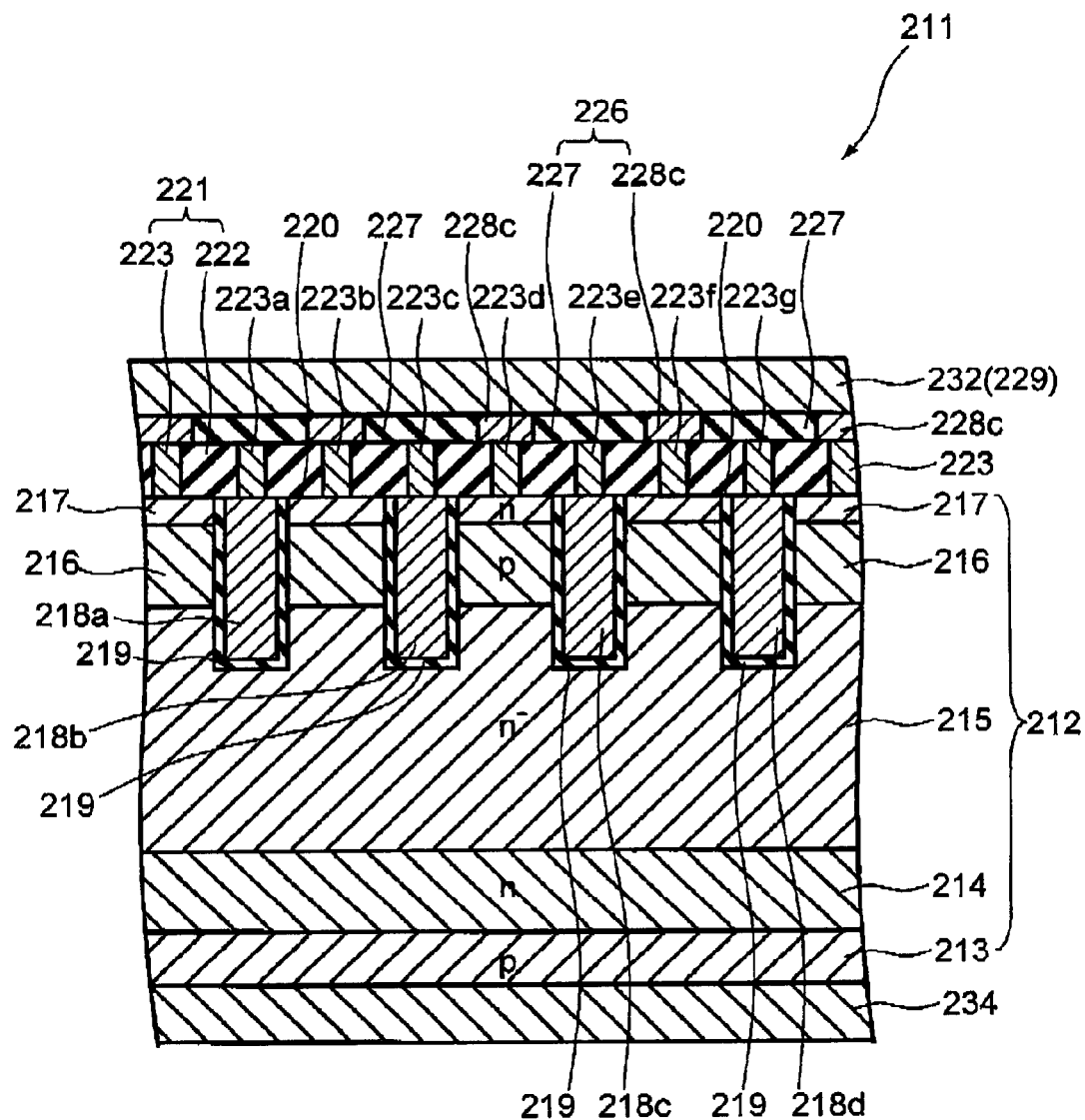
FIG. 52 is a partial cross-sectional view taken along line A-A' shown in FIGS. 49 to 51.

FIG. 50 is a partial plan view illustrating the semiconductor substrate and the contact lines in this IGBT, FIG. 51 is a partial plan view illustrating the connection layer including connection members in the portion of this IGBT shown in FIG. 50, FIG. 52 is a partial cross-sectional view taken along line A-A' shown in FIGS. 49 to 51, FIG. 53 is a partial cross-sectional view taken along line B-B' shown in FIGS. 49 to 51, and FIG. 54 is a partial cross-sectional view taken along line C-C' shown in FIGS. 49 to 51.

Figure 53:
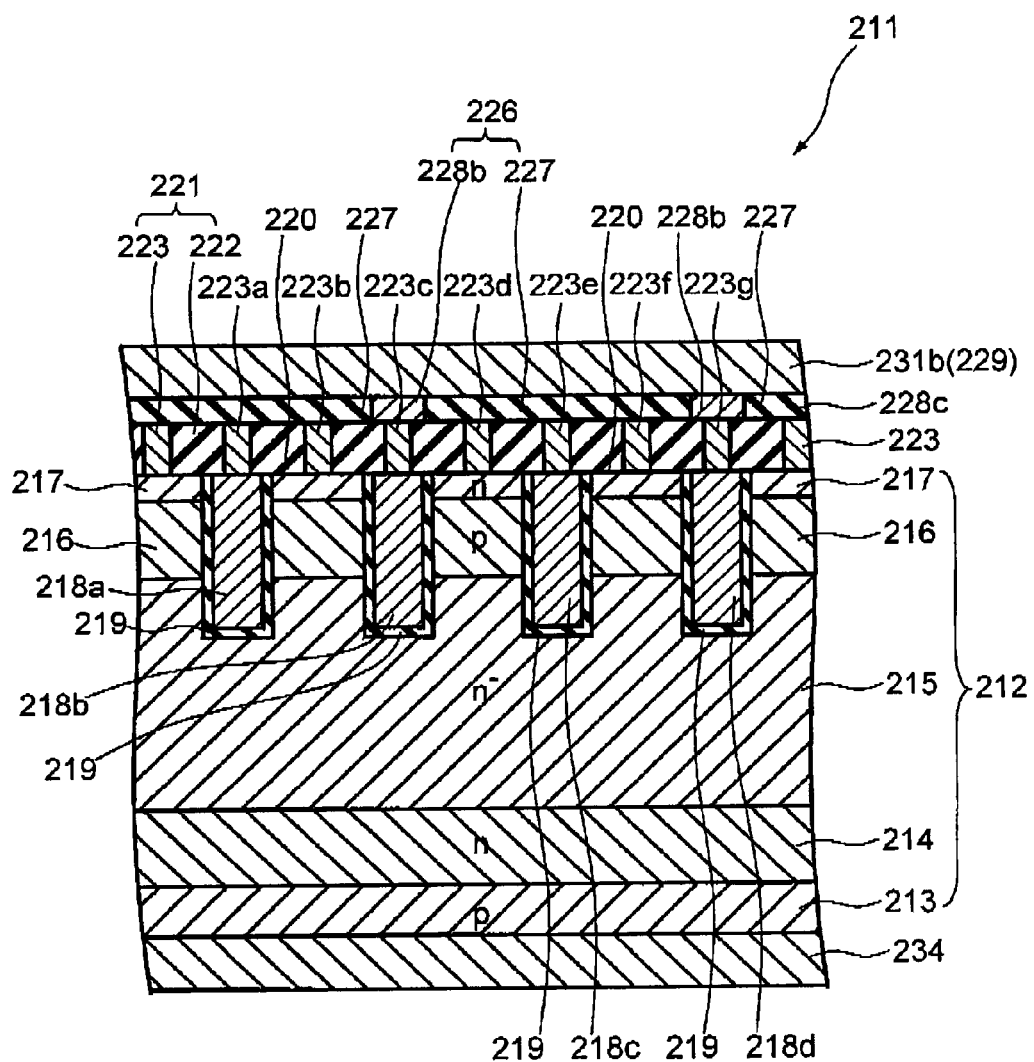
FIG. 53 is a partial cross-sectional view taken along line B-B' shown in FIGS. 49 to 51.
Figure 54:
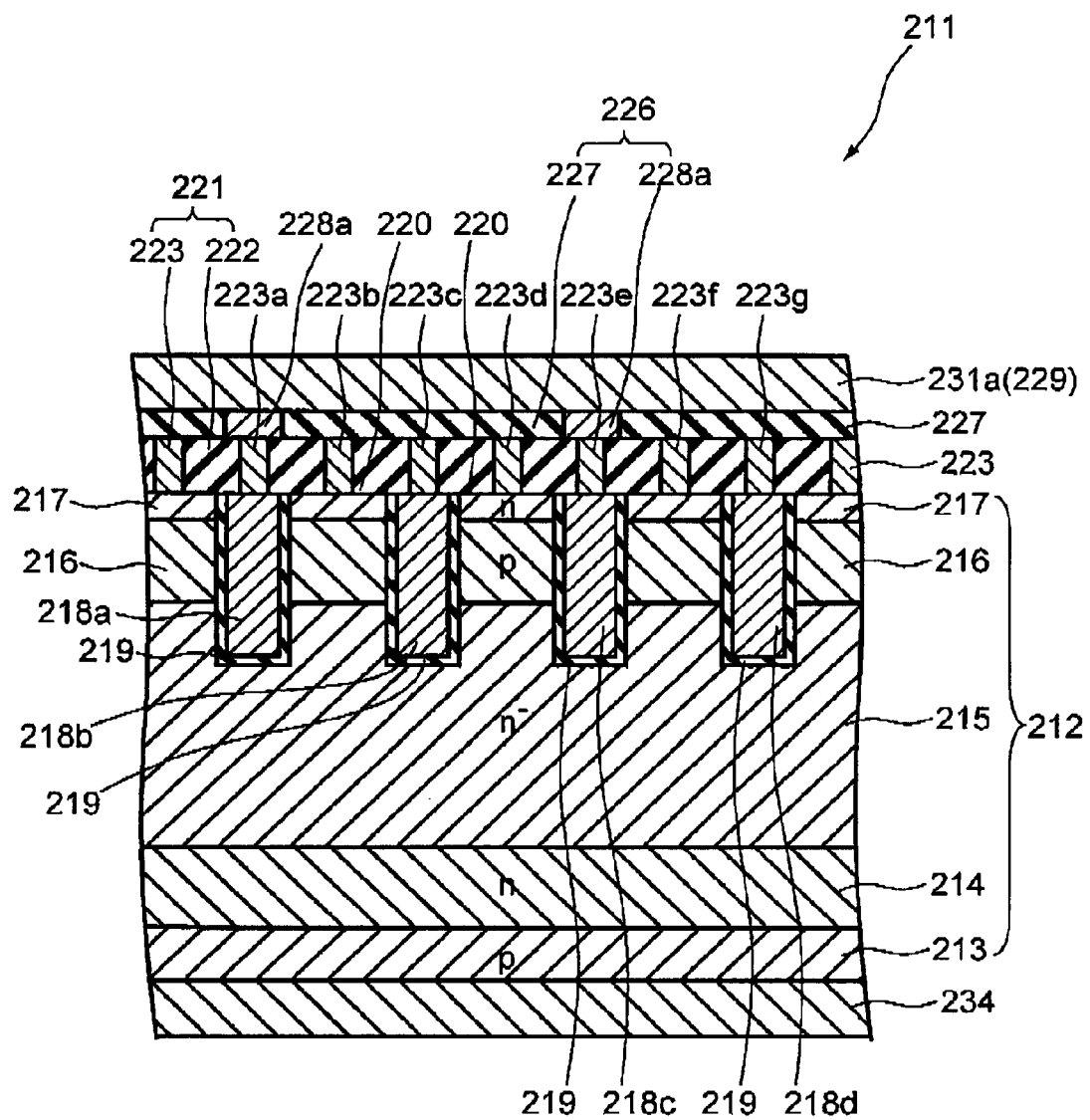
FIG. 54 is a partial cross-sectional view taken along line C-C' shown in FIGS. 49 to 51.

As shown in FIGS. 49 to 54, the IGBT 211 according to this example includes a silicon substrate 212 serving as a semiconductor substrate. The silicon substrate 212 has a square shape as shown in FIG. 49, and can be shaped like a square plate measuring 10 millimeters on a side. As shown in FIGS. 52 to 54, the silicon substrate 212 includes, from the lower face side toward the upper face side, a p-type layer 213 which is a p-type semiconductor layer, an n-type layer 214 which is an n-type semiconductor layer, an n$^-$-type layer 215 having a lower n-type dopant concentration than the n-type layer 214, and a p-type layer 216. Furthermore, an n-type layer 217 is formed partially on the p-type layer 216. That is, in the upper face of the silicon substrate 212, the p-type layer 216 and the n-type layer 217 are exposed.

A plurality of gate electrodes 218 (218a to 218d, etc.) are buried in the silicon substrate 212. The gate electrode 218 is shaped like a stripe extending in a direction 311 parallel to the upper face of the silicon substrate 212. The upper face of the gate electrode 218 is located as high as the upper face of the silicon substrate 212, and is exposed in this upper face. On the other hand, the side face and the lower face of the gate electrode 218 are covered with a gate insulating film 219. The gate insulating film 219 serves to insulate the gate electrode 218 from the silicon substrate 212. The gate electrode 218 penetrates the p-type layer 216 and the n-type layer 217, and reaches the depth where the n⁻-type layer 215 is located. Thus the n-type layer 217 is arranged intermittently along a direction 312, which is parallel to the upper face of the silicon substrate 212 and orthogonal to the direction 311, with being split by the gate electrode 218 and the gate insulating film 219. In FIGS. 50 to 54, four gate electrodes arranged consecutively are marked with reference numerals 218a to 218d, and thereby distinctly identified, respectively.

An interconnect layer 221 (see FIG. 52) is provided on the silicon substrate 212. The interconnect layer 221 includes a plurality of contact lines 223 in an insulating material 222. Here, in FIG. 50, the insulating material 222 is not shown for convenience. The contact line 223 is illustratively made of aluminum (Al), copper (Cu), or tungsten (W), and extends in the direction 311.

As shown in FIGS. 50, 52, etc., among the contact lines 223, every other contact line 223 is located in the directly overlying region of the gate electrode 218. Thus each gate electrode 218 is in contact with the contact line 223 in its entire length, and hence is connected to the contact line 223. The contact line 223 located between the contact lines 223 connected to the gate electrode 218 is in contact with a region 220 of the upper face of the silicon substrate 212 between the gate electrodes 218, i.e. a region 220 to which the p-type layer 216 and the n-type layer 217 are exposed, and hence is connected to the region 220. Here, the region 220 is a mesa of the IGBT 211.

In FIGS. 50 to 54, seven contact lines arranged consecutively are marked with reference numerals 223a to 223g, and thereby distinctly identified, respectively. Here, the contact line 223a is located in the directly overlying region of the gate electrode 218a, the contact line 223b is located in the directly overlying region of the region 220 between the gate electrode 218a and the gate electrode 218b, the contact line 223c is located in the directly overlying region of the gate electrode 218b, the contact line 223d is located in the directly overlying region of the region 220 between the gate electrode 218b and the gate electrode 218c, the contact line 223e is located in the directly overlying region of the gate electrode 218c, the contact line 223f is located in the directly overlying region of the region 220 between the gate electrode 218c and the gate electrode 218d, and the contact line 223g is located in the directly overlying region of the gate electrode 218d.

A connection layer 226 as shown in FIGS. 51 and 52 is provided on the interconnect layer 221. In the connection layer 226, each plurality of connection members 228a, 228b, 228c (hereinafter also collectively referred to as "connection members 228") are buried in an insulating material 227. As viewed from above, the connection members 228a and 228b are shaped like a square, and the connection member 228c is shaped like a stripe extending in the direction 311. However, the shape of the connection members 228a and 228b as viewed from above is not limited to a square, but may illustratively be a rectangle, circle, or ellipse. The connection member 228 is illustratively made of aluminum. The disposed position of the connection member 228 is described later in detail.

Furthermore, an interconnect layer 229 as shown in FIGS. 52 to 54 is provided on the connection layer 226. In this interconnect layer 229, two control lines 231a and 231b and one main electrode 232 are provided in an insulating material 230. The control lines 231a and 231b and the main electrode 232 are illustratively made of aluminum. The control lines 231a and 231b extend in the direction 312, and located at one edge of the active region of the IGBT 211, i.e. the region where the gate electrodes 218 and the contact lines 223 are formed. The main electrode 232 is located nearly entirely in the active region except the disposed region of the control lines 231a and 231b.

Furthermore, as shown in FIG. 49, in the region surrounding the active region in the upper face of the silicon substrate 212, one or more p-type layers 233 are formed like a frame. This p-type layer 233 functions as a junction terminal region such as a RESURF (Reduced Surface Field) or guard ring. As shown in FIGS. 52 to 54, a main electrode 234 illustratively made of aluminum is provided nearly entirely on the lower face of the silicon substrate 212, and connected to the p-type layer 213.

As shown in FIG. 54, in the connection layer 226, the connection member 228a is located in the region directly overlying every other gate electrode 218 and directly underlying the control line 231a. Thus the every other gate electrode 218 is connected to the control line 231a (see FIG. 49) through the contact line 223 and the connection member 228a.

In the region directly overlying the gate electrode 218 located between the above gate electrodes 218, i.e. the other every other gate line 218, and directly underlying the control line 231b, the connection member 228b (see FIG. 53) is located. Thus the other every other gate electrode 218 is connected to the control line 231b through the contact line 223 and the connection members 228b. Consequently, the gate electrodes 218 are alternately divided into a group connected to the control line 231a and a group connected to the control line 231b. That is, the plurality of gate electrodes 218 are divided into a plurality of groups for each control line connected through the contact line 223 and the connection members 228.

Furthermore, in the region directly overlying the region 220 (mesa) and directly underlying the main electrode 232, the connection member 228c (see FIG. 52) is located. Thus the region 220 is connected to the main electrode 232 through the contact line 223 and the connection member 228c.

The arrangement of the above connection members 228 can be illustrated with reference to the example shown in FIGS. 50 to 54 as follows. The gate electrode 218a is connected to the control line 231a through the contact line 223a and one connection member 228a. The gate electrode 218c is connected to the control line 231a through the contact line 223e and another connection member 228a. Thus the gate electrodes 218a and 218c constitute a first group connected to the control line 231a. The gate electrode 218b is connected to the control line 231b through the contact line 223c and one connection member 228b. The gate electrode 218d is connected to the control line 231b through the contact line 223g and another connection member 228b. Thus the gate electrodes 218b and 218d constitute a second group connected to the control line 231b. Furthermore, the region 220 (mesa) is connected to the main electrode 232 through the contact line 223b, 223d, or 223f and one of the connection members 228c.

Next, the operation of the IGBT according to this example is described.

Figure 55:
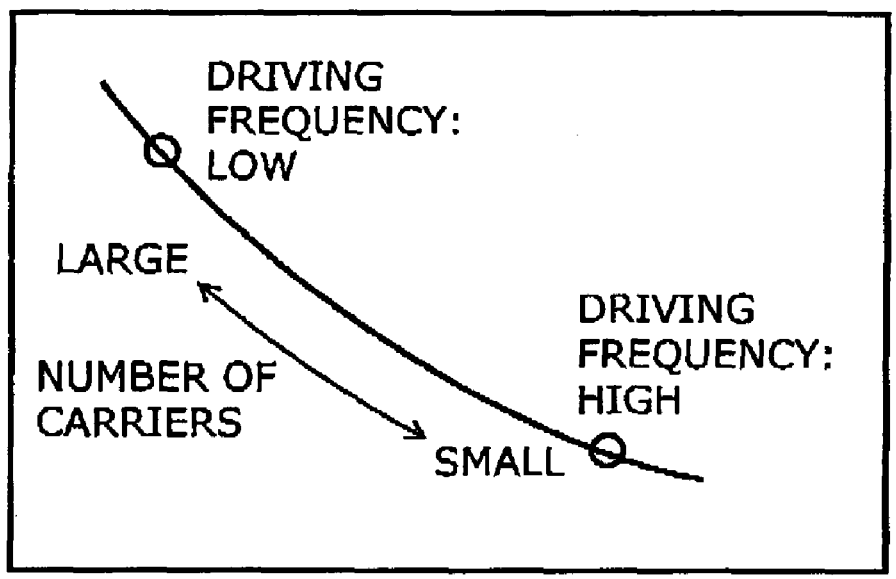
FIG. 55 is a graph schematically illustrating the operation of an IGBT according to this example where the horizontal axis represents the ON voltage and the vertical axis represents the switching loss.

FIG. 55 is a graph schematically illustrating the operation of an IGBT according to this example where the horizontal axis represents the ON voltage and the vertical axis represents the switching loss.

The IGBT 211 according to this example can be turned on by applying a voltage not less than a gate threshold between one of the gate electrodes and the main electrode 232, with the main electrode 234 placed at a higher potential than the main electrode 232. More specifically, through the n-type channel formed in the p-type layer 216 by the voltage not less than the gate threshold, electrons are supplied from the n-type layer 217 into the n⁻-type layer 215, and holes are supplied from the p-type layer 213 side into the n⁻-type layer 215. Thus a current flows from the main electrode 234 to the main electrode 232.

Furthermore, in this example, when the IGBT 211 is driven at frequencies less than a predetermined frequency, an identical gate driving signal is inputted to the control lines 231a and 231b. Thus the first group of gate electrodes connected to the control line 231a and the second group of gate electrodes connected to the control line 231b are operated at the same timing. Consequently, as illustrated in FIG. 55, carriers contributing to the operation of the IGBT 211 increases, and the ON voltage can be reduced.

On the other hand, when the IGBT 211 is driven at frequencies not less than the predetermined frequency, only one group of gate electrodes are operated, and the potential of the other group of gate electrodes is fixed to a potential less than the gate threshold, i.e. a potential that renders the silicon substrate 212 nonconducting. For example, a normal gate driving signal is applied only to the control line 231a, and the same potential as the potential of the main electrode 232 is applied to the control line 231b. Thus, as viewed from above, the region of the silicon substrate 212 around the gate electrode 218 connected to the control line 231b is not supplied with electrons, and carriers contributing to the operation of the entire IGBT 211 decrease. Furthermore, there is no need to charge/discharge the gate electrode 218 connected to the control line 231b, and hence the switching time is reduced. Consequently, as illustrated in FIG. 55, although the required ON voltage increases, the switching loss decreases, as compared with the case of low driving frequency.

Thus, according to this example, the sum of electric power loss can be reduced in each operating condition. Furthermore, according to this example, by providing an interconnect layer 221 and a connection layer 226 above the silicon substrate 212 having a configuration similar to the configuration of the conventional IGBT, the IGBT 211 according to this example can be realized. Hence, when the IGBT according to this example is manufactured, the conventional platform can be used to fabricate the silicon substrate 212, which facilitates manufacturing.

FIGS. 56 to 59 are schematic views showing variations of this example.

Figure 56:
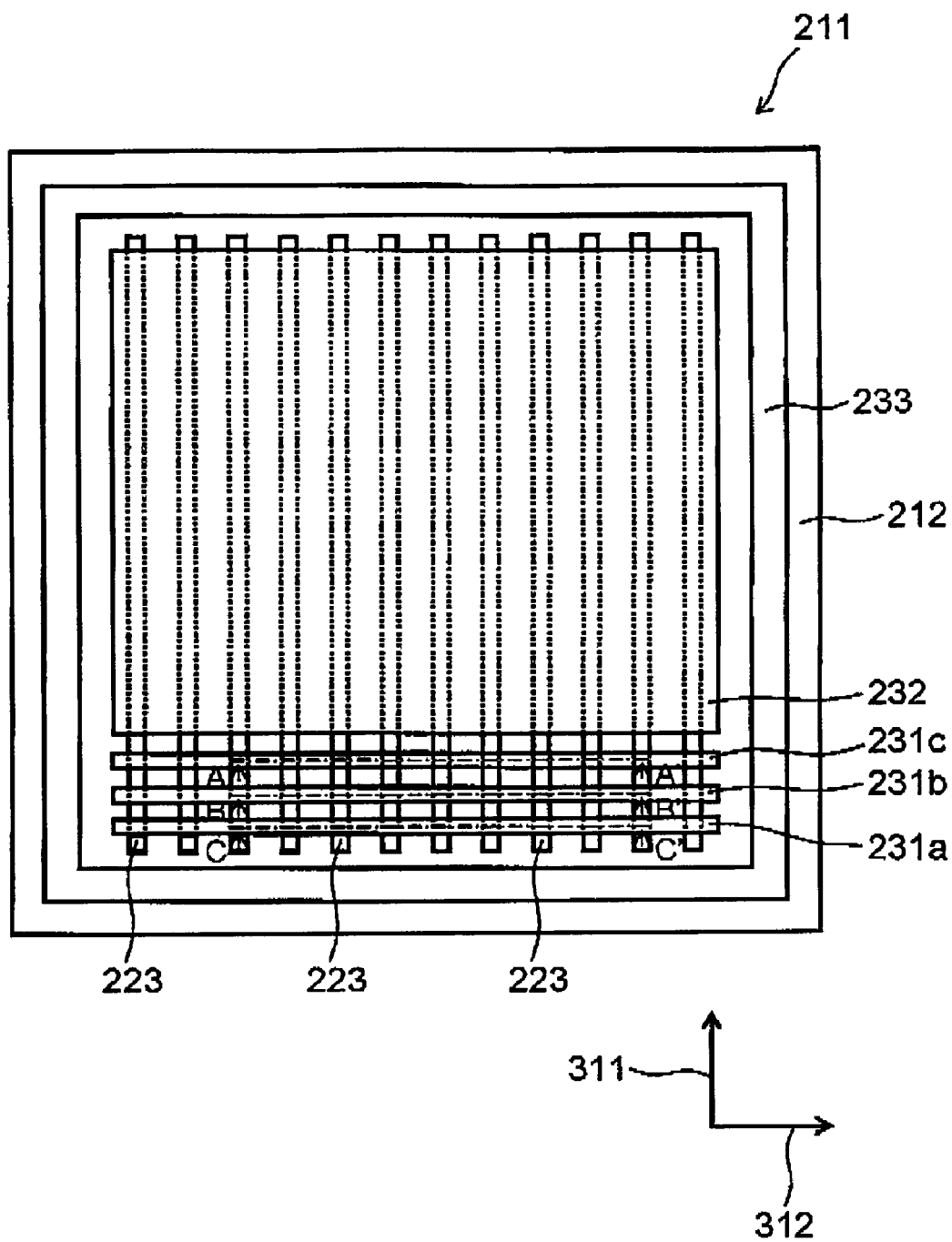
FIG. 56 is a schematic plan view partially showing the interconnect layer 229 in a variation of the first example, corresponding to FIG. 49.

More specifically, FIG. 56 is a schematic plan view partially showing the interconnect layer 229 in this variation, corresponding to FIG. 49.

Figure 57:
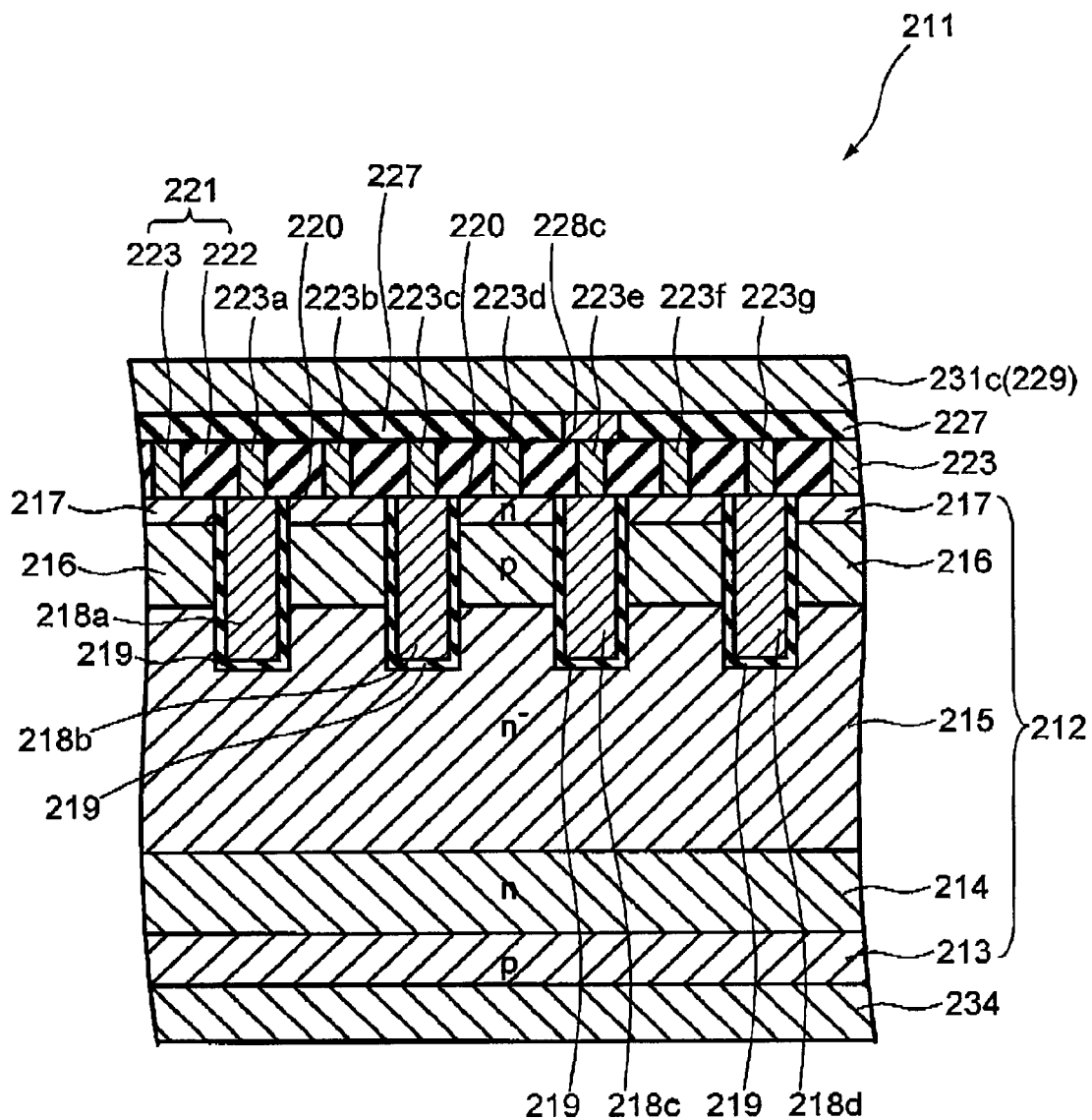
FIGS. 57 to 59 are partial cross-sectional views taken along line A-A', line B-B', and line C-C' of FIG. 56, respectively.
Figure 58:
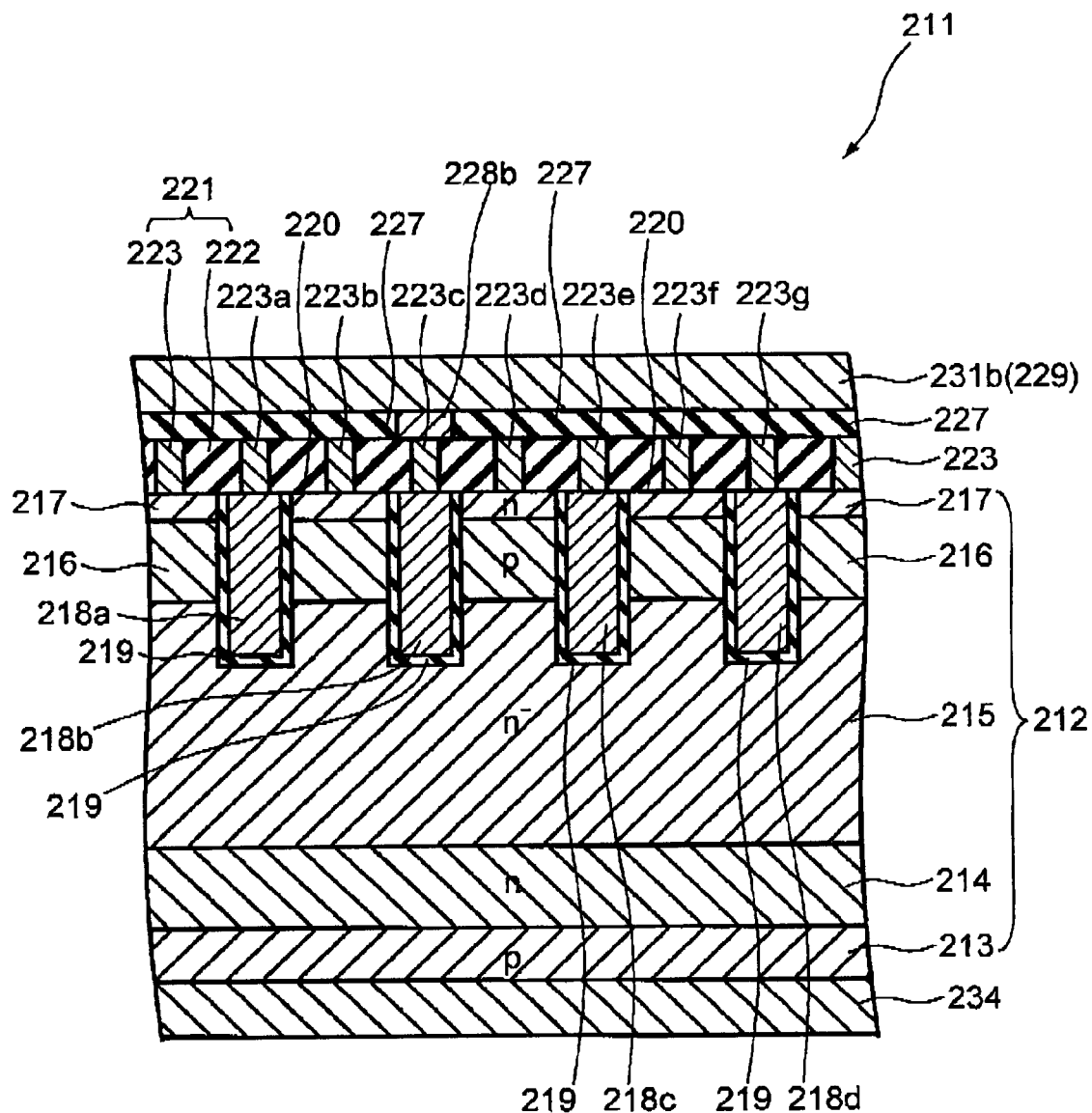
Figure 59:
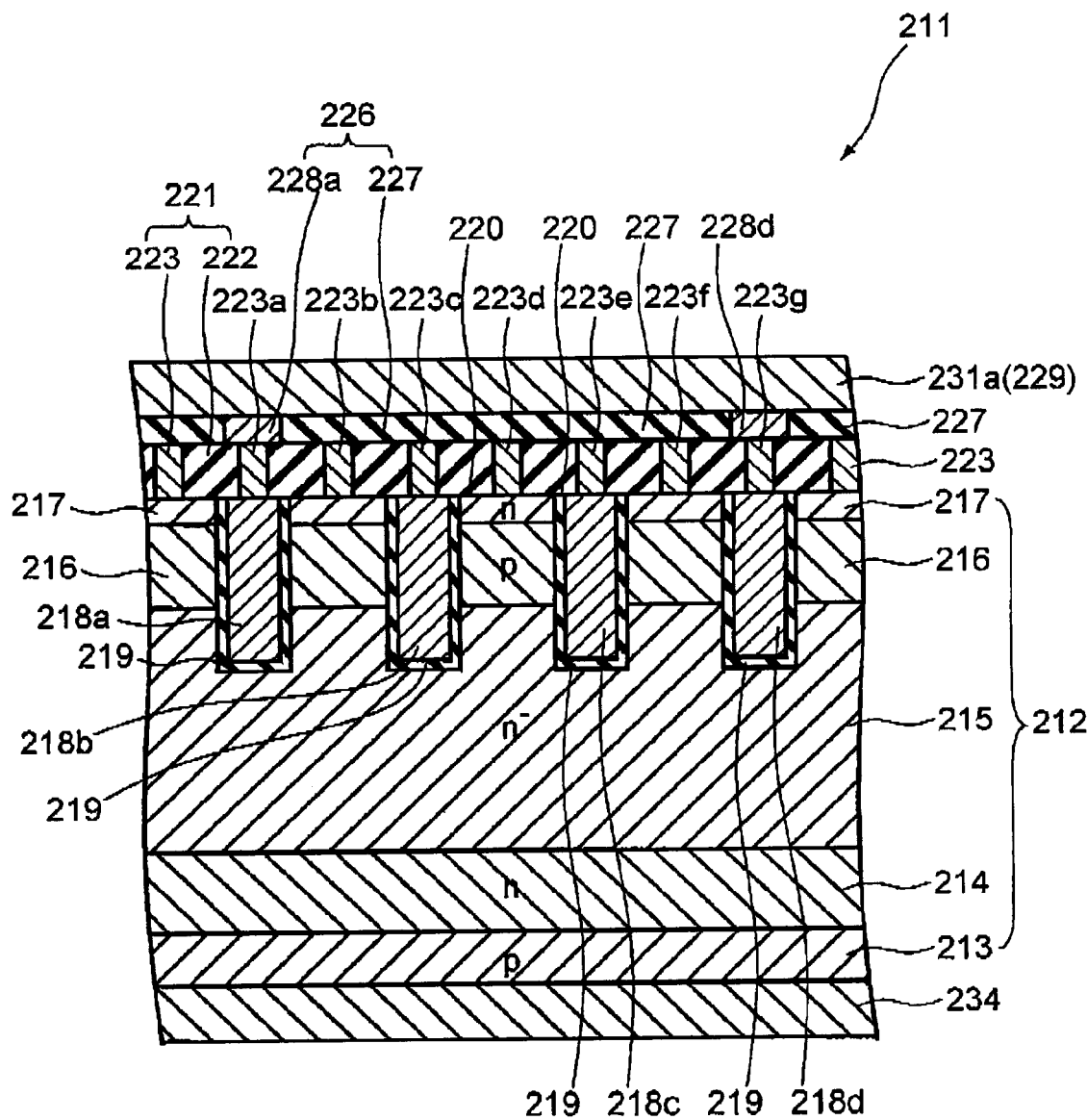

FIGS. 57 to 59 are partial cross-sectional views taken along line A-A', line B-B', and line C-C' of FIG. 56, respectively.

With regard to FIGS. 56 to 59, the same elements as those described above with reference to FIGS. 48 to 55 are marked with the same reference numerals and not described in detail.

The IGBT of this variation includes three control lines 231a, 231b, and 231c. The gate lines are each connected to one of these three control lines and divided into three groups.

Specifically, as shown in FIG. 59, the gate lines 218a and 218d are connected to the first control line 231a through the contact lines 223a, 223g and the connection members 228a, 228d.

As shown in FIG. 58, the gate line 218b is connected to the second control line 231b through the contact line 223c and the connection member 228b.

As shown in FIG. 57, the gate line 218c is connected to the control line 231c through the contact line 223e and the connection member 228c. The other gate lines, not shown, are also connected like this to one of the three control lines 231a to 231c and divided into groups.

As described above, in this variation, a plurality of gate lines are connected to one of the three control lines 231a to 231c and divided into three groups. Thus, when the gate lines are divided into three groups, the driving frequency and other parameters can be partitioned into three levels to change the driving modes.

Figure 60:
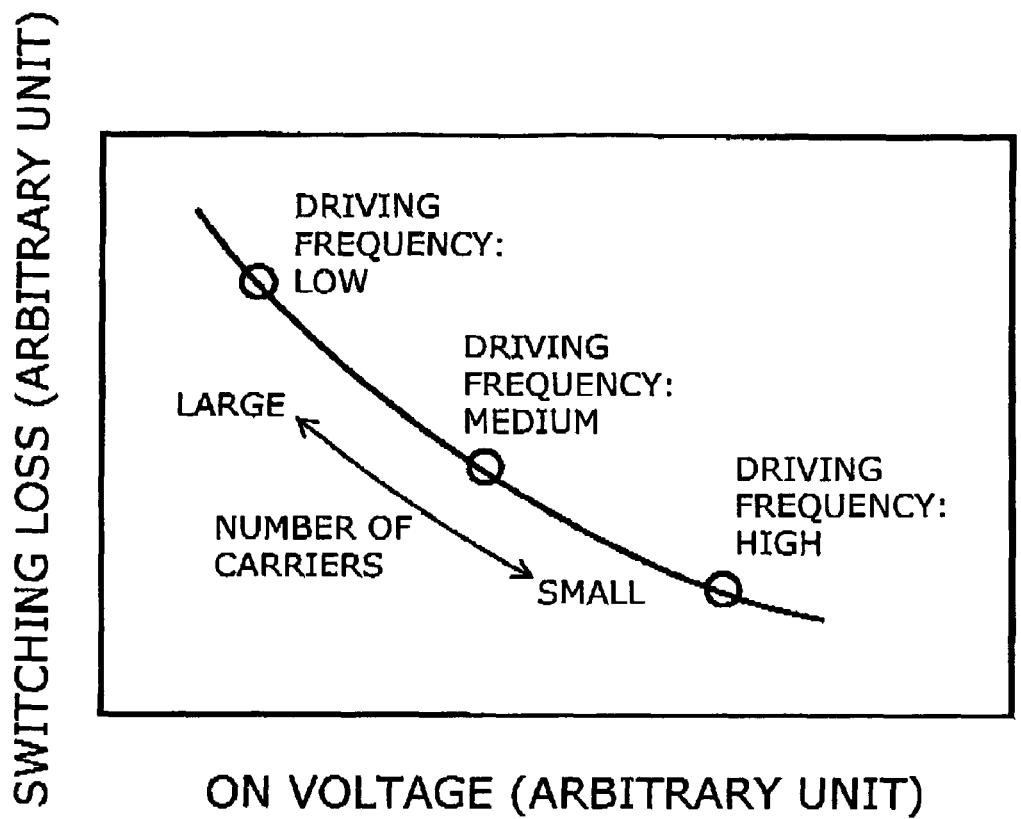
FIG. 60 is a schematic diagram for illustrating the driving operation mode of using three partitioned driving frequencies, which is a graph corresponding to FIG. 55.

FIG. 60 is a schematic diagram for illustrating the driving mode of using three partitioned driving frequencies, which is a graph corresponding to FIG. 55.

More specifically, at low driving frequencies, for example, an identical gate driving signal is inputted to all the three groups of gates. Within a medium range of driving frequencies, an identical gate driving signal is inputted to any two groups of the three groups for driving. At high driving frequencies, a gate driving signal is inputted to only one group of the three groups for driving. Here, the boundaries of the "low", "medium", and "high" driving frequency ranges, i.e. the frequencies at which the operation mode is switched, can be appropriately determined.

In this manner, as described above with reference to FIG. 55, the switching loss can be reduced. Thus, according to this variation, driving frequencies can be partitioned into three levels for more fine-tuned control, thereby realizing more efficient operation. Therefore, when the driving frequency is varied among three levels, or more than three levels, or continuously, the driving upper limit can be varied corresponding to the variation of driving frequency, and the sum of electric power loss can be reduced in each driving condition. In this variation, three control lines are provided, and a plurality of gate electrodes are divided into three groups. However, the invention is not limited thereto, but four or more control lines can be provided for division into four or more groups. Then, more fine-tuned and diverse adjustment of operation modes can be realized.

Conventionally, a complex and special interconnect structure and manufacturing process is required for dividing a plurality of gate electrodes into three or more groups. In contrast, in this embodiment, arbitrary grouping can be realized simply by rearranging connection members between the contact lines and the control lines, which facilitates manufacturing with a simple structure.

Next, a second example of this embodiment is described.

Figure 61:
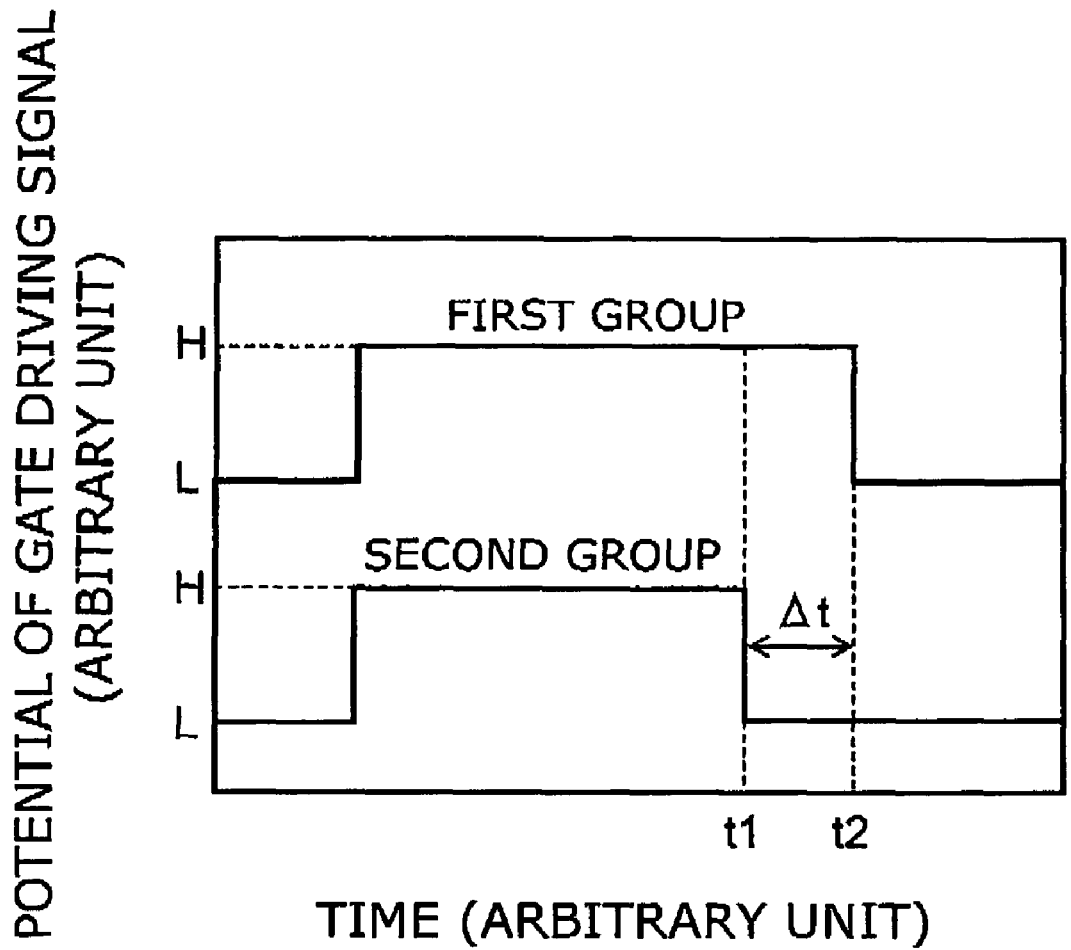
FIG. 61 is a timing chart illustrating the operation of an IGBT according to the second example of the second embodiment where the horizontal axis represents time and the vertical axis represents the potential of the gate driving signal.

FIG. 61 is a timing chart illustrating the operation of an IGBT according to this example where the horizontal axis represents time and the vertical axis represents the potential of the gate driving signal.

The configuration of the IGBT according to this example is the same as that of the first example described above.

In this example, the turn-off timing is shifted between the first group of gate electrodes connected to the control line 231a and the second group of gate electrodes connected to the control line 231b. More specifically, as shown in FIG. 61, when the IGBT is turned on, the gate driving signals applied to the control lines 231a and 231b are varied from the low level to the high level at the same timing. On the other hand, when the IGBT is turned off, the gate driving signal applied to the control line 231b is varied from the high level to the low level at time t1. Then, after a predetermined time period Δt has elapsed, the gate driving signal applied to the control line 231a is varied from the high level to the low level at time t2. In this manner, the gate driving signal applied to the control line 231b is set to the low level at time t1 to decrease the conductive carrier concentration in the vicinity of the gate electrodes connected to the control line 231b, and then the gate driving signal applied to the control line 231a is set to the low level at time t2 to turn off the entire device. Thus the switching loss can be reduced. Furthermore, the avalanche phenomenon can be avoided to increase the breakdown withstand capability. That is, according to this example, reduction of switching loss and enhancement of breakdown withstand capability can be realized with maintaining low ON voltage.

Next, a third example of this embodiment is described.

Figure 62:
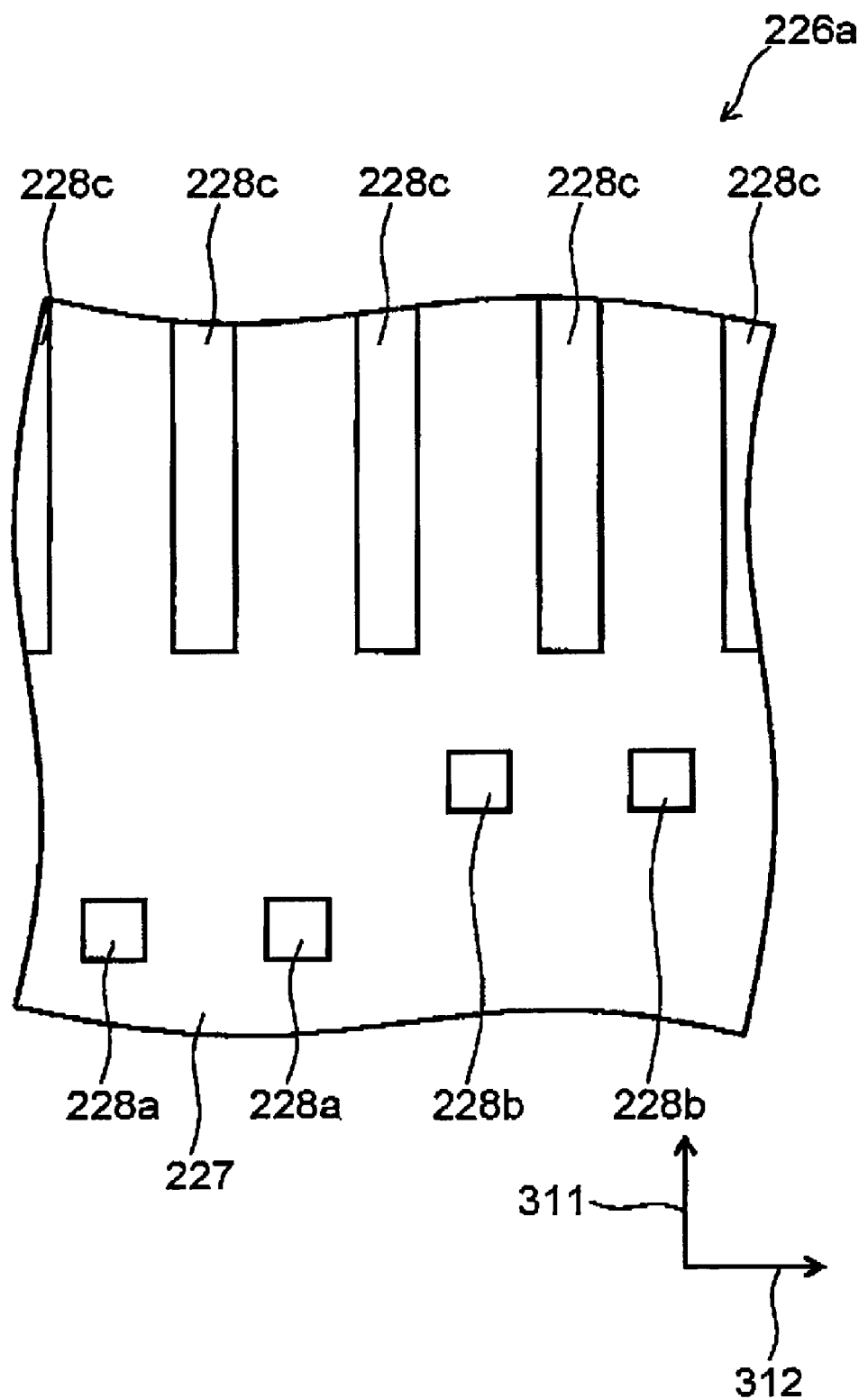
FIG. 62 is a partial plan view illustrating the connection layer including connection members in an IGBT according to a third example of the second embodiment.

FIG. 62 is a partial plan view illustrating the connection layer including connection members in an IGBT according to this example.

As compared with the IGBT according to the first example described above, the IGBT according to this example includes a connection layer 226a instead of the connection layer 226. In the connection layer 226a, as viewed from above, the connection members 228a are located in the central region of the IGBT, and the connection members 228b are located in the peripheral region of the IGBT. Thus the gate electrode 218 located in the central region of the IGBT is connected to the control line 231a through the contact line 223, and the gate electrode 218 located in the peripheral region of the IGBT is connected to the control line 231b through the contact line 223. The configuration of this example other than the foregoing is the same as that of the first example described above.

The method for driving the IGBT in this example is the same as in the first example described above. More specifically, as shown in FIGS. 55 and 60, at relatively low driving frequencies, i.e. when the IGBT is driven at frequencies less than a predetermined frequency, an identical gate driving signal is inputted to the control lines 231a and 231b. At relatively high driving frequencies, i.e. when the IGBT is driven at frequencies not less than the predetermined frequency, a normal gate driving signal is applied only to the control line 231a, and the same potential as the potential of the main electrode 232 is applied to the control line 231b. Thus, at relatively high driving frequencies, conductive carriers can be reduced in the peripheral region of the chip which is conventionally susceptible to avalanche phenomena, and thereby the avalanche phenomenon can be effectively prevented. Consequently, high breakdown withstand capability can be realized in the operating condition susceptible to avalanche phenomena, e.g. when a large current flows.

Furthermore, as compared with the IGBT according to the first example described above, the IGBT according to this example can be manufactured by changing the arrangement pattern of the connection members 228 formed in the connection layer 226a. That is, the IGBT according to this example is easy to manufacture.

Also in this example, as in the second example described above, when the IGBT is turned off, the second group of gate electrodes may be turned off earlier than the first group of gate electrodes. Thus the avalanche phenomenon can be prevented in the peripheral region of the chip to increase breakdown withstand capability with maintaining low ON voltage.

Next, a fourth example of this embodiment is described.

Figure 63:
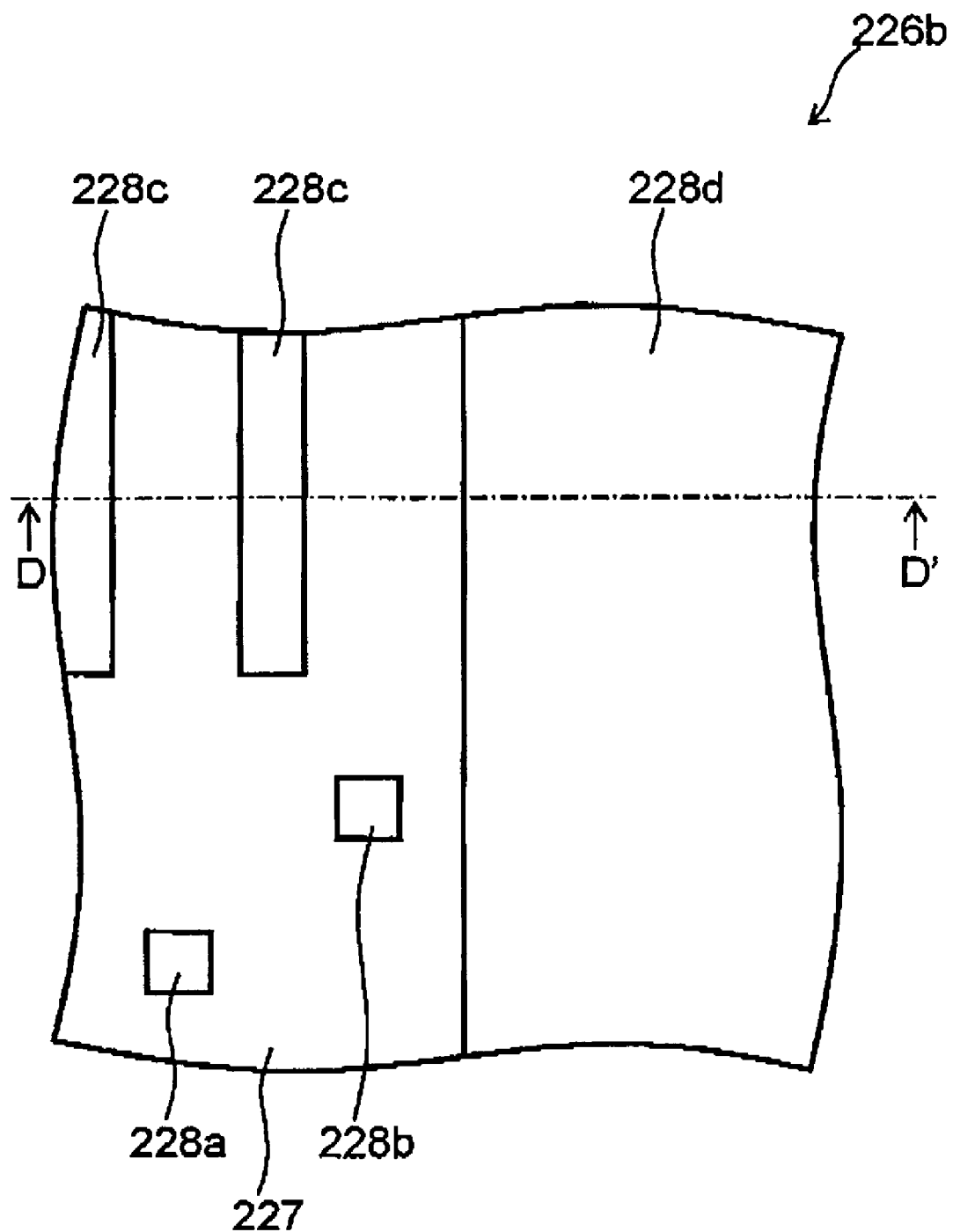
FIG. 63 is a partial plan view illustrating the connection layer including connection members in an IGBT according to a fourth example of the second embodiment.
Figure 64:
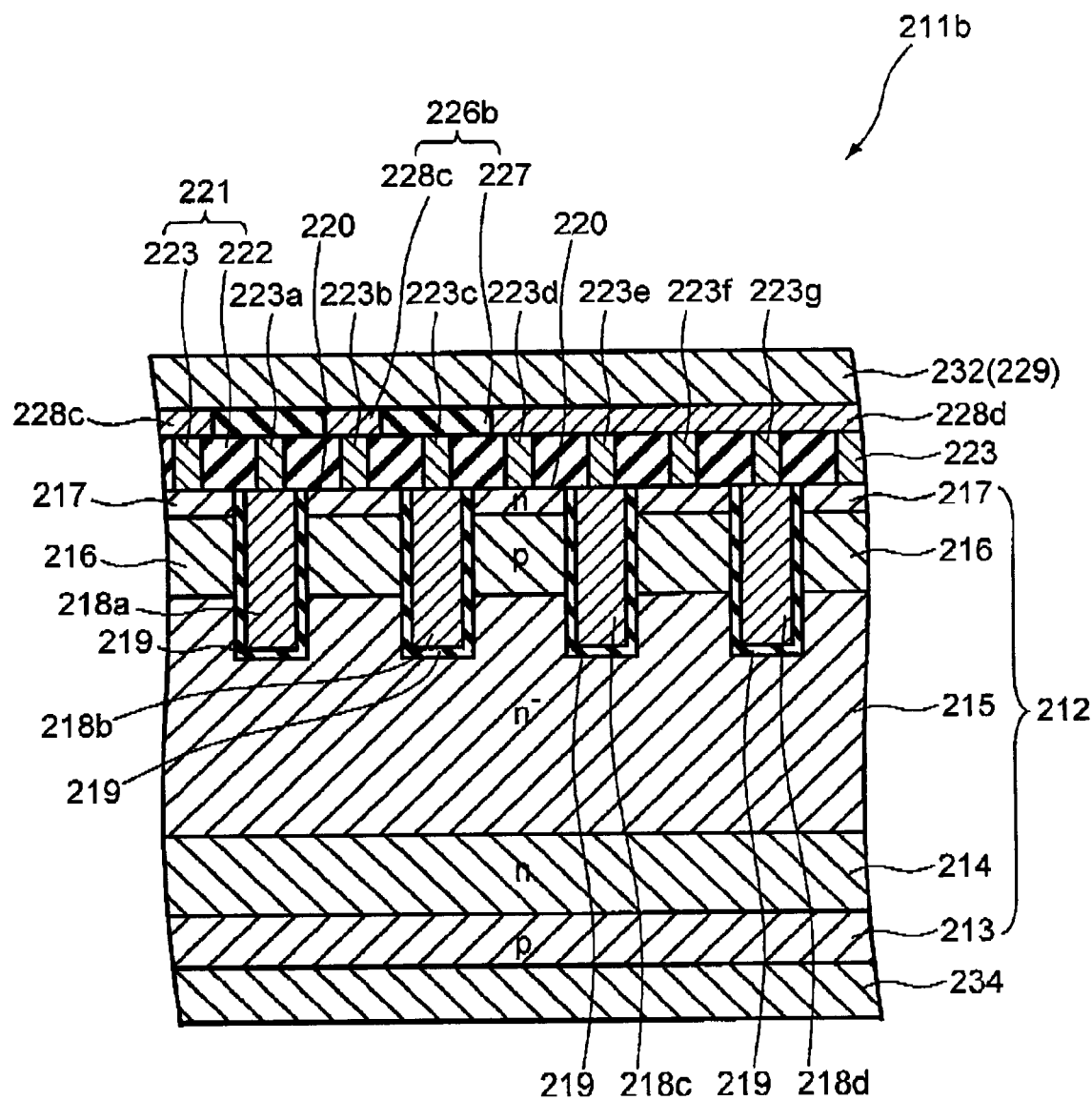
FIG. 64 is a cross-sectional view taken along line D-D' of FIG. 63 showing this IGBT.

FIG. 63 is a partial plan view illustrating the connection layer including connection members in an IGBT according to this example, and FIG. 64 is a cross-sectional view taken along line D-D' of FIG. 63 showing this IGBT.

As compared with the IGBT 211 according to the first example described above, the IGBT 211b according to this example includes a connection layer 226b instead of the connection layer 226. In the connection layer 226b, the central region of the IGBT includes connection members 228a, 228b, 228c as in the first example, but the peripheral region of the IGBT does not include the connection members 228a, 228b, 228c, but includes a connection member 228d instead. The connection member 228d is a plate member covering nearly entirely the peripheral region of the IGBT. Thus the gate electrode 218 located in the periphery of the IGBT is short-circuited to the main electrode 232 serving as an emitter electrode through the contact line 223 and the connection member 228d, and is always placed at the same potential as the main electrode 232. The configuration of this example other than the foregoing is the same as that of the first example described above.

According to this example, in the peripheral region of the chip, electron injection into the silicon substrate 212 is prevented to decrease conductive carriers, and thereby the avalanche phenomenon can be effectively prevented. Furthermore, as compared with the IGBT 211 according to the first example described above, the IGBT 211b according to this example can be easily manufactured by changing the arrangement pattern of the connection members 228 in the connection layer 226b.

As described above, according to this embodiment, a plurality of control lines are prepared in advance, and thereby power semiconductor devices having various characteristics can be adaptably fabricated simply by design change in one connection layer. Thus it is possible to realize a power semiconductor device that can be readily adapted to variations in the operating condition, where reduction of ON voltage is compatible with reduction of switching loss and/or enhancement of breakdown withstand capability.

Next, a third embodiment of the invention is described.

Figure 65:
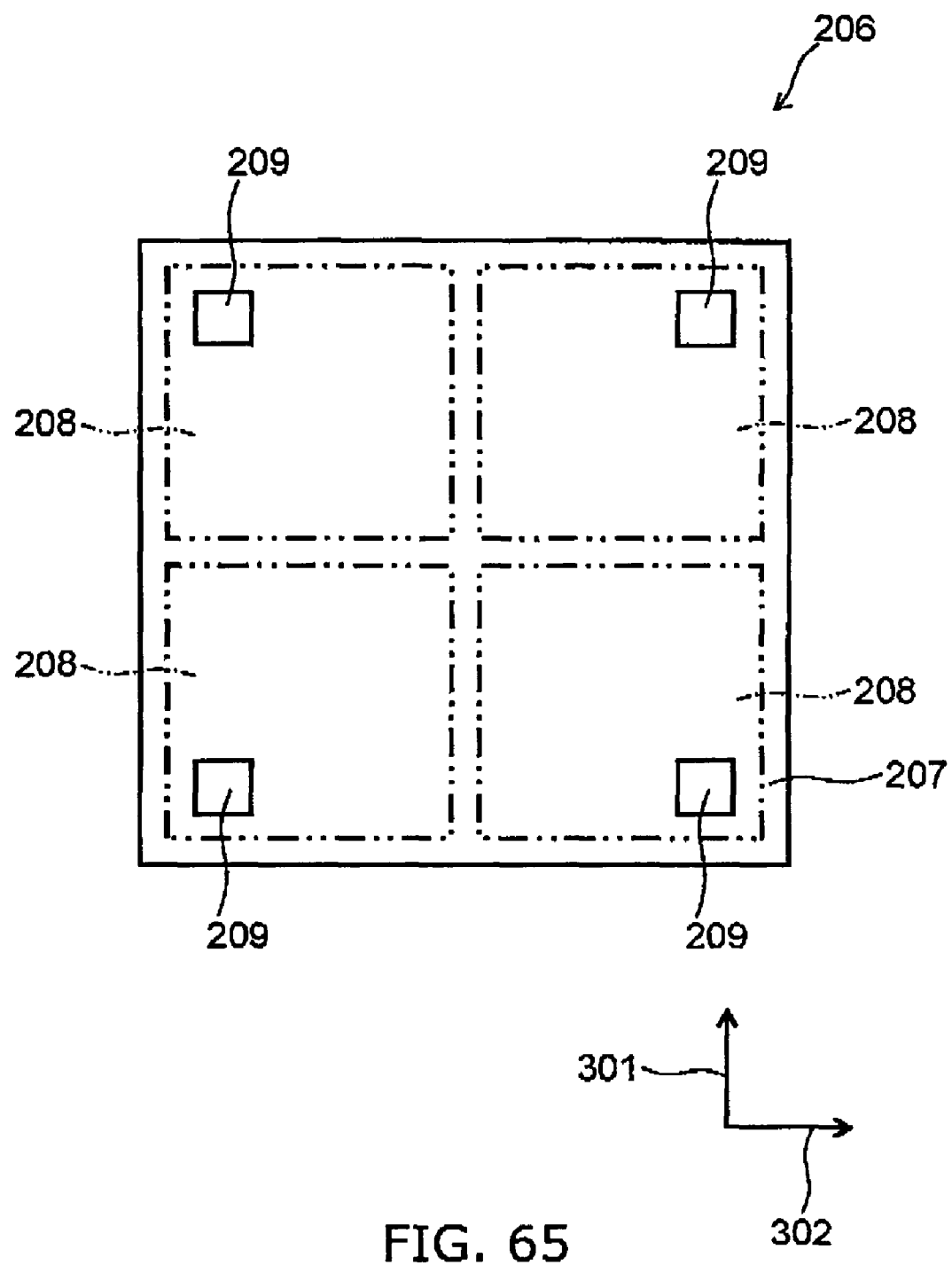
FIG. 65 is a schematic plan view illustrating a power semiconductor device according to a third embodiment of the invention.

FIG. 65 is a schematic plan view illustrating a power semiconductor device according to this embodiment.

The power semiconductor device 206 according to this embodiment includes a semiconductor substrate 207. A plurality of gate electrodes (not shown) are provided in the upper face of this semiconductor substrate 207, and extend in a direction 301 parallel to the upper face of the semiconductor substrate 207. A voltage is applied to the gate electrode, and thereby the gate electrode controls the current flowing in the semiconductor substrate 207. As in the first embodiment described above, in the directly overlying region of the gate electrode, a plurality of contact lines (not shown) extend in the direction 301, and a plurality of control lines (not shown) extend in the direction 302. The contact lines are connected to the control lines through a plurality of connection members (not shown). Thus a plurality of gate electrodes are divided into a plurality of groups by the control lines connected thereto.

In this embodiment, a plurality of regions 208 are defined in the upper face of the semiconductor substrate 207 by the grouping of gate electrodes. More specifically, each group of gate electrodes is located in a mutually different region 208 in the upper face of the semiconductor substrate 207. In other words, the upper face of the semiconductor substrate 207 is partitioned into a plurality of regions 208, and a plurality of gate electrodes located in each region 208 are all connected to the same control line, thereby belonging to the same group. Consequently, in the power semiconductor device 206, the regions 208 can be driven independently of each other. Furthermore, each region 208 is provided with a temperature detection unit 209.

In this embodiment, the temperature detection unit 209 provided in each region 208 detects the temperature of the region 208. In the region 208 exceeding a predetermined temperature, the gate electrodes provided in the region 208 are turned off to block the current flowing into the region 208. At this time, the current continues to be passed through the other regions 208. Thus, when the temperature locally increases in the power semiconductor device 206, only the region 208 with increased temperature is rendered nonconducting. Hence, without turning off the entire device, it is possible to prevent the device from being thermally destroyed. The configuration, operation, and effect of this embodiment other than the foregoing are the same as those of the second embodiment described above.

In the following, examples for realizing the power semiconductor device according to this embodiment are described.

First, a first example of this embodiment is described. In this example, an IGBT is described as an example of the power semiconductor device.

Figure 66:
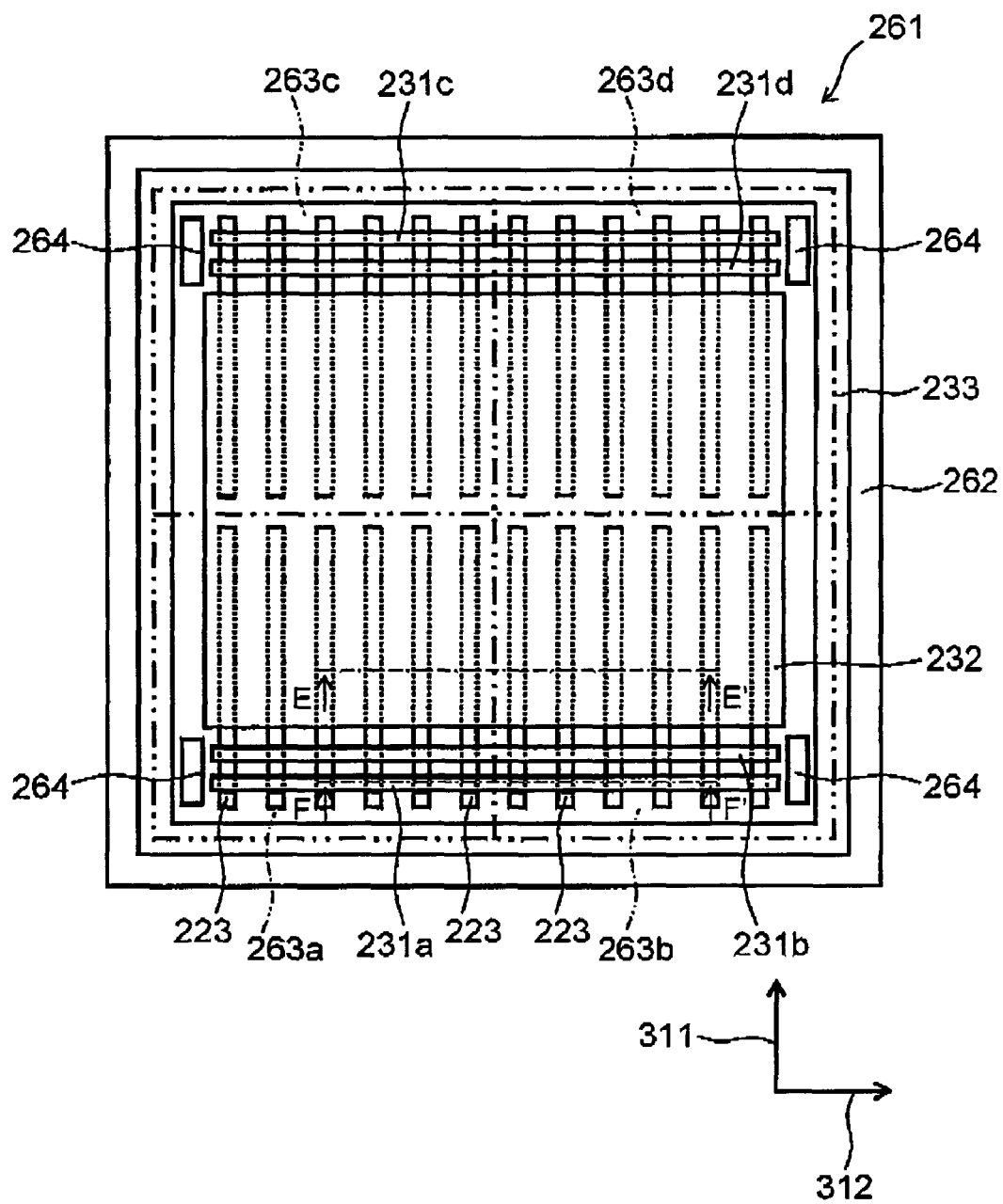
FIG. 66 is a plan view illustrating an IGBT according to a first example of the third embodiment.

FIG. 66 is a plan view illustrating an IGBT according to this example. In FIG. 66, for clarity, the control line and the contact line are shown thicker than in reality, and the number of lines is smaller than in reality.

Figure 67:
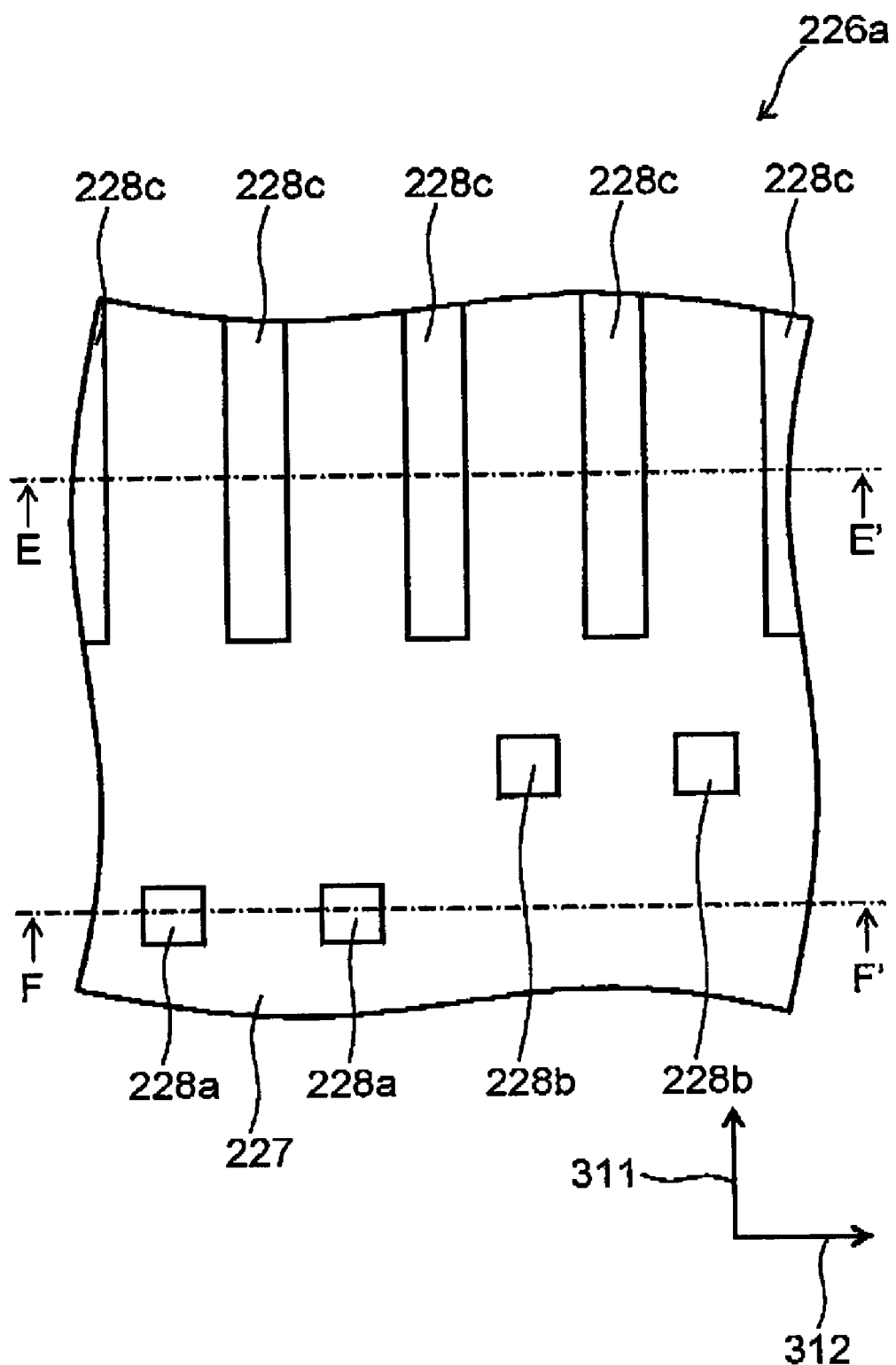
FIG. 67 is a partial plan view illustrating the connection layer including connection members in this IGBT.
Figure 68:
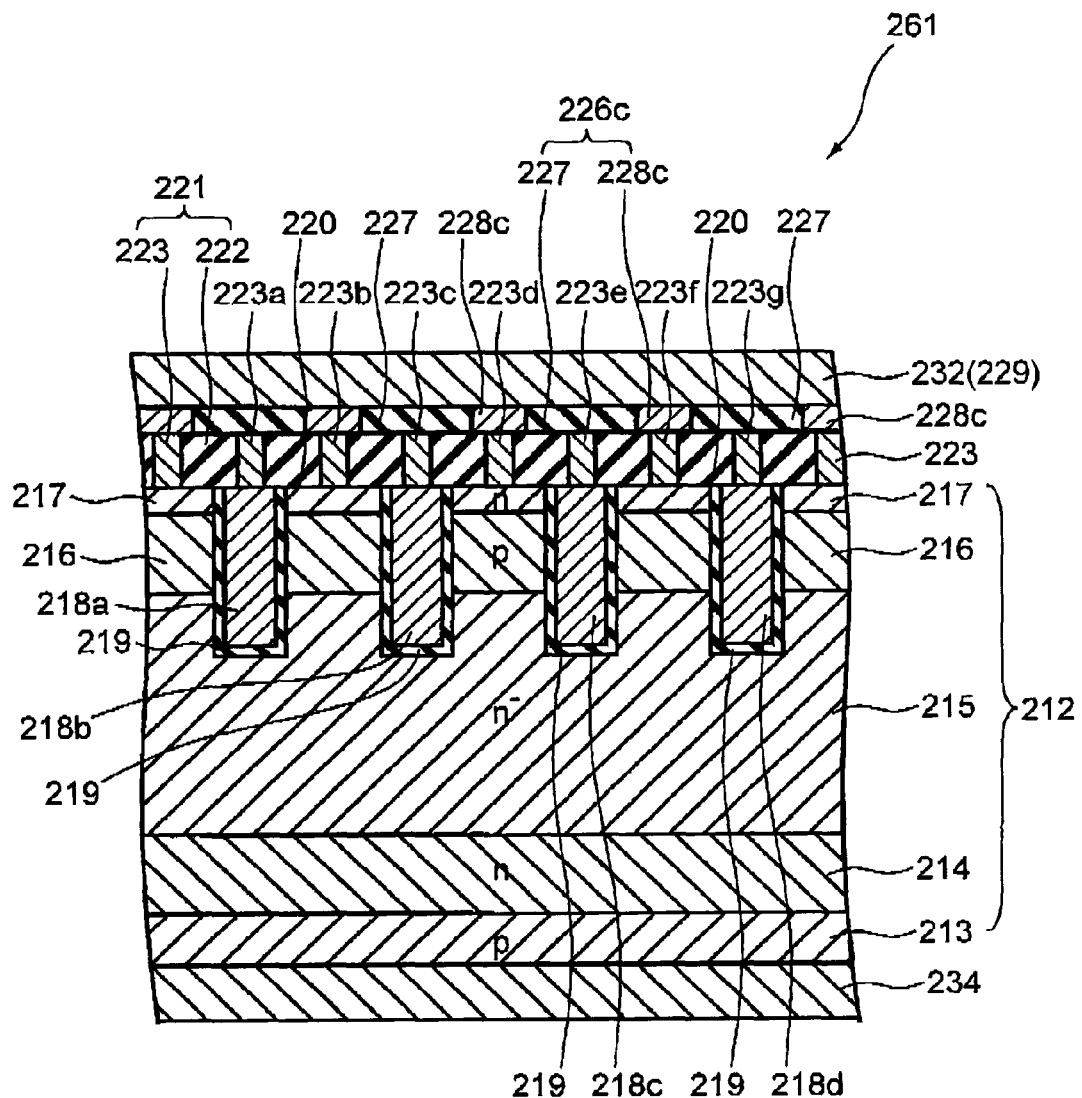
FIG. 68 is a partial cross-sectional view taken along line E-E' shown in FIGS. 66 and 67.
Figure 69:
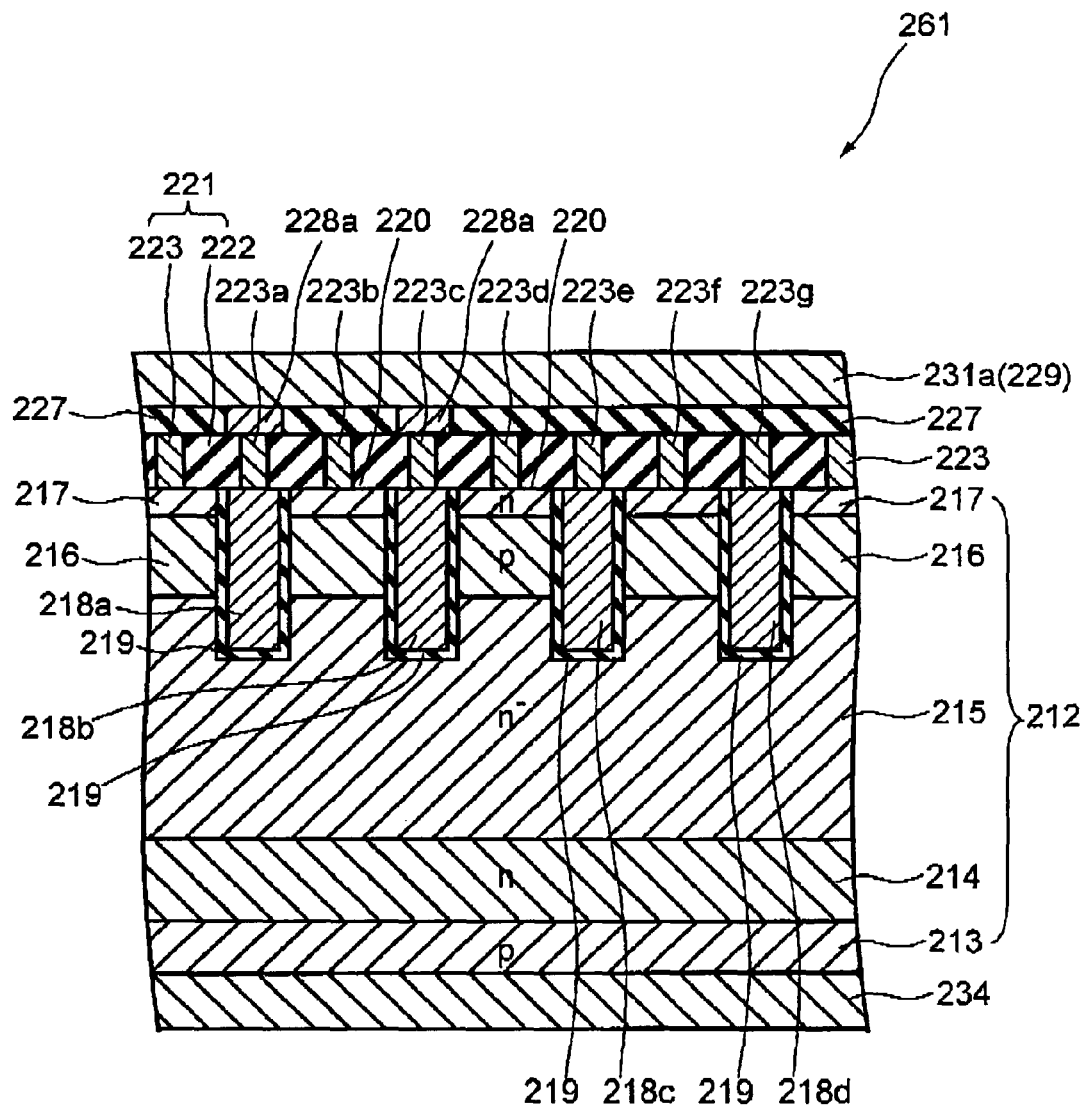
FIG. 69 is a partial cross-sectional view taken along line F-F' shown in FIGS. 66 and 67.

FIG. 67 is a partial plan view illustrating the connection layer including connection members in the IGBT according to this example, FIG. 68 is a partial cross-sectional view taken along line E-E' shown in FIGS. 66 and 67, and FIG. 69 is a partial cross-sectional view taken along line F-F' shown in FIGS. 66 and 67. In FIGS. 66 to 69, the same elements as those in the first example of the second embodiment described above (see FIGS. 49 to 54) are marked with the same reference numerals and not described in detail.

As shown in FIGS. 66 to 69, the IGBT 261 according to this example includes a silicon substrate 262. The upper face of the silicon substrate 262 is divided into four regions 263a to 263d (hereinafter also collectively referred to as "regions 263") in a 2×2 matrix configuration. Each region 263 includes one temperature detection unit 264. The temperature detection unit 264 measures the temperature of the silicon substrate 262, and is illustratively a temperature sensor such as a diode made of polysilicon.

Like the second embodiment, a plurality of gate electrodes 218 are buried in the silicon substrate 262. Each gate electrode 218 is spilt at the center in its longitudinal direction (direction 311). Thus the gate electrode 218 in the region 263a and the gate electrode 218 in the region 263c are electrically independent of each other, and the gate electrode 218 in the region 263b and the gate electrode 218 in the region 263d are electrically independent of each other. The configuration of the silicon substrate 262 other than the foregoing is the same as that of the silicon substrate 212 (see FIG. 49) in the first example of the second embodiment.

Furthermore, like the second embodiment, an interconnect layer 221 is provided on the silicon substrate 262, and the interconnect layer 221 includes a plurality of contact lines 223. However, the contact line 223 is also split at the center in its longitudinal direction.

Furthermore, a connection layer 226c is provided on the interconnect layer 221. In the connection layer 226c, a plurality of connection members 228a, 228b, 228c are buried in an insulating material 227. FIG. 67 shows only part of the connection layer 226c. The arrangement of the connection members 228 in the connection layer 226c is vertically symmetric in the figure. That is, the arrangement of the connection members 228 is plane symmetric with respect to the plane that contains the center of the connection layer 226c and is perpendicular to the surface of the connection layer 226c and parallel to the direction 312.

Furthermore, an interconnect layer 229 is provided on the connection layer 226c. In this interconnect layer 229, four control lines 231a to 231d and one main electrode 232 are provided in an insulating material 230. The control lines 231a, 231b, the main electrode 232, the control lines 231c, 231d are arranged in this order along the direction 311. That is, as viewed from above, the main electrode 232 is located at the center of the interconnect layer 229, the control lines 231a and 231b are located on one edge in the direction 311, and the control lines 231c and 231d are located on the other edge.

In the connection layer 226c, the connection member 228a is located in the region directly overlying the gate electrode 218 located in the region 263a and directly underlying the control line 231a. Thus the gate electrode 218 located in the region 263a is connected to the control line 231a through the contact line 223 and the connection member 228a.

Furthermore, the connection member 228b is located in the region directly overlying the gate electrode 218 located in the region 263b and directly underlying the control line 231b. Thus the gate electrode 218 located in the region 263b is connected to the control line 231b through the contact line 223 and the connection member 228b.

Likewise, a connection member (not shown) is located in the region directly overlying the gate electrode 218 located in the region 263c and directly underlying the control line 231c. Thus the gate electrode 218 located in the region 263c is connected to the control line 231c through the contact line 223 and the connection member.

Furthermore, a connection member (not shown) is located also in the region directly overlying the gate electrode 218 located in the region 263d and directly underlying the control line 231d. Thus the gate electrode 218 located in the region 263d is connected to the control line 231d through the contact line 223 and the connection member.

Furthermore, the connection member 228c is located in the region directly overlying the region 220 between the gate electrodes 218 and directly underlying the main electrode 232. Thus the silicon substrate 262 is connected to the main electrode 232 through the contact line 223 and the connection member 228c.

Thus the upper face of the silicon substrate 262 is partitioned into a plurality of regions 263. A plurality of gate electrodes 218 located in each region 263 belong to the same group by all being connected to the same control line 231a or 231b or main electrode 232.

Next, the operation of the IGBT according to this example is described.

Typically, when the IGBT 261 is rendered conducting, the gate driving signals applied to the control lines 231a to 231d are all set to the high level. Thus all the regions 263a to 263d are turned into the conducting state.

At this time, the temperature detection unit 264 provided in each region 263 detects the temperature of the silicon substrate 262. Then, for example, when the temperature detection unit 264 located in the region 263a detects a temperature exceeding the upper limit of an allowable range, e.g. 150° C., the gate driving signal applied to the control line 231a is switched to the low level to turn the region 263a into the nonconducting state. Thus the region 263a begins to cool down. At this time, the other regions 263b to 263d remain in the normal conducting state, and the IGBT 261 as a whole continues conducting. When the region 263a is sufficiently cooled down, the gate driving signal applied to the control line 231a is switched to the high level to turn the region 263a back into the conducting state.

Next, the effect of this example is described.

Recently, with increasing power density in power semiconductor devices, the rated current associated with one chip is increased. In this context, in order to reduce the device temperature within an allowable temperature range (e.g. 150° C. or less), a temperature detection element is provided on a semiconductor chip to turn off the device when the upper limit of the allowable temperature range is exceeded. However, in this case, when the chip temperature exceeds the upper limit, the chip is turned off. Hence the system equipped with this chip is rapidly powered down, which causes trouble.

Furthermore, when overheating is attributed to an excessive current due to load short circuit, the power semiconductor device may suffer from turn-off breakdown unless the gate voltage is reduced to prevent the short-circuit current before the device is turned off, or unless the large current is slowly turned off by switching to a large gate resistance. However, when the device is slowly turned off in this manner, the overheat condition continues a long time and may destroy the device.

In contrast, according to this example, when the IGBT is locally overheated, only the overheated region can be rendered nonconducting to protect the device from breakdown due to overheating without turning off the entire device. When only part of the device is turned off, instantaneous turn-off does not cause turn-off breakdown, and the short-circuit current in the entire device can also be reduced. Thus the rapid power-down of the system can be effectively prevented.

Next, a second example of this embodiment is described.

Figure 70:
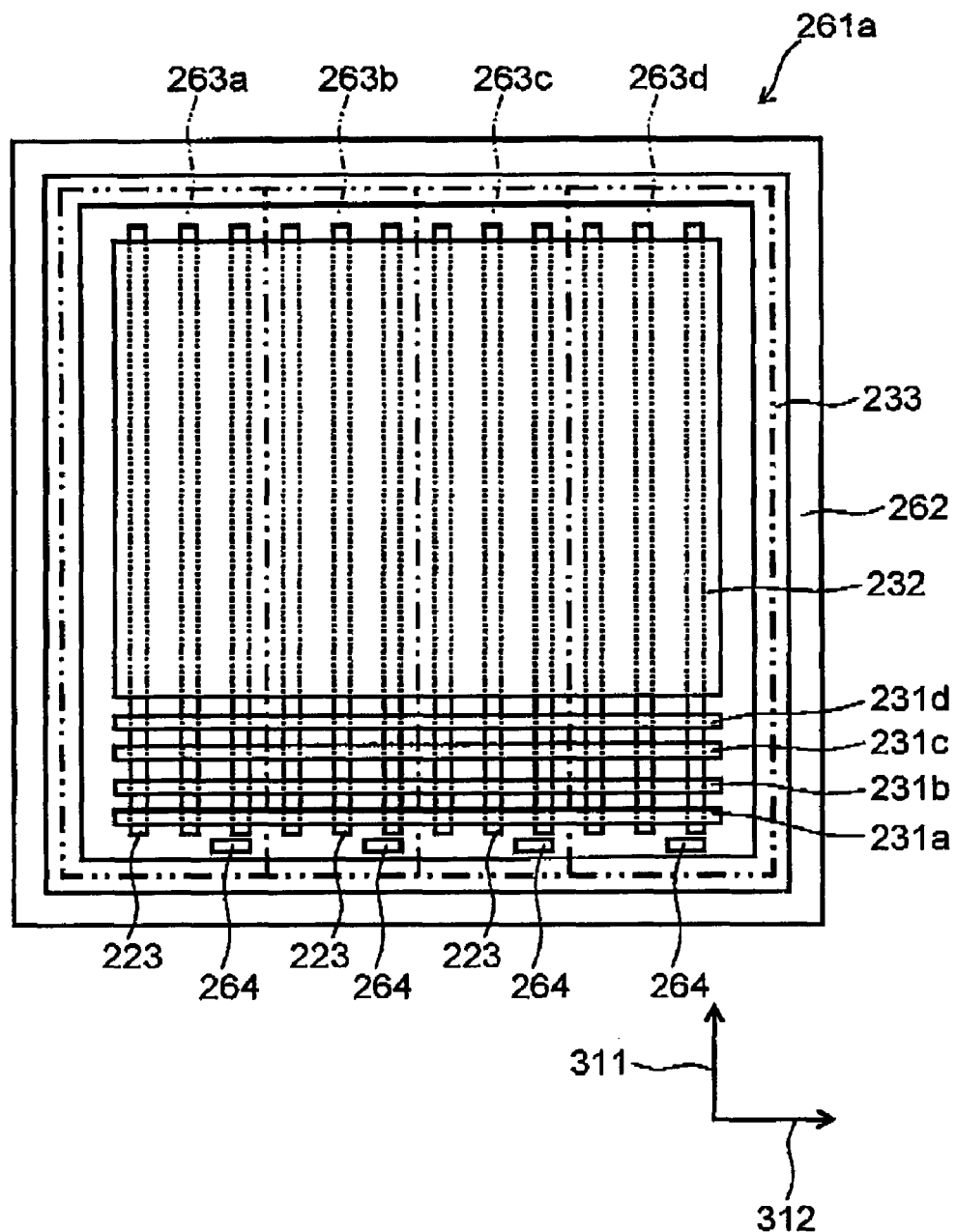
FIG. 70 is a plan view illustrating an IGBT according to a second example of the third embodiment.

FIG. 70 is a plan view illustrating an IGBT according to this example.

In the IGBT 261a according to this example, the gate electrodes and the contact lines 223 are not split at the center in their longitudinal direction, but extend in the direction 311 throughout the active region of the IGBT 261a. The control lines 231a to 231d are collected on one edge of the IGBT 261a, and the regions 263a to 263d are arranged in a line along the direction 312. Thus, when the IGBT 261a is shaped like a square as viewed from above, each region 263 is shaped like a strip extending in the direction 311. The temperature detection unit 264 provided in each region 263 is located on one edge of the IGBT 261a. The configuration of this example other than the foregoing is the same as that of the first example of the third embodiment described above.

According to this example, the temperature detection units 264 are located on the same edge of the chip, and hence easy to implement. Furthermore, the control lines 231a to 231d are also located on the same edge of the chip, and hence easy to implement. The operation and effect of this example other than the foregoing is the same as those of the first example described above.

Next, a third example of this embodiment is described.

Figure 71:
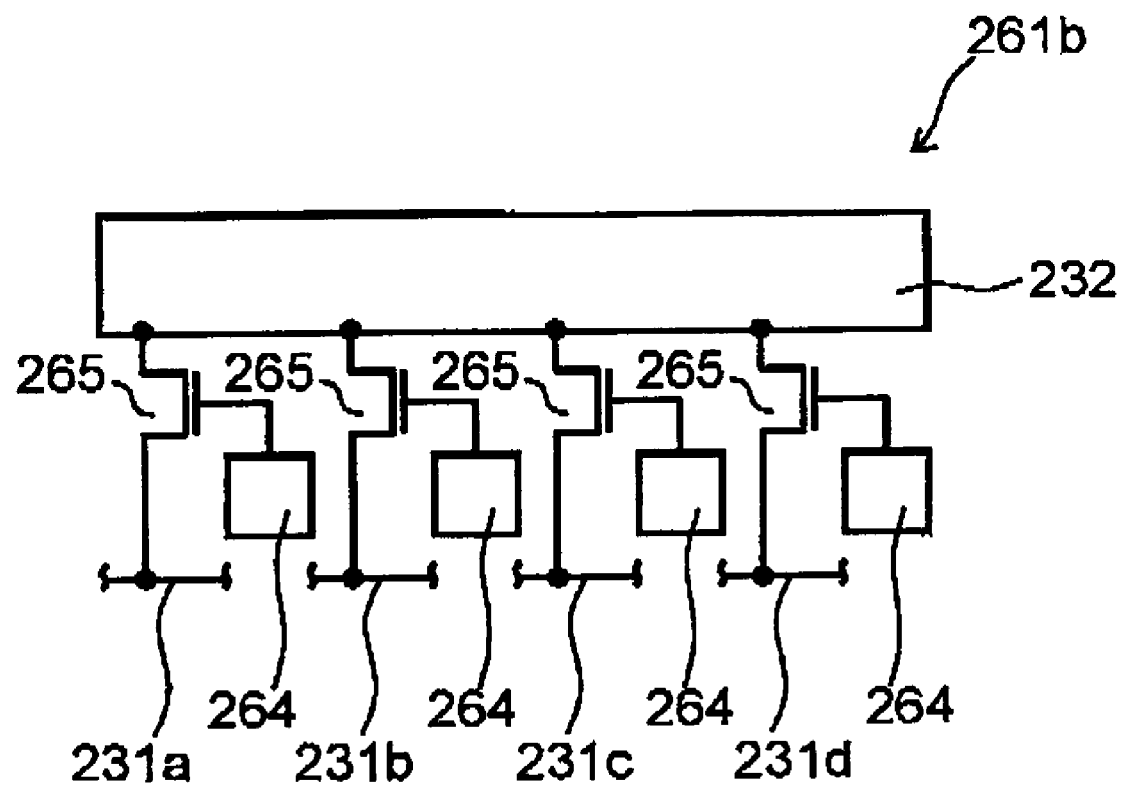
FIG. 71 is a schematic circuit diagram illustrating the vicinity of the temperature detection unit of an IGBT according to a third example of the third embodiment.

FIG. 71 is a schematic circuit diagram illustrating the vicinity of the temperature detection unit of an IGBT according to this example.

In the IGBT 261b according to this example, a switch 265 is connected between the main electrode 232 serving as an emitter and each control line 231a to 231d. A signal for switching this switch is inputted from the temperature detection unit 264 of each region 263. The switch 265 is illustratively a MOSFET (Metal Oxide Semiconductor Field Effect Transistor) provided on the surface of the silicon substrate 262, and the output terminal of the temperature detection unit 264 is connected to the gate of this MOSFET. The configuration of this example other than the foregoing is the same as that of the second example described above.

In this example, the switch 265 is rendered nonconducting during normal operation, and a gate driving signal is applied to each control line 231a to 231d. Then, when the temperature detection unit 264 located in the region 263a, for example, detects a temperature exceeding the upper limit, this temperature detection unit 264 switches the switch 265 to the conducting state. Thus the control line 231a is connected to the main electrode 232 through the switch 265, and subjected to nearly the same potential as the main electrode 232. Consequently, the region 263a is turned off and rendered nonconducting.

In the first and second example described above, when the temperature detection unit 264 detects a temperature exceeding the upper limit, the information is transmitted to a controller (not shown) external to the IGBT, and this controller applies a fixed potential to the control line connected to the gate electrode in the region including this temperature detection unit 264. In contrast, in this example, the above operation is completed inside the chip including the IGBT, which allows faster response. The operation and effect of this example other than the foregoing is the same as those of the second example described above.

Next, a fourth example of this embodiment is described.

Figure 72:
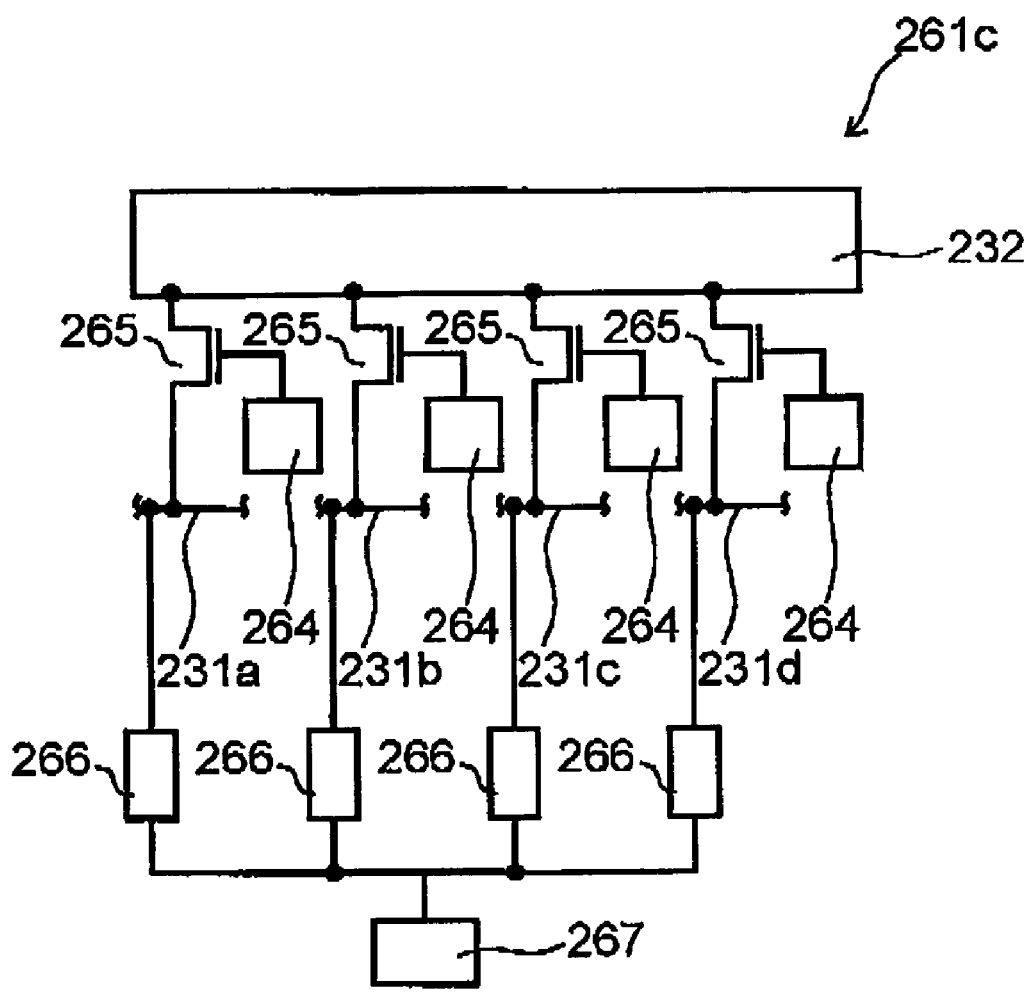
FIG. 72 is a schematic circuit diagram illustrating the vicinity of the temperature detection unit of an IGBT according to a fourth example of the third embodiment.

FIG. 72 is a schematic circuit diagram illustrating the vicinity of the temperature detection unit of an IGBT according to this example.

As compared with the IGBT 261b according to the third example described above, in the IGBT 261c according to this example, each control line 231a to 231d is connected to a control circuit 267 external to the IGBT 261c through a gate resistance 266. The gate resistance 266 is illustratively a resistive element made of polysilicon formed on the silicon substrate 262. The configuration of this example other than the foregoing is the same as that of the third example described above.

According to this example, a common gate driving signal is inputted to the control lines 231a to 231d. Even if one of the regions 263 is overheated and the control line for controlling the region 263 is short-circuited to the main electrode 232, the potential of the other control lines is scarcely varied because the gate resistance 266 is interposed between that control line and the other control lines. Thus the other non-overheated regions 263 can remain in the ON state. Thus, according to this example, a common gate driving signal can be applied to the control lines 231a to 231d to simplify the control circuit 267. Here, it is preferable that the number of partitions (groups) of the gate electrodes be large. The operation and effect of this example other than the foregoing is the same as those of the third example described above.

Next, a fifth example of this embodiment is described.

Figure 73:
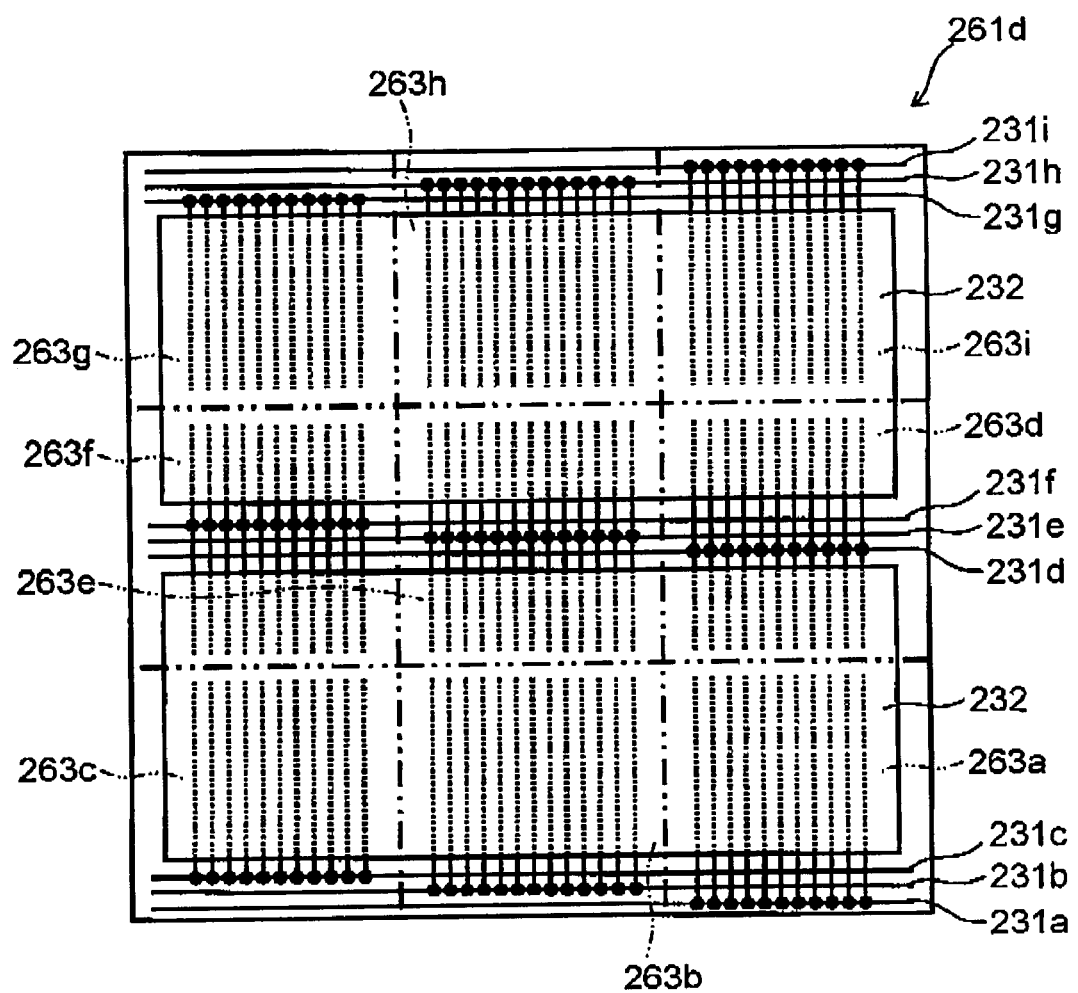
FIG. 73 is a plan view illustrating an IGBT according to a fifth example of the third embodiment.

FIG. 73 is a plan view illustrating an IGBT according to this example.

The IGBT 261d according to this example is divided into nine regions 263a to 263i arranged in a 3×3 matrix configuration. More specifically, the IGBT 261d includes nine control lines 231a to 231i. For example, for each of both edges and the center of the IGBT 261d, three control lines are located. The gate electrodes 218 located in the regions 263a to 263i are connected to the control lines 231a to 231i, respectively. Each region 263 includes a temperature detection unit (not shown).

Typically, in a power semiconductor device, the central region of the chip has less heat dissipation than the peripheral region, and more susceptible to temperature increase. Thus temperature control in the central region of the chip is particularly important. According to this example, the IGBT is partitioned into nine regions arranged in a 3×3 matrix configuration. Hence the central region (region 263e) can be controlled independently. Thus the temperature can be efficiently controlled. The configuration, operation, and effect of this example other than the foregoing are the same as those of the first example described above.

Next, a sixth example of this embodiment is described.

Figure 74:
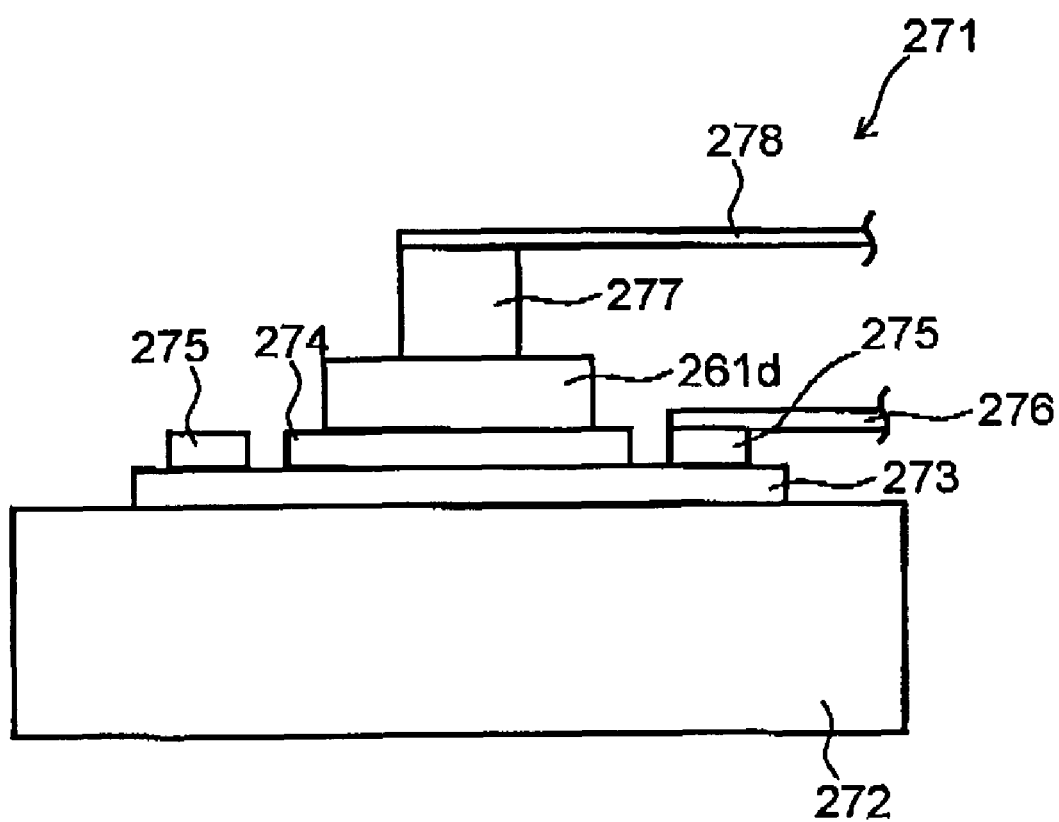
FIG. 74 is a side view illustrating a power converter equipped with an IGBT according to a sixth example of the third embodiment.

FIG. 74 is a side view illustrating a power converter equipped with an IGBT according to this example.

The IGBT 261d according to this example is packaged in a power converter 271 having a strap structure. More specifically, the power converter 271 includes a heat sink 272, and a ceramic substrate 273 is provided on the heat sink 272. An electrode 274 and a terminal 275 connected to this electrode 274 are provided on the upper face of the ceramic substrate 273. The IGBT 261d is mounted on the electrode 274. An interconnect 276 is connected to the terminal 275. Furthermore, a conductive block 277 made of copper (Cu) or other material having good electrical conductivity and heat transferability is connected to the upper portion of the central region of the IGBT 261d, and an interconnect 278 is connected to the conductive block 277. Thus a current flows between the interconnect 276 and the interconnect 278 through the terminal 275, the electrode 274, the IGBT 261d, and the conductive block 277. The configuration of the IGBT 261d according to this example is the same as the configuration of the IGBT 261d according to the fifth example.

In this example, the central region of the IGBT 261d has good heat dissipation because it is in contact with the conductive block 277. Thus the temperature is more likely to increase in the peripheral region of the IGBT 261d than in the central region. According to this example, the IGBT is partitioned into nine regions arranged in a 3×3 matrix configuration. Hence the temperature of the peripheral region can be controlled independently of the central region.

As described above, according to this embodiment, the power semiconductor device is divided into a plurality of regions. Each region includes a temperature detection unit, and can be controlled independently. Thus, when the device is locally overheated, the current flow is blocked only in the overheated region. Thus thermal breakdown can be prevented with maintaining current flow in the device as a whole. Furthermore, a plurality of control lines and a plurality of temperature detection units are prepared in advance, and thereby the power semiconductor device can be partitioned into regions with various patterns simply by design change in one connection layer. Consequently, the device can be adapted to various temperature distributions depending on device characteristics and packaging conditions such as nonuniform solder connection.

The embodiments of the invention have been described with reference to the examples. However, the invention is not limited to these embodiments and the examples thereof.

For example, one contact line (or gate electrode) may be connected to a plurality of control lines. Specifically, as viewed from above the silicon substrate, a plurality of control lines are formed on each of both sides of a region. The contact line (or gate electrode) extending from the region is connected to one of the plurality of control lines provided on one side of the region, and also connected to one of the plurality of control lines provided on the other side of the region. Thus a particular contact line (or gate electrode) can be energized by the control lines on both sides of the region, which is advantageous for reducing interconnect resistance.

In the above embodiments and the examples thereof, the power semiconductor device is illustratively an IGBT. However, the invention is not limited thereto. For example, the power semiconductor device may be a MOSFET or lateral device. Furthermore, the above embodiments and the examples thereof can be combined with each other as long as technically feasible. Such combinations are also encompassed within the scope of the invention. More specifically, for example, while the driving modes can be changed depending on the driving frequency as in the second embodiment, temperature can be controlled for each region as in the third embodiment.

Furthermore, in the above embodiments and the examples thereof, by way of example, each plug is made of tungsten, and each pad (including the field plate) is made of aluminum. However, the invention is not limited thereto. The plug and the pad can be made of any materials having higher electrical conductivity than the material forming the gate electrode. For example, the plug and the pad can be made of any metal or alloy.

The invention claimed is:

1. A power semiconductor device comprising:
   a composite semiconductor layer having a trench extending along a first direction in a stripe configuration;
   a gate electrode buried in the trench for controlling a current flowing in the composite semiconductor layer;
   a gate plug made of a material having higher electrical conductivity than the gate electrode, the gate plug having the stripe configuration and being connected to the gate electrode along the first direction,
   the composite semiconductor layer including:
   a first semiconductor layer of a first conductivity type;
   a second semiconductor layer of a second conductivity type provided partially in an upper face of the first semiconductor layer;
   a third semiconductor layer of the first conductivity type provided partially on the second semiconductor layer; and
   a fourth semiconductor layer of the second conductivity type provided on a lower face of the first semiconductor layer;
   a gate insulating film for insulating the composite semiconductor layer from the gate electrode;
   an emitter plug connected to the composite semiconductor layer;
   an interlayer insulating film provided on the composite semiconductor layer, the interlayer insulating film including at least part of the gate plug and at least part of the emitter plug buried therein;
   a gate pad provided on the interlayer insulating film and connected to the gate plug; and
   an emitter pad provided coplanar with the gate pad and connected to the emitter plug, the tip of the emitter plug being buried in the composite semiconductor layer so as to reach the second semiconductor layer.

2. The power semiconductor device according to claim 1, wherein a nitride film is formed between the composite semiconductor layer and the interlayer insulating film.

3. The power semiconductor device according to claim 1, wherein the gate plug and the emitter plug each include:
   a core member, and
   a reaction layer formed between the core member and the gate electrode or the composite semiconductor layer, the reaction layer containing a material forming the gate electrode or the composite semiconductor layer.

4. The power semiconductor device according to claim 3, wherein, as viewed in the first direction, a side face of the emitter plug has a region in contact with the third semiconductor layer, the region having a length of 0.5 times or more a width of the emitter plug, and the reaction layer has a thickness of more than 2.5 nanometers and not more than 0.25 times the width of the emitter plug.

5. The power semiconductor device according to claim 1, wherein the power semiconductor device has a plurality of the gate electrodes; and the composite semiconductor layer has a plurality of trenches, each of the plurality of the trenches is filled therein with one of the plurality of the gate electrodes, and a width of the gate electrode as viewed in a direction perpendicular to the first direction is wider than a width of a region between adjacent ones of the gate electrodes, and a plurality of the gate plugs are provided on each of the gate electrodes.

6. A method for manufacturing a power semiconductor device comprising:

forming a composite semiconductor layer which includes a first semiconductor layer of a first conductivity type, a second semiconductor layer, a third semiconductor layer, and a fourth semiconductor layer, including:

forming the second semiconductor layer of a second conductivity type partially in an upper portion of the first semiconductor layer of the first conductivity type, forming the third semiconductor layer of the first conductivity type partially on the second semiconductor layer, and forming the fourth semiconductor layer of the second conductivity type in a lower portion of the first semiconductor layer;

forming a first trench groove in an upper face of the composite semiconductor layer, the first trench groove extending along a first direction in a stripe configuration;

forming a gate electrode buried in the first trench groove, the gate electrode being operative for controlling a current flowing in the composite semiconductor layer;

forming a gate plug made of a material having higher electrical conductivity than the gate electrode, the gate plug having the stripe configuration and being connected to the gate electrode along the first direction;

forming a gate insulating film for insulating the composite semiconductor layer from the gate electrode;

forming an emitter plug connected to the composite semiconductor layer;

forming an interlayer insulating film on the composite semiconductor layer, the interlayer insulating film including at least part of the first trench groove and at least part of the emitter plug buried therein;

forming a gate pad provided on the interlayer insulating film and connected to the gate plug;

forming an emitter pad provided coplanar with the gate pad and connected to the emitter plug, the tip of the emitter plug being buried in the composite semiconductor layer so as to reach the second semiconductor layer;

forming a second trench groove in an upper face of the gate electrode, the second trench groove extending along the first direction in the stripe configuration, and forming a third trench groove in a region of the upper face of the composite semiconductor layer between the gate electrodes, the third trench groove extending along the first direction in the stripe configuration;

forming a reaction layer by depositing a conductive material on an inner face of the second and third trench groove by CVD technique, the conductive material being reactive with a material forming the composite semiconductor layer and a material forming the gate electrode, and by allowing the conductive material to react with the material forming the composite semiconductor layer and the material forming the gate electrode; and depositing a material having higher electrical conductivity than the gate electrode on the reaction layer by the CVD technique.

7. The method for manufacturing a power semiconductor device according to claim 6, wherein in the step of forming a second and third trench groove, as viewed in the first direction, a side face of the third trench groove has a region in contact with the third semiconductor layer, the region having a length of 0.5 times or more a width of the third trench groove, and in the step of forming a reaction layer, the deposited amount of the conductive material is more than 1 nanometer and not more than 0.1 times the width of the third trench groove.

8. The method for manufacturing a power semiconductor device according to claim 6, further comprising, between the step of forming a gate electrode and the step of forming a second and third trench groove:

forming a first insulating layer; and forming a second insulating layer on the first insulating layer, wherein the step of forming a second and third trench groove includes performing etching under a condition that an etching rate of the first insulating layer is faster than an etching rate of the second insulating layer.

* * * * *